(12) United States Patent
Sugawa

(10) Patent No.: US 7,518,143 B2
(45) Date of Patent: Apr. 14, 2009

(54) SOLID-STATE IMAGING DEVICE, LINE SENSOR AND OPTICAL SENSOR AND METHOD OF OPERATING SOLID-STATE IMAGING DEVICE

(75) Inventor: Shigetoshi Sugawa, Miyagi (JP)

(73) Assignee: National University Corporation Tohoku University, Sendai-Shi (JP)

( * ) Notice: Subject to any disclaimer, the term of this patent is extended or adjusted under 35 U.S.C. 154(b) by 0 days.

(21) Appl. No.: 10/590,659

(22) PCT Filed: Feb. 25, 2005

(86) PCT No.: PCT/JP2005/003193

§ 371 (c)(1),
(2), (4) Date: Nov. 8, 2006

(87) PCT Pub. No.: WO2005/083790

PCT Pub. Date: Sep. 9, 2005

(65) Prior Publication Data

US 2007/0131991 A1  Jun. 14, 2007

(30) Foreign Application Priority Data

Feb. 27, 2004 (JP) .............................. 2004-053889
Nov. 5, 2004 (JP) .............................. 2004-322767

(51) Int. Cl.
*H01L 31/113* (2006.01)
(52) U.S. Cl. .................... 257/59; 257/233; 257/431; 257/466; 257/292

(58) Field of Classification Search ................... 257/59, 257/292, 233, 431, 466
See application file for complete search history.

(56) References Cited

U.S. PATENT DOCUMENTS 6,486,504 B1  11/2002  Guidash (Continued)

FOREIGN PATENT DOCUMENTS

JP  05-090556 A  4/1993

(Continued)

OTHER PUBLICATIONS

Inoue et al., "A 3.25M-Pixel APS-C Size CMOS Image Sensor," IEEE, 2001 IEEE Workshop on Charge-Coupled Devices and Advanced Image Sensors, Jun. 7-9, 2001, pp. 16-19.

(Continued)

*Primary Examiner*—Wai-Sing Louie
*Assistant Examiner*—Marc Armand
(74) *Attorney, Agent, or Firm*—Foley & Lardner LLP

(57) ABSTRACT

A solid-state imaging device, a line sensor and an optical sensor for enhancing a wide dynamic range while keeping high sensitivity with a high S/N ratio, and a method of operating a solid-state imaging device for enhancing a wide dynamic range while keeping high sensitivity with a high S/N ratio are provided. The solid-state imaging device comprises an integrated array of a plurality of pixels, each of which comprises a photodiode PD for receiving light and generating photoelectric charges, a transfer transistor Tr1 for transferring the photoelectric charges, and a storage capacitor element C connected to the photodiode PD at least through the transfer transistor Tr1 for accumulating, at least through the transfer transistor Tr1, the photoelectric charge overflowing from the photodiode PD during accumulating operation.

6 Claims, 37 Drawing Sheets

U.S. PATENT DOCUMENTS

| | | |
|---|---|---|
| 6,680,498 B2 | 1/2004 | Guidash |
| 6,690,423 B1 | 2/2004 | Nakamura et al. |
| 7,042,061 B2 | 5/2006 | Nakamura et al. |
| 2002/0000508 A1 | 1/2002 | Muramatsu et al. |
| 2002/0021121 A1* | 2/2002 | Nakamura .................. 324/96 |
| 2002/0036700 A1* | 3/2002 | Merrill ...................... 348/308 |
| 2003/0112353 A1* | 6/2003 | Morris ....................... 348/310 |
| 2003/0206235 A1* | 11/2003 | Suzuki ...................... 348/304 |
| 2004/0251394 A1* | 12/2004 | Rhodes et al. ........... 250/208.1 |
| 2006/0163684 A1 | 7/2006 | Nakamura et al. |

FOREIGN PATENT DOCUMENTS

| | | |
|---|---|---|
| JP | 11-284166 A | 10/1999 |
| JP | 2000-165754 A | 6/2000 |
| JP | 2001-169184 A | 6/2001 |
| JP | 2002-077737 A | 3/2002 |
| JP | 2003-101006 A | 4/2003 |
| JP | 2003-134396 A | 5/2003 |
| JP | 2003-188367 A | 7/2003 |

OTHER PUBLICATIONS

Kakumoto et al., "Logarithmic Conversion CMOS Image Sensor with FPN Cancellation and Integration Circuits," The Journal of The Institute of Image Information and Television Engineers, vol. 57, No. 8, 2003, pp. 1013-1018.

Muramatsu et al., "A Signal-Processing CMOS Image Sensor Using A Simple Analog Operation," IEEE Journal of Solid-State Circuits, vol. 38, No. 1, Jan. 2003, pp. 101-106.

* cited by examiner

SOLID-STATE IMAGING DEVICE, LINE SENSOR AND OPTICAL SENSOR AND METHOD OF OPERATING SOLID-STATE IMAGING DEVICE

TECHNICAL FIELD

The present invention relates to solid-state imaging devices, line sensors and optical sensors and methods of operating the solid-state imaging devices and, more particularly, to a solid-state imaging device, a line sensor and an optical sensor of a CMOS type or a CCD type and a method of operating the solid-state imaging device.

BACKGROUND ART

Image-input image sensors such as CMOS (Complementary Metal-Oxide-Semiconductor) image sensors or CCD (Charge Coupled Device) image sensors have achieved improvements in characteristics with an expanding, demand for applications in, for instance, digital cameras and cellular phones each with a camera.

The image sensors, described above, need to be further improved in characteristics, one of which relates to widening a dynamic range.

The image sensor has heretofore been used in the related art and has a dynamic range in the order of, for instance, approximately 3 to 4 digits (60 to 80 dB) under an actual status wherein the dynamic range does not cover a value of 5 to 6 digits (100 to 120 dB) of the naked eye or a silver-halide film.

Therefore, work has heretofore been expected on research and development of a high-quality image sensor with a dynamic range in the order of 5 to 6 digits (100 to 120 dB) in level equivalent to those of the naked eye or the silver-halide film. The image sensor with such a wide dynamic range has been expected to have applications, in addition to a digital camera or a cellular phone equipped with the digital camera or the like, an image-input camera for a PDA (Personal Digital Assistant), a camera for an advanced traffic management system, a monitoring camera, a camera for an FA (Factory Automation) or a camera for medical use.

As technology of improving characteristics of the image sensor set forth above, for instance, Non-Patent Document 1 discloses that a so-called on-chip noise canceling technology has been developed. In this technology, in order to enhance high sensitivity and a high S/N ratio, the operations are executed to read out noise occurring in a photodiode of each pixel and a signal resulting from relevant noise added with a light signal to take a difference between those components and noise components are removed to allow only a light signal to be extracted.

However, even with such a method, the dynamic range lies at a value less than 80 dB and, therefore, a further widened dynamic range has heretofore been expected.

For example, Patent Document 1 discloses technology in which as shown in FIG. 34, a floating region having a small capacitance $C_1$ for high sensitivity in low illuminance and a floating region having a large capacitance $C_2$ for low sensitivity in high illuminance are connected to a photodiode PD to output an output "out 1" for low illuminance and output "out 2" for high illuminance.

Further, Patent Document 2 discloses technology in which as shown in FIG. 35, a capacitance $C_S$ of a floating region FD is arranged to be variable in a range to cover sensitivities for low illuminance and high illuminance for thereby providing a wide dynamic range.

In addition, double-shooting technology has been developed for the shootings in different exposure times for picking up an image in high illuminance with a short exposure time and picking up an image in low illuminance with a long exposure time.

Moreover, Patent Document 3 and Non-Patent Document 2 disclose technologies of widening dynamic range by connecting a transistor switch T between a photodiode PD and a capacitor C, as shown in FIG. 36, and turning on the switch T for a first exposure time allows photoelectric charges to be accumulated in both the photodiode PD and the capacitor C while turning off the switch T for a second exposure time allows, in addition to preceding accumulation of the electric charges, photoelectric charges to be accumulated. Here, clear demonstration has been made that if light is incident at a rate higher than that causing saturation, an excess of electric charges is discharged via a reset transistor.

Further, Patent Document 4 discloses that as shown in FIG. 37, a photodiode PD adopts a capacitor C having a larger capacitance than that of the related art capacitance to comply with the shooting in high illuminance.

Furthermore, Non-Patent Document 3 discloses technology in which as shown in FIG. 38, a logarithmic conversion circuit includes MOS transistors in combination for generating an output upon executing logarithmic conversion of a signal delivered from a photodiode PD to comply with the shooting in high illuminance.

However, according to the methods disclosed in the Patent Documents 1, 2, 3 and the Non-Patent Document 2, mentioned above, or the method of performing the double shooting for different exposure times, the shootings for low illuminance and high illuminance need to be performed at different times. Therefore, a difference exists in moving images resulting from the shootings performed in respective illuminance and an issue occurs with a difficulty caused in matching both of the images.

Further, with the methods disclosed in Patent-Document 4 and Non-Patent Document 3 mentioned above, even though a scheme of complying with the shooting in high illuminance can achieve a wide dynamic range, the shooting in low illuminance results in a consequence of low sensitivity with a degraded S/N ratio and the image cannot have improved quality.

As mentioned above, the image sensors such as the CMOS sensors or the like is difficult to achieve a wide dynamic range while keeping high sensitivity with a high S/N ratio.

Moreover, the above is not limited to the image sensor. In the line sensor, including linearly arranged pixels and the optical sensor with no plural pixels, it is difficult achieve a wide dynamic range while keeping high sensitivity with a high S/N ratio.

Patent Document 1: Japanese Unexamined Patent Application Publication (JP-A) No. 2003-134396

Patent Document 2: Japanese Unexamined Patent Application Publication (JP-A) No. 2000-165754

Patent Document 3: Japanese Unexamined Patent Application Publication (JP-A) No. 2002-77737

Patent Document 4: Japanese Unexamined Patent Application Publication (JP-A) No. H5-90556

Non-Patent Document 1: S. Inoue et al., IEEE. Workshop on CCDs and Advanced Image Sensors 2001, page 16-19

Non-Patent Document 2: Yoshinori Muramatsu et al., IEEE Journal of Solid-state Circuits, vol. No. 1, January 2003

Non-Patent Document 3: Journal of Image Information Media, 57 (2003)

DISCLOSURE OF INVENTION

Problems to be Solved by Invention

The present invention has been completed in view of the above statuses and has an object to provide a solid-state imaging device, a line sensor and a optical sensor, which can enhance a wide dynamic range while keeping high sensitivity with a high S/N ratio, and a method of operating a solid-state imaging device that can enhance a wide dynamic range while keeping high sensitivity with a high S/N ratio.

Means for Solving the Problems

In order to solve the aforementioned object, according to the present invention, there is provided a solid-state imaging device having an integrated array of a plurality of pixels, each pixel comprises:

a photodiode for receiving light and generating photoelectric charges;

a transfer transistor for transferring the photoelectric charges; and a storage capacitor element coupled to the photodiode at least through the transfer transistor for accumulating, at least through the transfer transistor, the photoelectric charges overflowing from the photodiode during accumulating operation.

According to the present invention set forth above, the solid-state imaging device comprises an integrated array of pixels formed in a structure wherein a photodiode for receiving light and generating photoelectric charges and a storage capacitor element for accumulating photoelectric charges overflowing from the photodiode are connected through a transfer transistor.

Preferably, the solid-state imaging device according to the present invention further comprises between the transfer transistor and the storage capacitor element a floating region to which the photoelectric charges are transferred via the transfer transistor; and a storage transistor operative to couple or split potentials of the floating region and the storage capacitor element.

Preferably, the solid-state imaging device according to the present invention, further comprises a reset transistor coupled to the floating region for discharging the photoelectric charges of the floating region; an amplifier transistor for amplifying the photoelectric charges in the floating region for conversion to a voltage signal; and a selection transistor coupled to the amplifier transistor for selecting the pixel.

More preferably, the solid-state imaging device according to the present invention comprises a logarithmic conversion circuit for executing logarithmic conversion of the photoelectric charges accumulated in the storage capacitor element for readout.

More preferably, the solid-state imaging device according to the present invention comprises a logarithmic conversion circuit for executing logarithmic conversion of the photoelectric charges overflowing from the photodiode for accumulation in the storage capacitor element.

Preferably, the solid-state imaging device according to the present invention, further comprises a reset transistor coupled to a junction between the storage capacitor element and the storage transistor for discharging the photoelectric charges in the storage capacitor element and the floating region; an amplifier transistor for amplifying the photoelectric charges in the floating region for conversion to a voltage signal; and a selection transistor coupled to the amplifier transistor for selecting the pixel.

Preferably, there is provided the solid-state imaging device according to the present invention wherein the transfer transistor is of a buried channel type having such a semiconductor layer of the same conductive type as that of a channel of the transfer transistor that is formed in a surface of a substrate in which the transfer transistor is formed or in an area of the substrate from a vicinity of the surface down to a predetermined depth.

Alternatively and preferably, the transfer transistor has such a semiconductor layer that is formed in an area in a predetermined depth of a substrate in which the transfer transistor is formed and is of the same conductive type as that of a channel of the transfer transistor, the semiconductor layer reducing a barrier for punch-through of the transfer transistor.

Preferably, there is provided the solid-state imaging device according to the present invention, wherein the storage capacitor element comprises a semiconductor region serving as a lower electrode and formed in a surface area of a semiconductor substrate in which the solid-state imaging device is formed, a capacitor insulation film formed on the semiconductor region, and an upper electrode formed on the capacitor insulation film.

Alternatively and preferably, the storage capacitor element comprises a lower electrode formed on a substrate in which the solid-state imaging device is formed, a capacitor insulation film formed on the lower electrode, and an upper electrode formed on the capacitor insulation film.

Alternatively and preferably, the storage capacitor element comprises a semiconductor region formed in an inner wall of a trench formed in a semiconductor substrate in which the solid-state imaging device is formed, a capacitor insulation film covering the inner wall of the trench, and an upper electrode formed by burying the trench via the capacitor insulation film.

Alternatively and preferably, the storage capacitor element is comprised of a first conductive type semiconductor region and a second conductive type semiconductor region in junction with the first conductive type semiconductor region, both being buried in a semiconductor substrate in which the solid-state imaging device is formed.

Alternatively and preferably, the solid-state imaging device is formed in an SOI (Semiconductor on Insulator) substrate in which a semiconductor layer is formed via an insulation layer on a semiconductor substrate, and the storage capacitor element utilizes an insulation film capacitance between the semiconductor substrate and the semiconductor layer, both opposing each other via the insulation film.

Preferably, the solid-state imaging device according to the present invention, further comprises noise canceling means taking a difference between a voltage signal resulting from the photoelectric charges transferred to the floating region or the floating region and the storage capacitor element, and a voltage signal at a reset level of the floating region or the floating region and the storage capacitor element.

More preferably, the solid-state imaging device further comprises storage means for storing a voltage signal at a reset level of the floating region and the storage capacitor element.

Preferably, the solid-state imaging device according to the present invention further comprises noise cancel means taking a difference between a voltage signal resulting from the photoelectric charges transferred to the floating region and a voltage signal at a level prior to the transfer of the floating region.

More preferably, the solid-state imaging device according to the present invention further comprises noise cancel means taking a difference between a voltage signal resulting from the photoelectric charges transferred to the floating region and the storage capacitor element and a voltage signal at a reset level of the floating region and the storage capacitor element.

More preferably, the solid-state imaging device further comprises storage means for storing a voltage signal at a reset level of the floating region and the storage capacitor element.

Preferably, the solid-state imaging device according to the present invention wherein a first charge-coupled transfer path for transferring the photoelectric charges of the photodiode is coupled to the photodiode; and the storage capacitor element is coupled between adjacent pixels to form a second charge-coupled transfer path for transferring the photoelectric charges of the storage capacitor element independently of the first charge-coupled transfer path.

Alternatively and preferably, the solid-state imaging device further comprises a charge-coupled transfer path coupled to the photodiode for transferring the photoelectric charges of the photodiode; a reset transistor coupled to the storage capacitor element for discharging the photoelectric charges of the storage capacitor element; an amplifier transistor for amplifying the photoelectric charges of the storage capacitor element and converting to a voltage signal; and a selection transistor coupled to the amplifier transistor for selecting the pixel.

Preferably, there is provided the solid-state imaging device according to the present invention wherein the pixel comprises a transistor of an n-channel MOS transistor. Alternatively and preferably, the pixel comprises a transistor of a p-channel MOS transistor.

Further, in order to solve the aforementioned object, according to the present invention, there is provided a line sensor having a plurality of pixels integrated in a linear arrangement, each pixel comprises a photodiode for receiving light and generating photoelectric charges; a transfer transistor for transferring the photoelectric charges; and a storage capacitor element coupled to the photodiode at least through the transfer transistor for accumulating, at least through the transfer transistor, the photoelectric charges overflowing from the photodiode during accumulating operation.

According to the present invention mentioned above, the line sensor comprises an integrated array of pixels formed in a structure wherein a photodiode for receiving light and generating photoelectric charges, and a storage capacitor element for accumulating photoelectric charges overflowing from the photodiode are connected through a transfer transistor.

Moreover, in order to solve the aforementioned object, according to the present invention, there is provided an optical sensor comprising a photodiode for receiving light and generating photoelectric charges; a transfer transistor for transferring the photoelectric charges; and a storage capacitor element coupled to the photodiode at least through the transfer transistor for accumulating the photoelectric charges overflowing from the photodiode at least through the transfer transistor during accumulating operation.

With the line sensor according to the present invention mentioned above, a photodiode for receiving light and generating photoelectric charges and a storage capacitor element for accumulating photoelectric charges overflowing from the photodiode are connected through a transfer transistor.

In order to solve the aforementioned object, according to the present invention, there is provide a method of operating a solid-state imaging device having an integrated array of a plurality of pixels, each pixel having a photodiode for receiving light and generating photoelectric charges, a transfer transistor for transferring the photoelectric charges, a storage transistor, a floating region coupled to the photodiode via the transfer transistor, and a storage capacitor element for accumulating photoelectric charges overflowing from the photodiode via the transfer transistor and the storage transistor during an accumulating operation, the storage transistor controllably coupling or splitting potentials of the storage capacitor element and the floating region, the operating method comprising the steps of turning off the transfer transistor and turning on the storage transistor for discharging the photoelectric charges of the floating region and the storage capacitor element, prior to accumulating charges; reading out a voltage signal at a reset level of the floating region and the storage capacitor element; accumulating, in the photodiode, pre-saturated charges among the photoelectric charges generated in the photodiode and accumulating, in the floating region and the storage capacitor element, supersaturated charges overflowing from the photodiode; turning off the storage transistor to split potentials of the floating region and the storage capacitor element and discharging the photoelectric charges in the floating region; reading out a voltage signal at a reset level of the floating region; turning on the transfer transistor so as to transfer the pre-saturated charges to the floating region and reading out a voltage signal of the pre-saturated charges; and turning on the storage transistor to couple the potentials of the floating region and the storage capacitor element for mixing the pre-saturated charges and the supersaturated charges and reading out a voltage signal of a sum of the pre-saturated charges and the supersaturated charges.

According to the present invention mentioned above, with a method of operating a solid-state imaging device, a transfer transistor is turned off and a storage transistor is turned on for discharging photoelectric charges of a floating region and a storage capacitor element prior to accumulating charges, upon which a voltage signal at a reset level of the floating region and the storage capacitor element is read out.

Subsequently, among photoelectric charges generated by the photodiode, pre-saturated charges are accumulated in the photodiode and supersaturated charges, overflowing from the photodiode, are accumulated in the floating region and the storage capacitor element.

Then, a storage transistor is turned off to split potentials the floating region and the storage capacitor element and the photoelectric charges are discharged from the floating region, upon which a voltage signal at a reset level of the floating region is read out.

Next, the transfer transistor is turned on to transfer the pre-saturated charges to the floating region and a voltage signal of the pre-saturated charges is read out.

Thereafter, the storage transistor is turned on to couple the potentials of the floating region and the storage capacitor element, the pre-saturated charges and the supersaturated charges are mixed, and a voltage signal of sum of the pre-saturated charges and the supersaturated charges is read out.

Preferably, the method of operating the imaging device according to the present invention further comprises canceling noise of a voltage signal of the pre-saturated charges by taking a difference between a voltage signal of the pre-saturated charges and a voltage signal at a reset level of the floating region; canceling noise of a voltage signal of a sum of the pre-saturated charges and the supersaturated charges by taking a difference between the voltage signal of the sum of the pre-saturated charges and the supersaturated charges and a voltage signal at a reset level of the floating region and the storage capacitor element; adjusting a gain of the voltage signal of the sum of the pre-saturated charges and the supersaturated charges so as to make the gain substantially the same as a gain of the voltage signal of the pre-saturated charges; and selecting either one of the noise-cancelled voltage signal of the pre-saturated charges, and the noise-cancelled voltage signal of the sum of the pre-saturated charges and the supersaturated charges by comparing with a reference voltage.

Preferably, the method of operating the imaging device according to the present invention wherein the step of accumulating in the photodiode the pre-saturated charges among photoelectric charges generated in the photodiode and accumulating in the floating region and the storage capacitor element the supersaturated charges overflowing from the photodiode comprises the steps of adjusting the potential of the transfer transistor to a level for completely turning off the transfer transistor or a level lower than that level.

In order to solve the aforementioned object, according to the present invention, there is provided a method of operating a solid-state imaging device having an integrated array of a plurality of pixels, each pixel having a photodiode for receiving light and generating photoelectric charges, a transfer transistor for transferring the photoelectric charges, a storage transistor, a floating region coupled to the photodiode via the transfer transistor, and a storage capacitor element accumulating photoelectric charges overflowing from the photodiode via the transfer transistor and the storage transistor during an accumulating operation to allow the storage transistor to controllably coupling or splitting potentials of the floating region and the storage capacitor element, the operating method comprising turning off the transfer transistor and turning on the storage transistor for discharging the photoelectric charges of the floating region and the storage capacitor element, prior to accumulating charges; reading out a voltage signal at a reset level of the floating region and the storage capacitor element; accumulating in the photodiode pre-saturated charges among the photoelectric charges generated in the photodiode and accumulating in the floating region and the storage capacitor element supersaturated charges overflowing from the photodiode; turning off the storage transistor to split potentials of the floating region and the storage capacitor element and reading out a voltage signal at a pre-transfer level of the pre-saturated charges in the floating region; turning on the transfer transistor for transferring the pre-saturated charges to the floating region and reading out a voltage signal at a post-transfer level of the pre-saturated charges and, turning on the storage transistor to couple the potentials of the floating region and the storage capacitor element for mixing the pre-saturated charges and the supersaturated charges and reading out a voltage signal of a sum of the pre-saturated charges and the supersaturated charges.

According to the present invention mentioned above, with a method of operating a solid-state imaging device, a transfer transistor is turned off and a storage transistor is turned on for discharging photoelectric charges of a floating region and a storage capacitor element prior to accumulating charges, upon which a voltage signal at a reset level of the floating region and the storage capacitor element is read out.

Subsequently, among photoelectric charges generated by the photodiode, pre-saturated charges are accumulated in the photodiode and supersaturated charges, overflowing from the photodiode, are accumulated in the floating region and the storage capacitor element.

Then, a storage transistor is turned off to split potentials the floating region and the storage capacitor element and a voltage signal of the pre-saturated charges at a post-transfer level is read out.

Next, the transfer transistor is turned on to transfer the pre-saturated charges to the floating region for reading out a voltage signal of the pre-saturated charges at a post-transfer level.

Then, the storage transistor is turned on to couple the potentials of the floating region and the storage capacitor element for mixing the pre-saturated charges and the supersaturated charges and a voltage signal of a sum of the pre-saturated charges and the supersaturated charges is read out.

Preferably, the method of operating the imaging device according to the present invention further comprises the steps of canceling noise of a voltage signal of the pre-saturated charges by taking a difference between a voltage signal at the post-transfer level of the pre-saturated charges and a voltage signal at the pre-transfer level of the pre-saturated charges; canceling noise of a voltage signal of a sum of the pre-saturated charges and the supersaturated charges by taking a difference between the voltage signal of the sum of the pre-saturated charges and the supersaturated charges and a voltage signal at a reset level of the floating region and the storage capacitor element; adjusting a gain of the voltage signal of the sum of the pre-saturated charges and the supersaturated charges so as to make the gain substantially the same as a gain of the voltage signal of the pre-saturated charges; and selecting either one of the noise-cancelled voltage signal of the pre-saturated charges, and the noise-cancelled voltage signal of the sum of the pre-saturated charges and the supersaturated charges by comparing with a reference voltage.

Preferably, the method of operating the imaging device according to the present invention, wherein the step of accumulating in the photodiode pre-saturated charges among photoelectric charges generated in the photodiode and accumulating, in the floating region and the storage capacitor element, supersaturated charges overflowing from the photodiode comprises the steps of adjusting the potential of the transfer transistor to a level for completely turning off the transfer transistor or a level lower than that level.

Effect of Invention

According to the present invention, the solid-state imaging device enables the photodiode receiving light and generating the photoelectric charges to maintain a high sensitivity with a high S/N ratio during imaging at low illuminance and, further, the storage capacitor element to accumulate the photoelectric charges, overflowing from the photodiode, for enabling imaging at high illuminance, resulting in capability of enhancing a wide dynamic range.

With the line sensor according to the present invention, a wide dynamic range can be enhanced while keeping high sensitivity with a high S/N ratio.

With the optical sensor according to the present invention, a wide dynamic range can be enhanced while keeping high sensitivity with a high S/N ratio.

With the method of operating the solid-state imaging device according to the present invention, a wide dynamic range can be enhanced while keeping high sensitivity with a high S/N ratio.

BRIEF DESCRIPTION OF THE DRAWINGS

FIG. 2-1 is a typical cross-sectional view of a structure corresponding to a part of each pixel of the CMOS image sensor of the first embodiment according to the present invention.

FIG. 2-2 is a typical potential diagram corresponding to regions shown in FIG. 2-1.

FIG. 3-1 is a timing chart of voltages applied to drivelines ($\phi_T$, $\phi_S$, $\phi_R$) of the CMOS image sensor of the first embodiment according to the present invention.

FIG. 3-2 is a graph showing variations in voltage potentials ($V_{PD}$, $V_{FD}$, $V_{CS}$) corresponding to waveforms shown in FIG. 3-1 at a light intensity below a saturation level.

FIG. 3-3 is a graph showing variations in voltage potentials ($V_{PD}$, $V_{FD}$, $V_{CS}$) corresponding to waveforms shown in FIG. 3-1 at a light intensity above the saturation level.

FIG. 4-1 represents a potential diagram corresponding to a certain timing of the timing chart shown in FIG. 3-1.

FIG. 4-2 represents a potential diagram corresponding to another certain timing of the timing chart shown in FIG. 3-1.

FIG. 4-3 represents a potential diagram corresponding to another certain timing of the timing chart shown in FIG. 3-1.

FIG. 4-4 represents a potential diagram corresponding to another certain timing of the timing chart shown in FIG. 3-1.

FIG. 5-1 represents a potential diagram corresponding to another certain timing of the timing chart shown in FIG. 3-1.

FIG. 5-2 represents a potential diagram corresponding to another certain timing of the timing chart shown in FIG. 3-1.

FIG. 5-3 represents a potential diagram corresponding to another certain timing of the timing chart shown in FIG. 3-1.

FIG. 5-4 represents a potential diagram corresponding to another certain timing of the timing chart shown in FIG. 3-1.

FIG. 8-1 is a view representing an electric charge count, obtained when using a capacitance of $C_{FD}$, plotted I terms of a relative light intensity.

FIG. 8-2 is a view representing an electric charge count, obtained when using a capacitance of $C_{FD}$+$C_S$, plotted I terms of relative light intensity.

FIG. 8-3 is a graph showing the electric charge counts, shown in FIGS. 8-1 and 8-2, converted to a voltage and plotted in terms of relative light intensity.

FIG. 9-1 is an equivalent circuit diagram for one pixel of one example of a CMOS Image sensor of a second embodiment according to the present invention.

FIG. 9-2 is an equivalent circuit diagram for one pixel of another example of the CMOS image sensor of the second embodiment according to the present invention.

FIG. 10-1 is an equivalent circuit diagram for one pixel of one example of a CMOS image sensor of a third embodiment according to the present invention.

FIG. 10-2 is an equivalent circuit diagram for one pixel of another example of the CMOS image sensor of the third embodiment according to the present invention.

FIG. 11-1 is an equivalent circuit diagram for one pixel of one example of a CMOS image sensor of a fourth embodiment according to the present invention.

FIG. 11-2 is an equivalent circuit diagram for one pixel of another example of the CMOS image sensor of the fourth embodiment according to the present invention.

FIG. 14-1 is a timing chart of voltages applied to drivelines ($\phi_T$, $\phi_S$, $\phi_R$) of the CMOS image sensor of the fifth embodiment according to the present invention.

FIG. 14-2 is a timing chart of voltages applied to drivelines ($\phi_T$, $\phi_S$, $\phi_R$) of the CMOS image sensor of the fifth embodiment according to the present invention.

FIG. 15-1 represents a potential diagram corresponding to a certain timing of the timing chart shown in FIG. 14-1.

FIG. 15-2 represents a potential diagram corresponding to another certain timing of the timing chart shown in FIG. 14-1.

FIG. 15-3 represents a potential diagram corresponding to another certain timing of the timing chart shown in FIG. 14-1.

FIG. 16-1 represents a potential diagram corresponding to another certain timing of the timing chart shown in FIG. 14-1.

FIG. 16-2 represents a potential diagram corresponding to another certain timing of the timing chart shown in FIG. 14-1.

FIG. 16-3 represents a potential diagram corresponding to another certain timing of the timing chart shown in FIG. 14-1.

FIG. 18-1 is a cross-sectional view showing a detail of a floating region area of a CMOS image sensor of a sixth embodiment according to the present invention.

FIG. 18-2 is a cross-sectional view showing a manufacturing step of the CMOS sensor shown in FIG. 18-1.

FIG. 18-3 is a cross-sectional view showing another manufacturing step of the CMOS sensor shown in FIG. 18-1.

FIG. 19-1 is a cross-sectional view showing a structure of a CMOS sensor of a seventh embodiment according to the present invention.

FIG. 19-2 is a cross-sectional view showing the structure of the CMOS sensor of the seventh embodiment according to the present invention.

FIG. 20-1 is a cross-sectional view showing the structure of the CMOS sensor of the seventh embodiment according to the present invention.

FIG. 20-2 is a cross-sectional view showing the structure of the CMOS sensor of the seventh embodiment according to the present invention.

FIG. 21-1 is a cross-sectional view of a modified form of a storage capacitor element of a CMOS sensor of an eighth embodiment according to the present invention.

FIG. 21-2 is a cross-sectional view of a modified form of the storage capacitor element of the CMOS sensor of the eighth embodiment according to the present invention.

FIG. 22-1 is a cross-sectional view of a modified form of the storage capacitor element of the CMOS sensor of the eighth embodiment according to the present invention.

FIG. 22-2 is a cross-sectional view of a modified form of the storage capacitor element of the CMOS sensor of the eighth embodiment according to the present invention.

FIG. 23-1 is a cross-sectional view of a modified form of the storage capacitor element of the CMOS sensor of the eighth embodiment according to the present invention.

FIG. 23-2 is a cross-sectional view of a modified form of the storage capacitor element of the CMOS sensor of the eighth embodiment according to the present invention.

FIG. 25-1 is a cross-sectional view of a modified form of the storage capacitor element of the CMOS sensor of the eighth embodiment according to the present invention.

FIG. 25-2 is a cross-sectional view of a modified form of the storage capacitor element of the CMOS sensor of the eighth embodiment according to the present invention.

FIG. 26-1 is a cross-sectional view of a modified form of the storage capacitor element of the CMOS sensor of the eighth embodiment according to the present invention.

FIG. 26-2 is a cross-sectional view of a modified form of the storage capacitor element of the CMOS sensor of the eighth embodiment according to the present invention.

FIG. 33-1 is a view of an output (V), appearing before a photodiode is saturated in Example 4, which is plotted in terms of light intensity (lux).

FIG. 33-2 is a view of an output (V), appearing after the photodiode is saturated in Example 4, which is plotted in terms of light intensity (lux).

Figure 1:
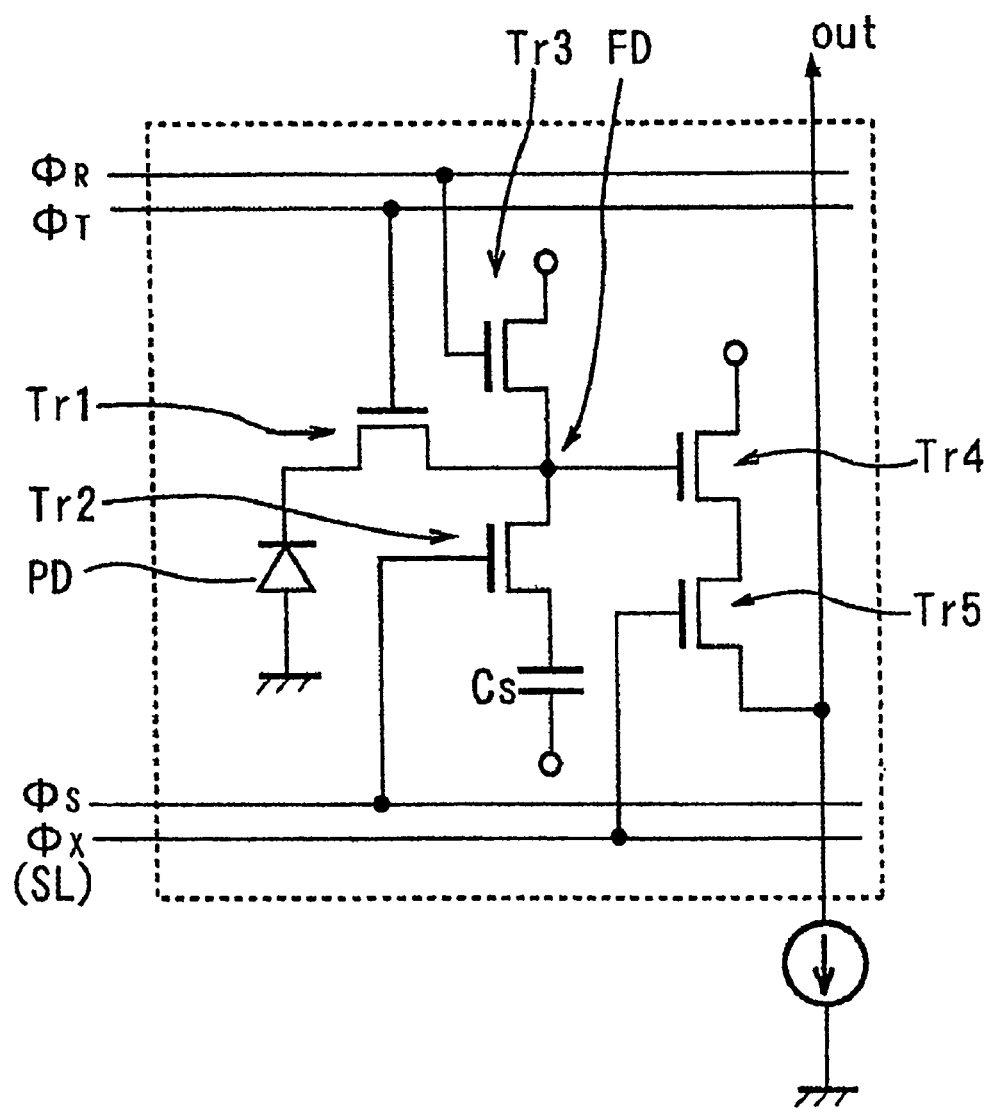
FIG. 1 is an equivalent circuit diagram of one pixel of a CMOS image sensor of a first embodiment according to the present invention.

| Reference Numerals | |
|---|---|
| 10 | n-type semiconductor substrate |
| 11 | p-type well |
| 12, 12a | p'-type separating regions |
| 14, 17, 19 | p'-type semiconductor regions |
| 13, 50, 51, 52 | n-type semiconductor regions |
| 15, 16, 16a, 16b, 18 | n'-type semiconductor regions |
| 15a | low-concentrated impurity region |
| 15b | high-concentrated impurity region |
| 20, 21, 22 | element separating insulation films |
| 20a | end portion of element separating insulation films |
| 23, 24 | gate insulation films |
| 25, 25a, 25' | capacitor insulation films |
| 30, 31 | gate electrodes |
| 30a | sidewall spacer |
| 32, 38, 38a, 40 | upper electrodes |
| 33, 34, 35, 36, 39 | wirings |
| 37, 37a | lower electrodes |
| 41 | TiSi layer (Ti-layer) |
| 42 | TiN layer |
| 43 | Tungsten plug |
| 44 | upper layer wire lead |
| 60 | p-type semiconductor substrate |
| 61 | p-type epitaxial layer |
| 61a | first p-type epitaxial layer |
| 61b | second p-type epitaxial layer |
| 62 | n'-type semiconductor region |
| 63 | p'-type separating region |
| 64 | p-type semiconductor layer |
| 65 | n'-type semiconductor region |
| 66 | low-concentrated semiconductor region |
| ADC1-3 | A/D converter |
| AP | amplifier |
| $C_1$ | small capacitance |
| $C_2$ | large capacitance |
| $C_{PD}, C_{FD}, C$ | capacitors |
| $C_S$ | storage capacitor element |
| Cap | storage capacitor element |
| CCD1 | first charge-coupled transfer path |
| CCD2 | second charge-coupled transfer path |
| CH | chip |
| CP | comparator |
| $CT_a, CT_b$ | circuits |
| DC1, DC2 | difference amplifier |
| DP1, 2 | conductive impurities |
| FD | floating region |
| FM | frame memory |
| GND | ground |
| LT | light |
| $N_1$ | signal (noise) at reset level of $C_{FD}$ |
| $N_2$ | signal (noise) at reset level of $C_{FD} + C_S$ |
| Noise | noise |
| out | output (line) |
| out1, out2 | outputs |
| PA | overflow path |
| PC | pixel circuit |
| PD | photodiode |
| Pixel | pixel |
| PR | resist film |
| $Q_A$ | supersaturated charges |
| $Q_{A1}, Q_{A2}$ | portions of supersaturated charges |
| $Q_B$ | pre-saturated charges |
| R | reset transistor |
| $S_1$ | pre-saturated charge signal |
| $S_1'$ | modulated pre-saturated charge signal |
| $S_2$ | supersaturated charge signal |
| $S_2'$ | modulated supersaturated charge signal |
| SE | selector |
| SL | selecting line |
| $SR^H$ | row shift register |
| $SR^V$ | line shift register |
| T | switch |
| $T_1$-$T_4$ | times |
| TC | trench |
| Tr1 | transfer transistor |
| Tr2 | storage transistor |
| Tr3 | reset transistor |
| Tr4 | amplifier transistor |
| Tr5 | selection transistor |
| Tr6-Tr10 | transistors |
| $V_{PD}, V_{FD}, V_{CS}$ | voltage potentials |
| VDD | power supply voltage |
| $\phi_T, \phi_S, \phi_R, \phi_X,$ $\phi_{S1+N1}, \phi_{N1},$ $\phi_{S1'+S2'+N2}, \phi_{N2},$ $\phi_{V1}, \phi_{V2}$ | drivelines |

BEST MODE FOR CARRYING OUT THE INVENTION

Hereinbelow, embodiments of solid-state imaging devices according to the present invention are described with reference to the accompanying drawings.

First Embodiment

A solid-state imaging device of the present embodiment is structured in the form of a CMOS image sensor and FIG. 1 is an equivalent circuit diagram for one pixel.

Each pixel includes a photodiode PD for receiving light and generating photoelectric charges, a transfer transistor Tr1 for transferring the photoelectric charges of the photodiode PD, a floating region FD from which the photoelectric charges are transferred via the transfer transistor Tr1, a storage capacitor element $C_S$ for accumulating the photoelectric charges overflowing from the photodiode during accumulating operation, a storage transistor Tr2 for coupling or splitting potentials of the floating region FD and the storage capacitor element $C_S$, a reset transistor Tr3 connected to the floating region FD for discharging the photoelectric charges of the floating region FD, an amplifier transistor Tr4 for amplifying the photoelectric charges of the floating region FD and converting to a voltage signal, and a selection transistor Tr5 coupled to the amplifier transistor for selecting a pixel. Thus, a CMOS image sensor of a so-called five-transistor type is formed in a structure. For instance, any of the five transistors mentioned above includes an N-channel MOS transistor.

The CMOS image sensor of the present embodiment includes an integrated array of a plurality of pixels formed in the structure described above. With each pixel, the transfer transistor Tr1, the storage transistor Tr2 and the reset transistor Tr3 have gate electrodes connected to drivelines $\phi_T$, $\phi_S$, $\phi_R$, respectively. Also, the selection transistor Tr5 has a gate electrode connected to a pixel selection line SL($\phi_X$) adapted to be driven by a line shift register. Further, the selection transistor Tr5 has a source and drain on an output to which an output line "out" is connected and is controlled by a row shift register to provide an output.

Since the selection transistor Tr5 and the driveline $\phi_X$ may be suffice to fix a voltage of the floating region FD to an appropriate value so as to enable the operations to select or not to select a pixel, these components may be possibly omitted.

Figures 1, 2:
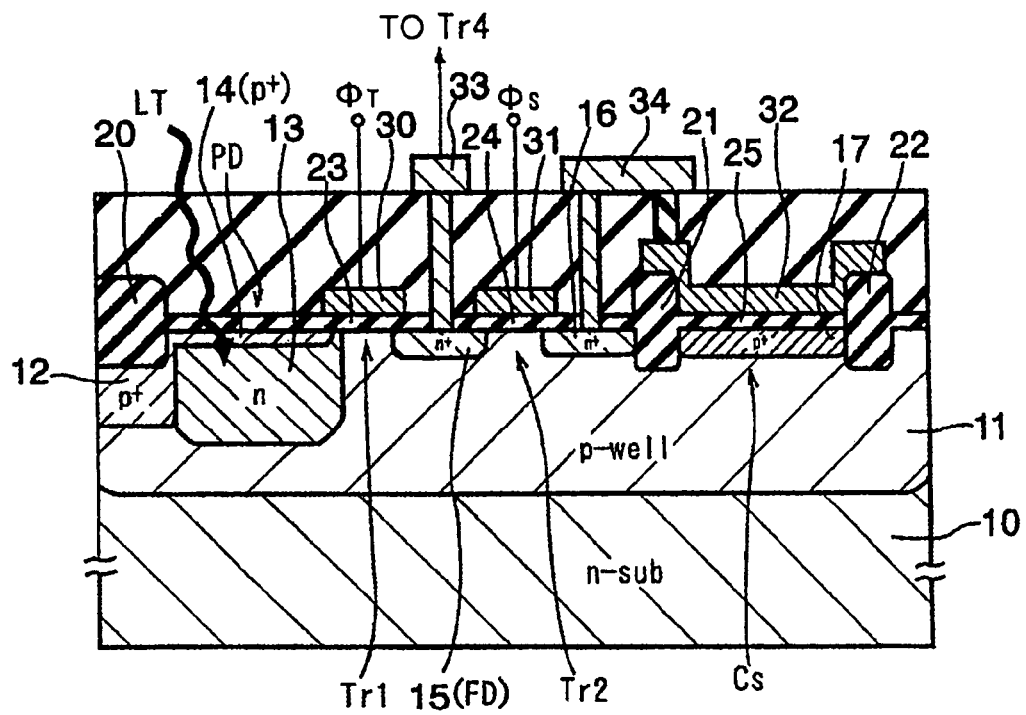
Figure 2:
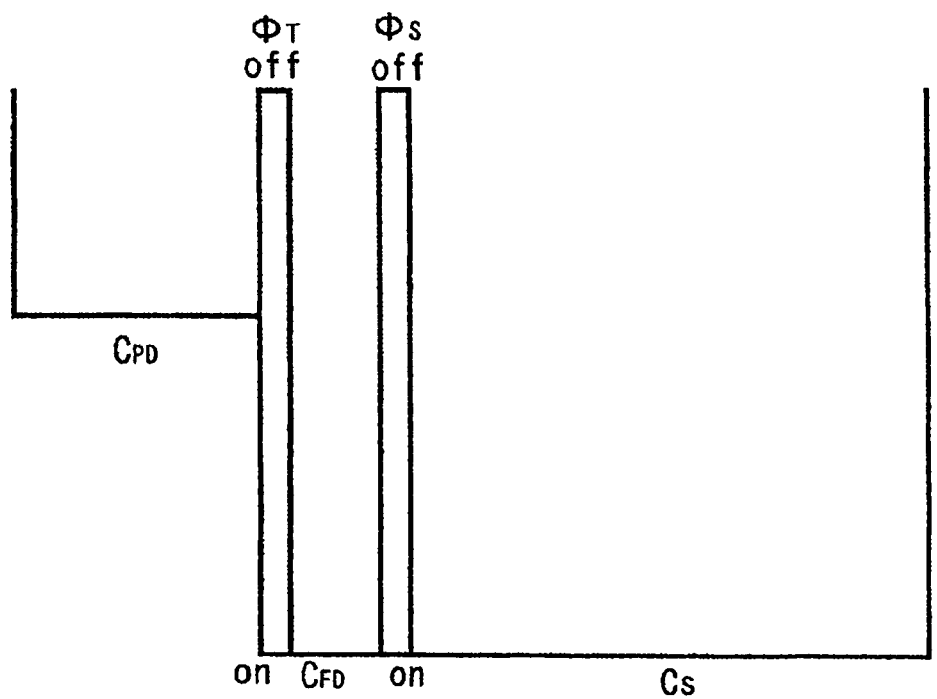

FIG. 2-1 is a typical cross-sectional view showing a structure corresponding to a part (the photodiode PD, the transfer transistor Tr1, the floating region FD, the storage transistor Tr2 and the storage capacitor element $C_S$) of each pixel of the CMOS image sensor of the present embodiment.

For instance, an n-type silicon semiconductor substrate (n-sub) 10 is formed with a p-type well (p-well) 11 on which element separating insulation films (20, 21, 22) are formed by a LOCOS process or the like for separating each pixel and the storage capacity element $C_S$. Further, a p'-type separating region 12 is formed in the p-type well 11 corresponding to an area below the element separating insulation film 20 for separating the pixels from each other.

The p-type well 11 is formed with an n-type semiconductor region 13 whose surface layer is formed with a p'-type semiconductor region 14 in a p-n junction by which a photodiode PD of a charge-transfer buried type is formed. Applying appropriate bias to the p-n junction creates a depleted layer that receives incident light LT and generates photoelectric charges due to a photoelectric effect.

The n-type semiconductor region 13 has a terminal end portion formed in a region sticking out of the p'-type semiconductor region 14. An n'-type semiconductor region 15 is formed on the surface layer of the p-type well 11 in an area remote from the stick-out region by a given distance and serves as the floating region FD. In addition, an n'-type semiconductor region 16 is formed on the surface layer of the p-type well 11 in another area remote from the stick-out region by a given distance.

Here, a gate electrode 30, made of polysilicon, is formed over an upper surface of the p-type well 11 in an area associated with the n-type semiconductor region 13 and the n'-type semiconductor region 15 via a gate insulation film 23 formed of oxide silicon. Thus, the transfer transistor Tr1 has a source and drain and includes the n-type semiconductor region 13, the n'-type semiconductor region 15 and a channel forming region on the surface layer of the p-type well 11.

Further, a gate electrode 31 made of polysilicon, is formed over the upper surface of the p-type well 11 in an area associated with the n'-type semiconductor region 15 and the n'-type semiconductor region 16 via a gate insulation film 24 formed of oxide silicon. Thus, the storage transistor Tr2 has a source and drain and includes the n'-type semiconductor region 15, the n'-type semiconductor region 16 and a channel forming region on the surface layer of the p-type well 11.

Furthermore, a p'-type semiconductor region 17 is formed on the surface layer of the p-type well 11 in an area separated by the element separating insulation films (21, 22) to serve as a lower electrode and has an upper layer on which an upper electrode 32, formed of polysilicon or the like, is formed via a capacitor insulation film 25, formed of oxide silicone or the like to thereby form the storage capacitor element $C_S$.

The transfer transistor Tr1, the storage transistor Tr2 and the storage capacitor element $C_S$ are covered with an insulation film that is formed of oxide silicon so as to form opening portions exposed to the n'-type semiconductor regions 15 and 16 and the upper electrode 32 and a wiring 33 is formed and connected to the n'-type semiconductor region 15 while a wiring 34 is formed to connect the n'-type semiconductor region 16 and the upper electrode 32.

Moreover, the driveline $\phi_T$ is connected to the gate electrode 30 of the transfer transistor Tr1 and, also, the driveline $\phi_S$ is connected to the gate electrode 31 of the storage transistor Tr2.

The other component parts, such as the reset transistor Tr3, the amplifier transistor Tr4, the selection transistor Tr5, the various drivelines $\phi_T$, $\phi_S$, $\phi_R$, $\phi_X$ and the output line "out", are formed on the semiconductor substrate 10 shown in FIG. 2-1 in areas, not shown, so as to obtain the structure in the equivalent circuit diagram shown in FIG. 1 such that, for instance, the wiring 33 is connected to the amplifier transistor Tr4 that is not shown.

FIG. 2-2 is a typical potential diagram corresponding to the photodiode PD, the transfer transistor Tr1, the floating region FD, the storage transistor Tr2 and the storage capacitor element $C_S$ mentioned above.

The photodiode PD forms a capacitor $C_{PD}$ with a potential that is relatively shallow and the floating region FD and the storage capacitor $C_S$ form a capacitor ($C_{FD}$, $C_S$) with a potential that is relatively deep.

Here, the transfer transistor Tr1 and the storage transistor Tr2 may take two levels depending on on/off states of the transistors.

A method of driving the CMOS image sensor of the present invention is described below with reference to the illustrated equivalent circuit diagram of FIG. 1, the cross-sectional view of FIG. 2-1 and the potential diagram of FIG. 2-2.

Figures 1, 3:
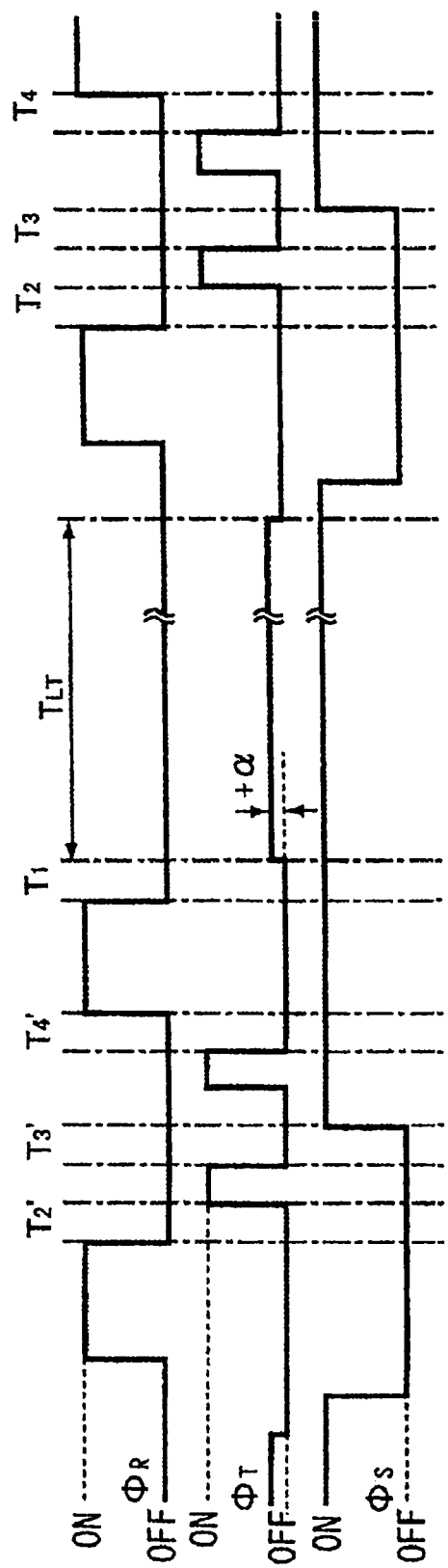
Figures 2, 3:
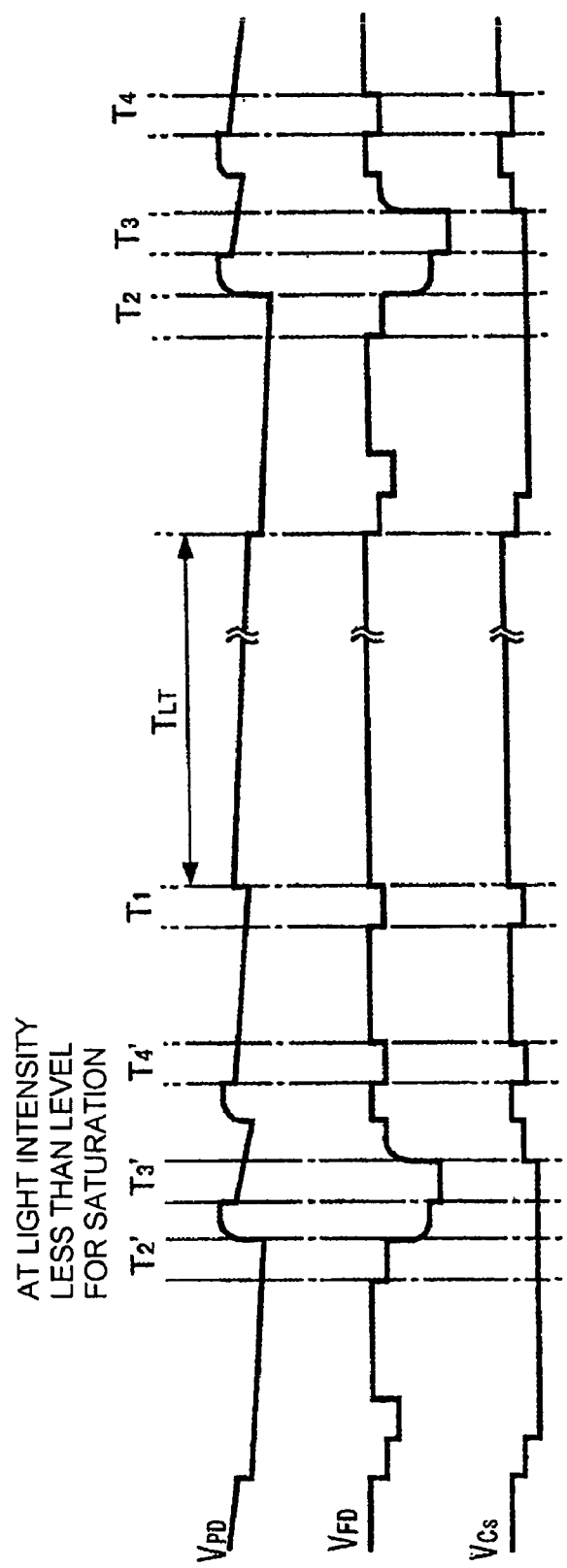
Figure 3:
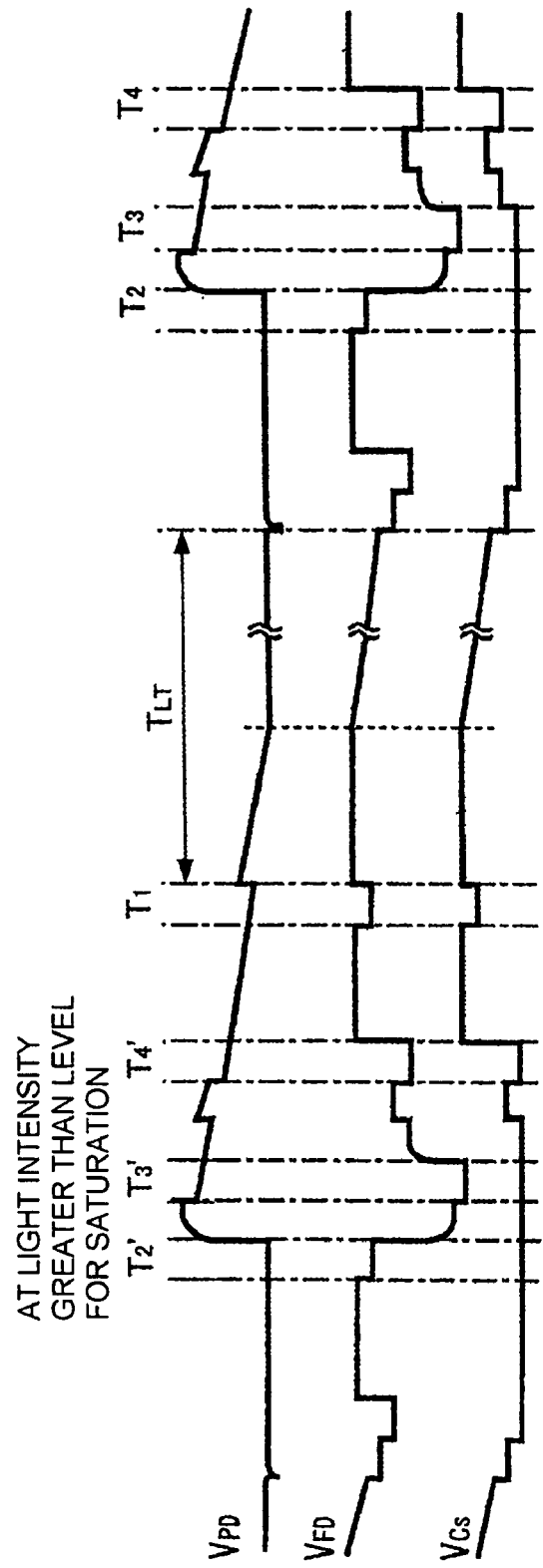

FIG. 3-1 is a timing chart showing voltages applied to the drivelines ($\phi_T$, $\phi_S$, $\phi_R$) in two levels for on/off states with $\phi_T$ having three levels additionally including a level represented by (+α).

The voltage applied to the driveline $\phi_T$ may take the two levels for ON/OFF states and may preferably take the three levels as represented in the present example for enabling the floating region FD and the storage capacitor element $C_S$ to efficiently capture and accumulate an electric charge overflowing from the photodiode PD.

FIGS. 3-2 and 3-3 are graphs showing variations in voltage potentials ($V_{PD}$, $V_{FD}$, $V_{CS}$) of the capacitors ($C_{PD}$, $C_{FD}$, $C_S$) formed of the photodiode PD, the floating region FD and the storage capacitor element $C_S$ in the timing charts mentioned above, respectively. FIG. 3-2 represents waveforms of the voltage potentials appearing at light intensity less than a level causing a photoelectron generated by the photodiode PD to saturate the capacitor $C_{PD}$ and FIG. 3-3 shows voltage waveforms plotted in terms of light intensity greater than the level causing the capacitor $C_{PD}$ to be saturated.

Figures 1, 4:
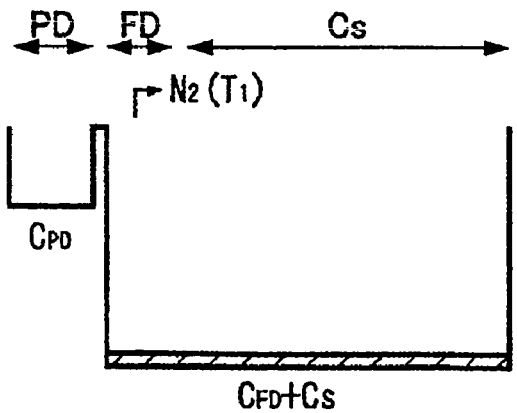
Figures 2, 4:
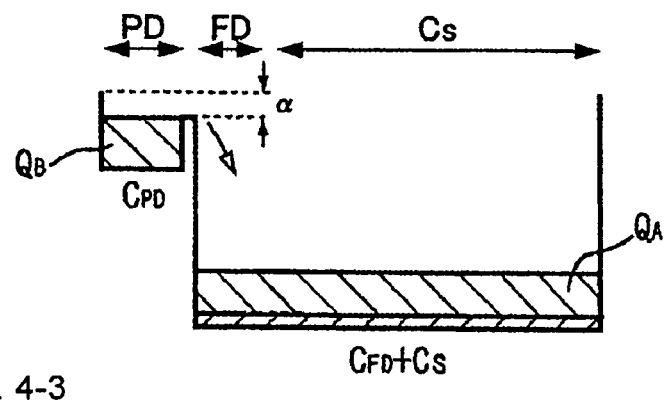
Figures 3, 4:
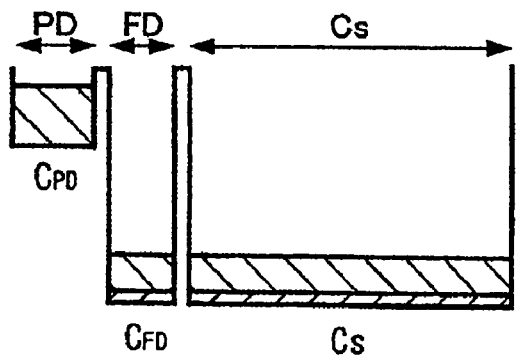
Figure 4:
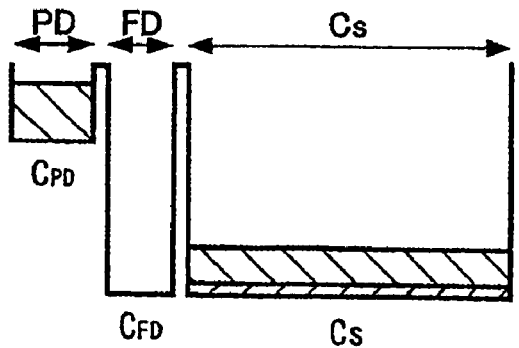
Figures 1, 5:
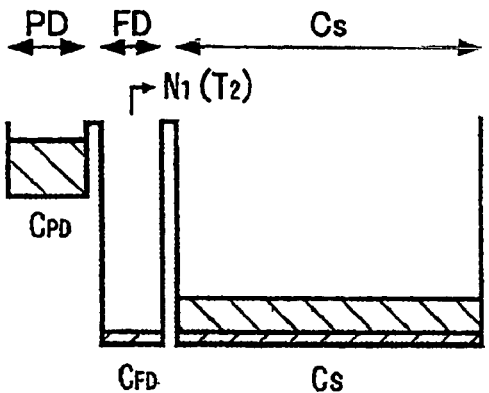
Figures 2, 5:
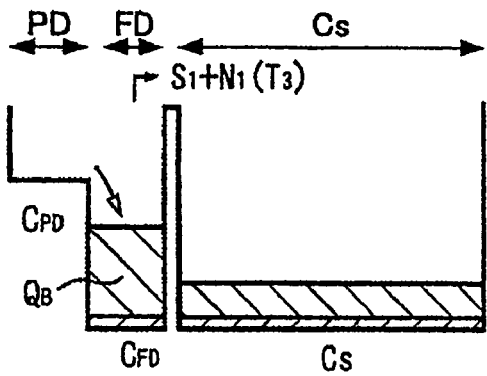
Figures 3, 5:
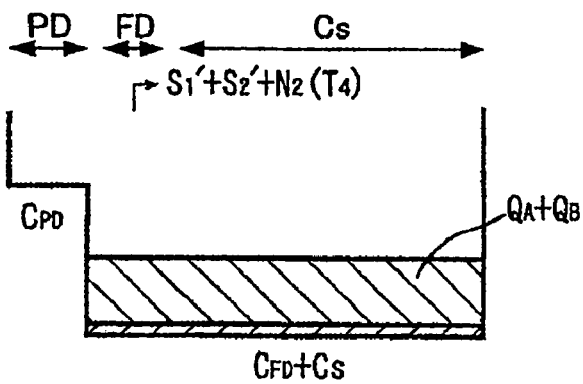
Figures 4, 5:
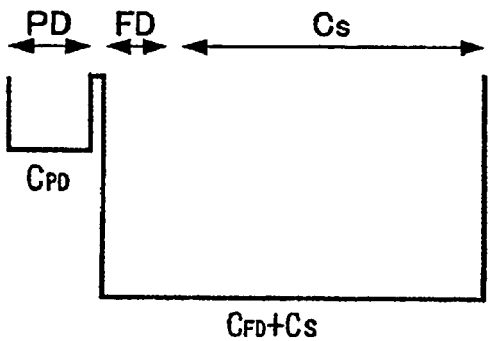

Further, FIGS. 4-1 to 4-4 and FIGS. 5-1 to 5-4 correspond to potential diagrams at respective timings of the timing charts.

First, with $\phi_R$ being set to be on under a condition where $\phi_T$ is set to be off and $O_S$ is set to be on, photoelectric charges generated in a preceding field are entirely discharged for resetting. At time $T_1$, a subsequent field begins and $\phi_R$ is set to be off.

At this moment, as shown in FIG. 4-1, $\phi_S$ is set to be on with the resultant coupling between $C_{PD}$ and $C_S$ and immediately after resetting, so-called kTC noise occurs in $C_{FD}+C_S$ with the occurrence of resetting operation. Here, a signal at a reset level of $C_{FD}+C_S$ is read out as noise $N_2$.

A method -of reading out noise $N_2$ for accumulation in a frame memory (storage means), described below, to allow noise $N_2$ to be utilized in generating an image signal establishes an operation method that provides the highest S/N ratio. However, since noise $N_2$ is sufficiently less than a value of pre-saturated charges and supersaturated charges during supersaturating operation, noise $N_1$, described below, may be used in place of noise $N_2$. Further, noise $N_2$ of a subsequent frame may be used in place of noise $N_2$ of the current frame.

Subsequently, during an accumulation interval $T_{LT}$, photoelectric charges generated in the photodiode PD are accumulated. At this moment, a barrier between $C_{PD}$ and $C_{FD}$ is set to be slightly low for a level (+α) of $\phi_T$.

As shown in FIG. 3-2, the photoelectric charges are initially accumulated in $C_{PD}$ accompanied by progressive decrease in the voltage potential $V_{PD}$. If the amount of photoelectrons is less than a level causing the saturation of $C_{PD}$, only the voltage potential $V_{PD}$ varies with no variations taking place in the voltage potentials ($V_{FD}$, $V_{CS}$) of $C_{PD}$ and $C_{FD}$.

On the contrary, if the amount of photoelectrons exceeds the level causing the saturation of $C_{PD}$, the photoelectric charges overflows from $C_{PD}$ overcoming the barrier slightly lower than the level (+α) of $\phi_T$ and is progressively accumulated in $C_{FD}+C_S$ of the pixel. At this moment, although as shown in FIG. 3-3, the voltage potential $V_{PD}$ of $C_{PD}$ is gradually decreasing just before $C_{PD}$ is saturated with no variations taking place in the voltage potentials ($V_{PD}$, $V_{CS}$) of $C_{FD}$ and $C_S$ and, immediately after $C_{PD}$ is saturated, the voltage potential $V_{PD}$ of $C_{PD}$ is fixed with the resultant consequence of progressive decrease in the voltage potentials ($V_{FD}$, $V_{CS}$) of $C_{FD}$ and $C_S$.

Thus, in a case where the amount of photoelectrons is less than a level causing the saturation of the photodiode PD, the photoelectric charges are accumulated only in $C_{PD}$ and in a case where the amount of photoelectrons exceeds a level causing the saturation of the photodiode PD, the photoelectric charges are accumulated in, in addition to $C_{PD}$, $C_{FD}$ and $C_S$.

FIG. 4-2 shows a status in which $C_{PD}$ is saturated and pre-saturated charges $Q_B$ are accumulated in $C_{PD}$ and supersaturated charges $Q_A$ are accumulated in $C_{FD}$ and $C_S$.

Subsequently, at the end of accumulation time $T_{LT}$, $\phi_T$ is returned to be off from the level of (+α) and $\phi_S$ is set to be off to split the potentials of $C_{FD}$ and $C_S$ as shown in FIG. 4-3.

Then, $\phi_R$ is set to be on and, as shown in FIG. 4-4, the photoelectric charges are discharged from $C_{FD}$ for resetting.

Next, immediately after $\phi_R$ is set to be off and the resetting is completed at time $T_2$, kTC noise newly occurs in $C_{FD}$ as shown in FIG. 5-1. Herein, a signal appearing at a reset level in $C_{FD}$ is read out as noise $N_1$.

Then, $\phi_T$ is set to be on and pre-saturated charges $Q_B$ are transferred from $C_{PD}$ to $C_{FD}$ as shown in FIG. 5-2. Herein, since $C_{PD}$ has a potential shallower than that of $C_{FD}$ and the transfer transistor has a level deeper than that of $C_{PD}$, the pre-saturated charges $Q_B$ are entirely transferred from $C_{PD}$ to $C_{FD}$ to thereby realize a complete electric charge transfer.

Herein, $\phi_T$ is returned to be off at time $T_3$ and a pre-saturated charge signal $S_1$ is read out from the pre-saturated charges $Q_B$ transferred to $C_{FD}$. However, herein, since $C_{FD}$ noise is present, $S_1+N_1$ is actually read out. FIG. 5-2 shows a status appearing before $\phi_T$ is returned to be off.

Next, $\phi_S$ is set to be on and, consecutively, $\phi_T$ is set to be on to couple the potentials of $C_{FD}$ and $C_S$ so that the pre-saturated charges $Q_B$ in $C_{FD}$ and the supersaturated charges $Q_A$ in $C_S$ are mixed as shown in FIG. 5-3.

Herein, $\phi_T$ is returned to be off at time $T_4$ and a signal of a sum of the pre-saturated charge signal $S_1$ and the supersaturated charge signal $S_2$ is read out from a value of the pre-saturated charges $Q_B$ and the supersaturated charges $Q_A$ that are spread in $C_{FD}+C_S$. However, here, due to the presence of $C_{FD}+C_S$ noise and the signal read out from the electric charges spread in $C_{FD}+C_S$, what is actually read out results in consequence of $S_1'+S_2'+N_2$ (with $S_1'$ and $S_2'$ resulting from values of $S_1$ and $S_2$ compacted and modulated at a capacitance ratio between $C_{FD}$ and $C_S$, respectively). FIG. 5-3 shows a status appearing before $\phi_T$ is returned to be off.

Next, under a condition where $\phi_T$ is set to be off and $\phi_S$ is set to be on, as described above, the photoelectric charges generated in this field is entirely discharged and the resetting is executed (FIG. 5-4) for a shift to a subsequent field.

Now, description is made of a circuit structure of an overall CMOS image sensor including an integrated array of pixels each of which has the structure described above.

Figure 6:
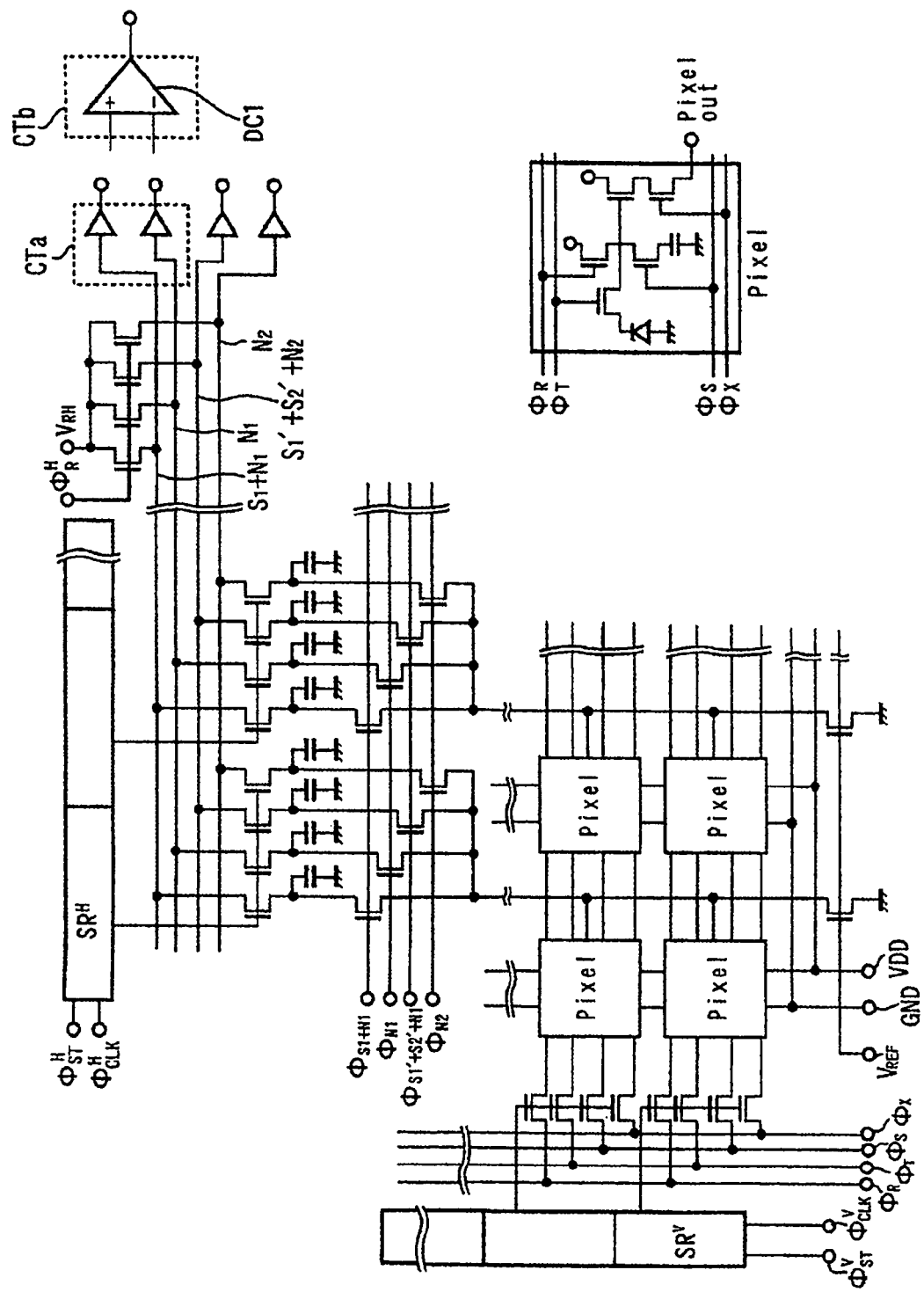
FIG. 6 is an equivalent circuit diagram showing an overall circuit structure of the CMOS image sensor of the first embodiment according to the present invention.

FIG. 6 is an equivalent circuit diagram showing an overall circuit structure of the CMOS image sensor of the present embodiment.

A plurality (with four pieces typically shown in the drawing figure) of pixels is arranged in an array and the respective pixels (Pixel) are connected to the drivelines ($\phi_T$, $\phi_S$, $\phi_R$, $\phi_X$) controlled by a line shift register $SR^V$, a power supply VDD and ground GND.

The respective pixels are controlled by the row shift register $SR^N$ and the drivelines ($\phi_{S1+N1}$, $\phi_{N1}$, $\phi_{S1'+S2'+N2}$, $\phi_{N2}$) to provide outputs on the respective output lines at respective timings in four values including the pre-saturated charge signal ($S_1$)+$C_{FD}$ noise ($N_1$), $C_{FD}$ noise ($N_1$), a modulated pre-saturated charge signal ($S_1'$)+a modulated supersaturated charge signal ($S_2'$)+$C_{FD}+C_S$ noise ($N_2$) and $C_{FD}+C_S$ noise ($N_2$).

Herein, since respective output terminals $CT_a$, on which the pre-saturated charge signal ($S_1$)+$C_{FD}$ noise ($N_1$) and $C_{FD}$ noise ($N_1$) are present, serve to extract a difference between these factors as described below, a CMOS image sensor chip may be formed with a circuit $CT_b$ including a difference amplifier DC1.

Figure 7:
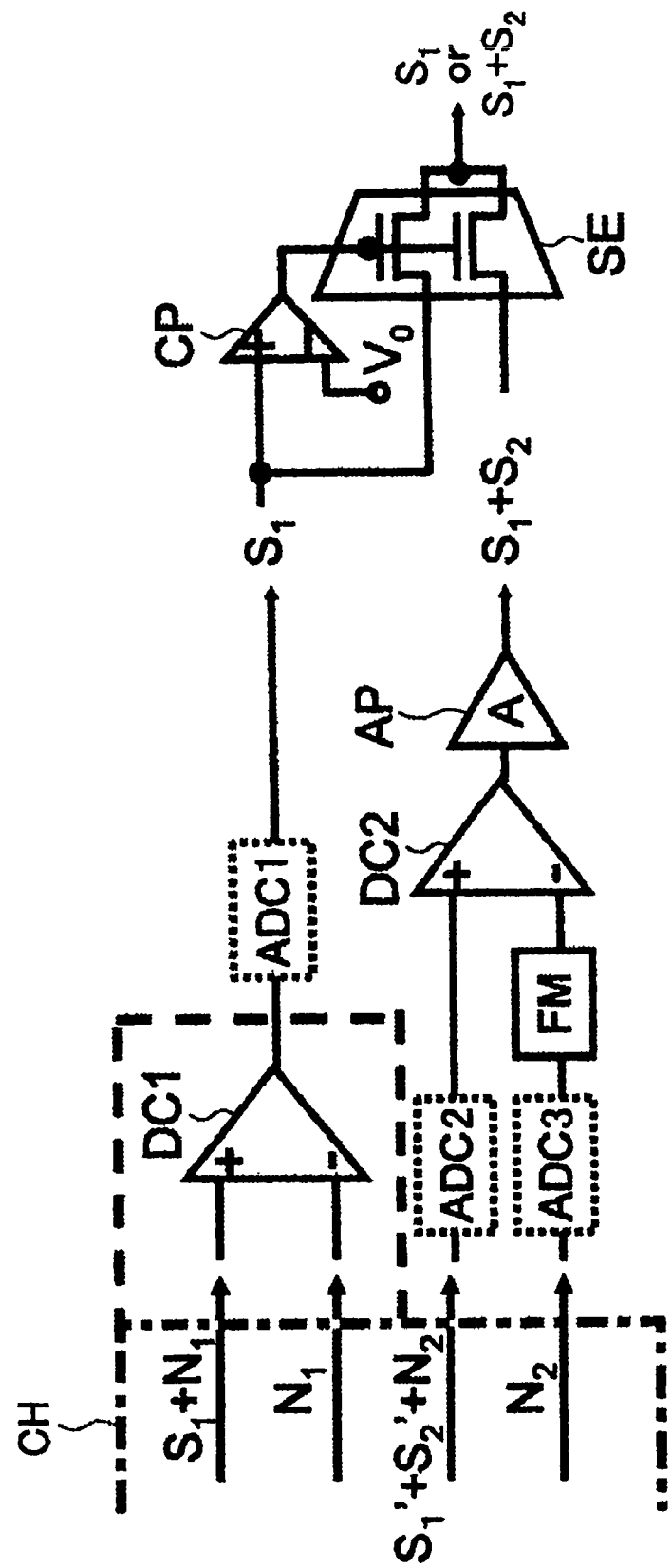
FIG. 7 is a circuit diagram for executing the processing of four signals including a pre-saturated charge signal+$C_{FD}$ noise, $C_{FD}$ noise, a modulated supersaturated charge signal+$C_{FD}$+$C_S$ noise, and $C_{FD}$+$C_S$ noise.

FIG. 7 shows a circuit for processing the four signals including the pre-saturated charge signal ($S_1$)+$C_{FD}$ noise ($N_1$), $C_{FD}$ noise ($N_1$), the modulated pre-saturated charge signal ($S_1'$)+the modulated supersaturated charge signal ($S_2'$)+$C_{FD}+C_S$ noise ($N_2$) and $C_{FD}+C_S$ noise ($N_2$) which are output as previously mentioned.

Among the outputs described above, the pre-saturated charge signal ($S_1$)+$C_{FD}$ noise ($N_1$) and $C_{FD}$ noise ($N_1$) are input to the difference amplifier DC1 to extract a difference between these components for canceling $C_{FD}$ noise ($N_1$) thereby obtaining the pre-saturated charge signal ($S_1$). The pre-saturated charge signal ($S_1$) may be digitized using an A/D converter ADC1 depending on needs or an analog signal may be kept intact without providing ADC1.

In the meantime, the modulated pre-saturated charge signal $(S_1')$+the modulated supersaturated charge signal $(S_2')$+$C_{FD}$+$C_S$ noise $(N_2)$ is applied to a difference amplifier DC2 to extract a difference among these components for canceling $C_{FD}$+$C_S$ noise $(N_2)$. Further, an amplifier AP executes demodulation with a capacitance ratio between $C_{FD}$ and $C_S$ for adjustment to the same gain as that of the pre-saturated charge signal $(S_1)$ to thereby obtain a sum $(S_1+S_2)$ of the pre-saturated charge signal and the supersaturated charge signal. The signal $S_1'+S_2'+N_2$ and the signal $N_2$ may be digitized by A/D converters ADC2, ADC3, provided depending on needs, before these signals are input to the differential amplifier DC2 or an analog signal may be input intact to the difference amplifier DC2 without providing ADC2, ADC3.

Herein, as represented in the timing charts shown in FIGS. 3-1 to 3-3, since $C_{FD}$+$C_S$ noise $(N_2)$ can be obtained at time relatively earlier than the other signal, this signal is stored in a frame memory FM serving as a storage means once before the other signal is obtained and read out from the frame memory FM at timing when the other signal is obtained to execute operations in a manner as described below.

The demodulation of the modulated pre-saturated charge signal $(S_1')$+the modulated supersaturated charge signal $(S_2')$, mentioned above, is described below.

$S_1'$, $S_2'$, $\alpha$ (an electric charge distribution ratio of $C_{FD}$ relative to $C_{FD}$+$C_S$) and $\beta$ (an electric charge distribution ratio of $C_S$ relative to $C_{FD}$+$C_S$) are expressed by equations indicated below.

$$S_1' = S_1 \times \alpha \quad (1)$$

$$S_2' = S_2 \times \alpha \times \beta \quad (2)$$

$$\alpha = C_{FD}/(C_{FD}+C_S) \quad (3)$$

$$\beta = C_S/(C_{FD}+C_S) \quad (4)$$

Accordingly, obtaining $\alpha$ and $\beta$ based on a value of $C_{FD}$ and $C_S$ using the above equations (3) and (4) and substituting these components in the above equations (1) and (2) performs the demodulation to $S_1+S_2$ for adjustment to the same gain as that of $S_1$ that is separately extracted.

Then, as shown in FIG. 7, either one of $S_1$ and $S_1+S_2$, obtained as described above, is selected and treated as a final output.

In such selection, first, $S_1$ is input to a comparator CP for comparison with a preset reference voltage $V_0$. In the meanwhile, $S_1$ and $S_1+S_2$ are input to a selector SE and either one of $S_1$ and $S_1+S_2$ are selected to be output depending on an output of the comparator CP described above. The reference voltage $V_0$ is selected to have a voltage potential, appearing prior to the saturation depending on a capacitance of the photodiode PD, which lies at a level of, for instance, approximately 0.3V.

Specifically, if subtracting $V_0$ from $S_1$ results in negative consequence, that is, if $S_1$ is less than $V_0$, then, judgment is made that no saturation takes place in the photodiode PD and $S_1$ is output.

In contrast if subtracting $V_0$ from $S_1$ results in positive consequence, that is, if $S_1$ is greater than $V_0$, then, judgment is made that saturation takes place in the photodiode PD and $S_1+S_2$ is output.

For instance, a circuitry involving such outputs is formed on a CMOS image sensor chip and a circuitry, for the rest of component parts subsequent to the difference amplifier DC1 and the frame memory FM, may be realized as an external part. Also, the difference amplifier DC1 may be formed on the CMOS image sensor chip in a manner as mentioned above.

Further, for the circuitry of the rest of the component parts subsequent to the difference amplifier DC1 and the frame memory FM, due to the presence of an increased volume of analog data to be handled, analog data may be preferably subjected to A/D conversion to perform digitizing operations of analog data, appearing subsequent to the difference amplifier DC1 and the frame memory FM, before they are input to the difference amplifier DC1 and the frame memory FM. In this case, analog data may be preferable to be preliminarily amplified by an amplifier, not shown, in compliance with an input range of an A/D converter to be used.

As mentioned above, the CMOS image sensor of the present embodiment has a consequence of obtaining two signals including the pre-saturated charge signal $(S_1)$ and the sum $(S_1+S_2)$ of the pre-saturated charge signal and the supersaturated charge signal for each pixel and for each field. In actual practice, making judgment whether the photodiode $(C_{PD})$ is saturated or nearly close to such a status results in the selection of either $S_1$ or $S_1+S_2$.

Figures 1, 8:
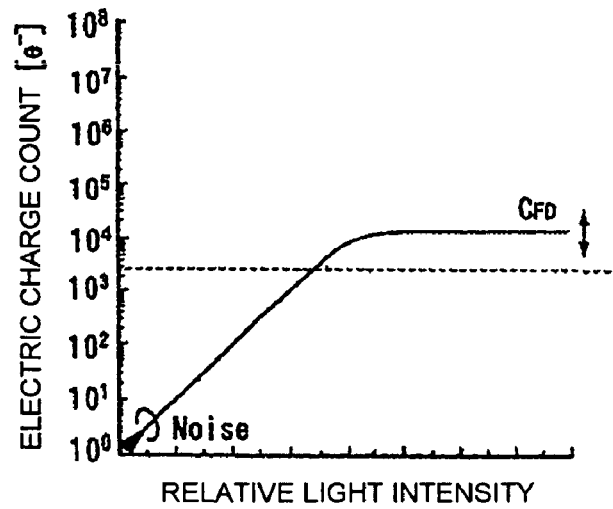
Figures 2, 8:
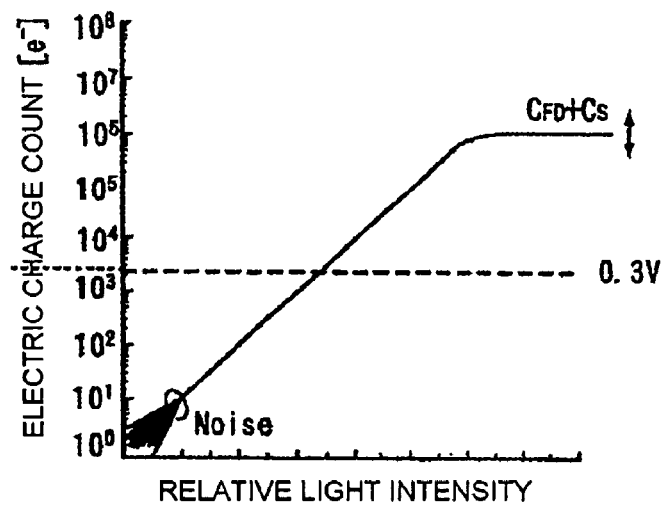
Figures 3, 8:
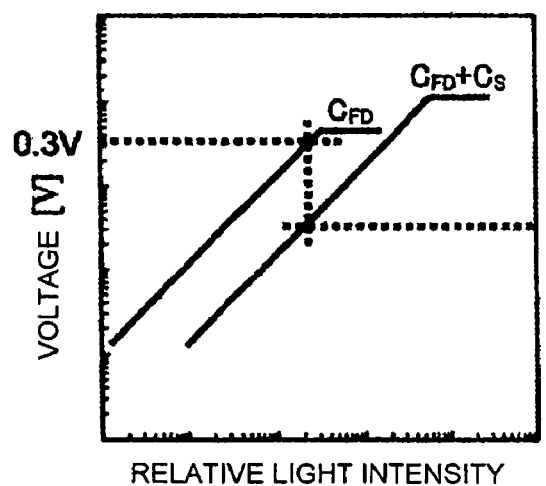

FIG. 8-1 is a view plotting an electric charge count, resulting from capacitance CFD in a manner described above, in terms of relative light intensity and corresponds to the signal $S_1$. In the meanwhile, FIG. 8-2 is a view plotting an electric charge count, resulting from capacitance $C_{FD}$+$C_S$, in terms of relative light intensity and corresponds to the signal $S_1+S_2$.

For instance, if the voltage potential remains in a level of low illuminance less than the reference voltage $V_0$ (of, for instance, 0.3V), the signal $S_1$, shown in FIG. 8-1, is used and the signal $S_1+S_2$, shown in FIG. 8-2, is used in high illuminance.

When this takes place, although noise "Noise" appears in low illuminance regions in both of these graphs, the signal $S_1$ is less than the signal $S_1+S_2$ and the signal $S_1$ is adopted in low illuminance with no issue arising for a noise level to increase.

Further, a saturated voltage potential of $C_{FD}$ fluctuates for each pixel with the fluctuations ranging in the order of approximately $1 \times 10^4$ to $2 \times 10^4$ in terms of an electric charge count. Before such fluctuations fall in such a range, the signal is switched to the signal $S_1+S_2$ employing capacitance $C_{FD}$+$C_S$ resulting in advantageous effect with no adverse affect from the fluctuations in the saturated voltage potential of $C_{FD}$.

Further, even if variation takes place in the reference voltage $V_0$, an electric charge count of $C_{FD}$ and an electric charge count of $C_{FD}$+$C_S$ match each other throughout vicinities of the reference voltage potential with no issue arising in using either the signal $S_1$ or the signal $S_1+S_2$ in a vicinity of the reference voltage potential.

FIG. 8-3 is a view showing an overlapped status with the graph (designated as $C_{FD}$) shown in FIG. 8-1, wherein the voltage of the floating region resulting from the use of capacitance $C_{FD}$ is plotted in terms of relative light intensity, and the graph (designated as $C_{FD}$+$C_S$) shown in FIG. 8-2 wherein the voltage of the floating region resulting from the use of capacitance $C_{FD}$+$C_S$ is plotted in terms of relative light intensity. This view corresponds to a consequence resulting from converting the electric charge count, shown in the graphs of FIGS. 8-1 and 8-2, to a voltage.

However, since the use of capacitance $C_{FD}$+$C_S$ results in an increase in a capacitance value by a value of $C_S$ even when obtaining an identical electric charge count upon irradiating identical light intensity, a drop occurs in a converted voltage by that extent.

For instance, during low illuminance until the voltage exceeds the reference voltage of 0.3V, use is made of the signal $S_1$ of the graph represented by $C_{FD}$ in a manner set forth above and during high illuminance wherein the voltage exceeds the value of 0.3V, the signal is switched to the signal $S_1+S_2$ of the graph indicated by $C_{FD}+C_S$ for use.

With the structure of the CMOS image sensor of the present embodiment and the above-described operating method, of the two signals including the pre-saturated charge signal ($S_1$) and the sum ($S_1+S_2$) of the pre-saturated charge signal and the supersaturated charge signal both of which result from canceling noise, respectively, the pre-saturated charge signal ($S_1$) is adopted in the absence of the saturation of the photodiode PD ($C_{PD}$) and the sum ($S_1+S_2$) of the pre-saturated charge signal and the supersaturated charge signal in the presence of the saturation.

Thus, the pre-saturated charge signal ($S_1$) resulting from canceling noise enables high sensitivity and a high S/N ratio to be maintained during low illuminance with no saturation of the photodiode PD. Additionally, during high illuminance with the saturation of the photodiode PD, the photoelectric charges overflowing from the photodiode, are accumulated and taken in the storage capacitor element and using a signal (the sum ($S_1+S_2$) of the pre-saturated charge signal and the supersaturated charge signal, resulting from canceling noise in the same manner as that previously described, enables the high S/N ratio to be maintained and a wide dynamic range to be realized to an effect on high illuminance.

The CMOS image sensor of the present embodiment increases sensitivity for high illuminance to achieve a wide dynamic range without causing a drop in sensitivity for low illuminance, as described above, and no power supply voltage is increased from a range in normal use with the resultant capability of matching the miniaturization of a future image sensor.

Addition of an element is suppressed into a minimal with no occurrence of enlargement of the pixel in size.

Further, since no accumulation time is split for high and low illuminance as experienced in the image sensor of the related art for realizing a wide dynamic range, that is, the accumulation is performed during the same accumulation time without striding over frames, the image sensor of the present embodiment can comply with the shooting of moving images.

Furthermore, with the image sensor of the present embodiment, for a leakage current (FD-leakage) of the floating region FD, a minimal signal of $C_{FD}+C_S$ takes supersaturated charges+saturated charges resulting from the photodiode PD. This results in a consequence of handling the greater amount of electric charges than that of the FD-leakage with an advantageous effect with less adverse affect from the FD-leakage.

Second Embodiment

The present embodiment is a modified form of the circuit structure of pixels of the CMOS image sensor of the first embodiment.

Figures 1, 9:
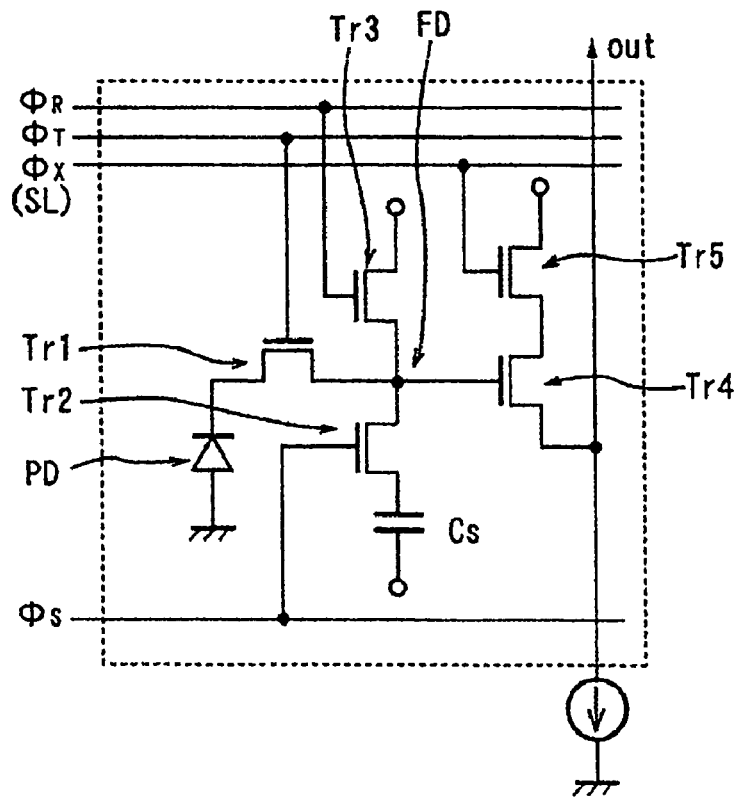
Figures 2, 9:
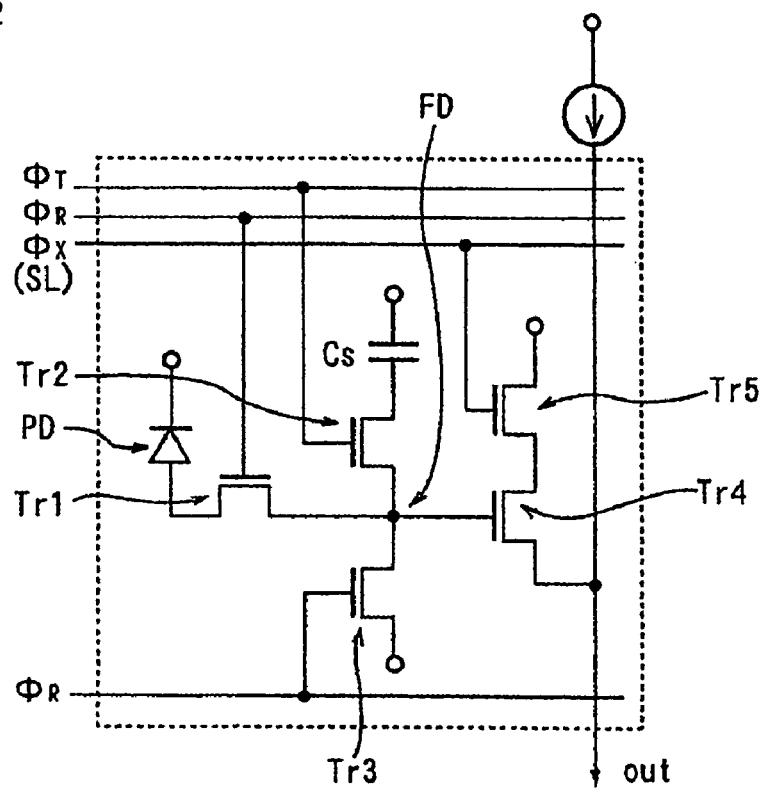

FIG. 9-1 is an equivalent circuit diagram of an example of one pixel in the CMOS image sensor of the present embodiment. This embodiment is substantially Identical to the equivalent circuit diagram of FIG. 1 and differs from the same in connection between the amplifier transistor Tr4 and the selection transistor Tr5 in a form in which the selection transistor Tr5 is placed in an upper stage area of the amplifier transistor Tr4 and the output of the amplifier transistor Tr4 is connected to the output line "out".

Such a connection makes it possible to raise a gain of an amplifier of the amplifier transistor Tr4.

Further, FIG. 9-2 is an equivalent circuit diagram of one pixel in the other example of the CMOS image sensor of the present embodiment. This embodiment is substantially identical to the equivalent circuit diagram of FIG. 1 but takes the form of a structure in which the n-channel MOS transistors, forming the five transistors including the transfer transistor Tr1, the storage transistor Tr2, the reset transistor Tr3, the amplifier transistor Tr4 and the selection transistor Tr5, are replaced by p-channel MOS transistors.

Such replacement enables the realization of an image sensor of a complete charge-transfer type for holes and is suitable when, for instance, using a p-type as a silicon substrate.

Other structure can be configured in the same structure as that of the CMOS image sensor of the first embodiment.

Like the first embodiment, the CMOS image sensor of the present embodiment is able to maintain high sensitivity and a high S/N ratio using the pre-saturated charge signal resulting from canceling noise during the shooting of images in low illuminance with no saturation in the photodiode. Further, during the shooting of the images in high illuminance with saturation of the photodiode, the photoelectric charges overflowing from the photodiode, are accumulated and taken in the storage capacitor element to allow a signal (equivalent to the sum of the pre-saturated charge signal and the supersaturated charge signal) resulting from canceling noise in the same manner as that described above to maintain a high S/N ratio for realizing a wide dynamic range in high illuminance.

Third Embodiment

A solid-state imaging device of the present embodiment takes the form of a CCD image sensor.

Figures 1, 10:
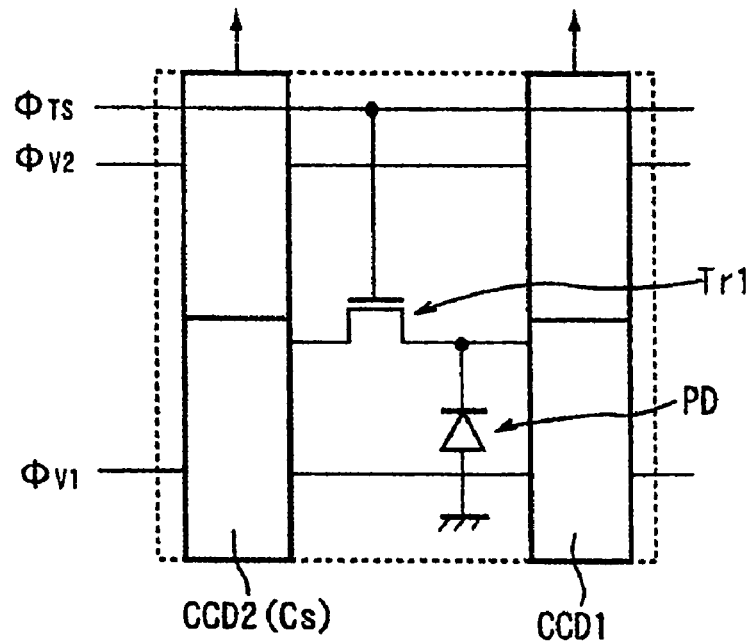
Figures 2, 10:
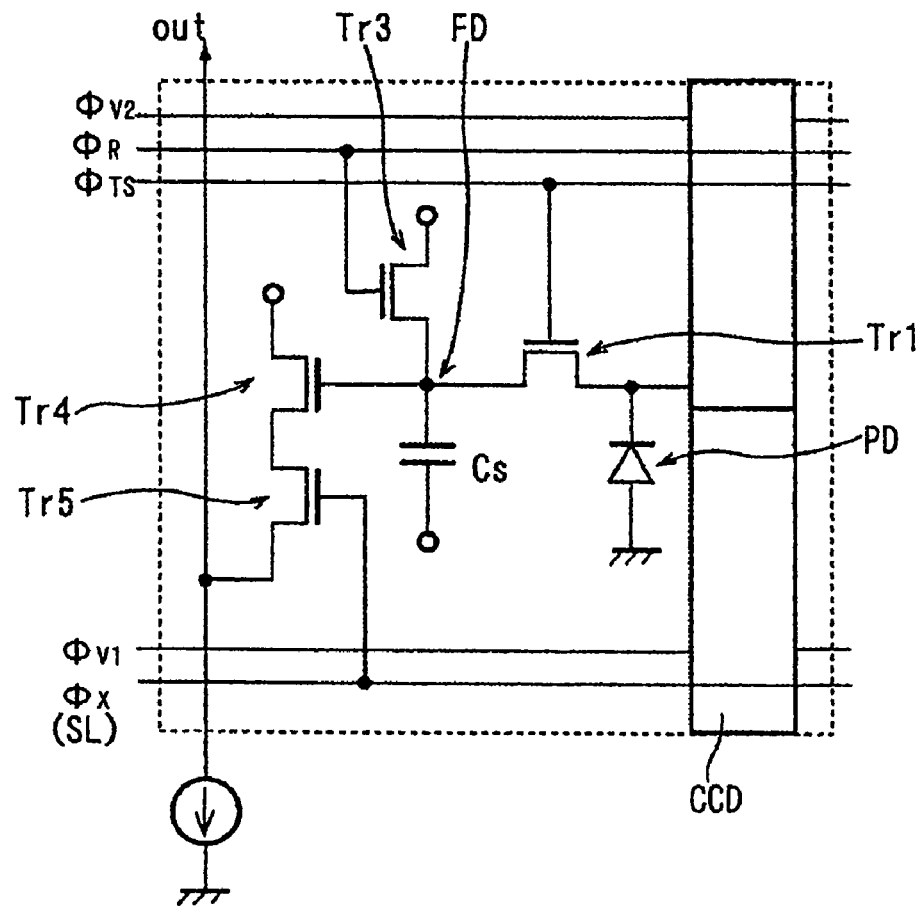

FIG. 10-1 is an equivalent circuit diagram of an example of one pixel in the CCD image sensor of the present embodiment.

Specifically, first and second charge-couple transfer paths CCD1 and CCD2 are placed in vertically extending directions and driven in two phases with $\phi_{V1}$ and $\phi_{V2}$. A photodiode PD is directly connected to the first charge-couple transfer path CCD1 and connected to the second charge-couple transfer path CCD2 via a transfer transistor Tr1.

Herein, the second charge-couple transfer path CCD2 functions as a storage capacitor element C that accumulates photoelectric charges, overflowing from the photodiode, when the photodiode PD is saturated.

In the CCD image sensor of the structure previously mentioned, the first charge-couple transfer path CCD1 transfers pre-saturated charges in low illuminance for readout upon driving CCD. In the meanwhile, the storage capacitor element $C_S$ accumulates supersaturated charges in high illuminance and driving the second charge-couple transfer path CCD2, formed of the storage capacitor element $C_S$, results in a consequence of executing the readout intact.

Reading out the pre-saturated charges in low illuminance and the supersaturated charges in high illuminance, resulting from the storage capacitor element accumulating the photoelectric charges overflowing from the photodiode, realizes a wide dynamic range in high illuminance.

FIG. 10-2 is an equivalent circuit diagram of the other example of one pixel in the CCD image sensor of the present embodiment.

This example corresponds to the form of a structure wherein with the CCD image sensor of the first embodiment, the first charge-couple transfer path CCD1 transfers the pre-saturated charges in low illuminance for readout upon driving CCD. The supersaturated charges in high illuminance is read out in the same step as that of reading out the signal in the CMOS image sensor of the first embodiment.

In this case, since the step of mixing the pre-saturated charges and the supersaturated charges is unnecessary, the storage transistor Tr2 is not required to be connected between the floating region FD and the storage capacitor element $C_S$.

Reading out the pre-saturated charges in low illuminance and the supersaturated charges in high illuminance, resulting from accumulating the photoelectric charges overflowing from the photodiode, respectively, enables the realization of a wide dynamic range in high illuminance.

Fourth Embodiment

The present embodiment is a modified form of the circuit structure of the pixel in the CMOS image sensor of the first embodiment.

Figures 1, 11:
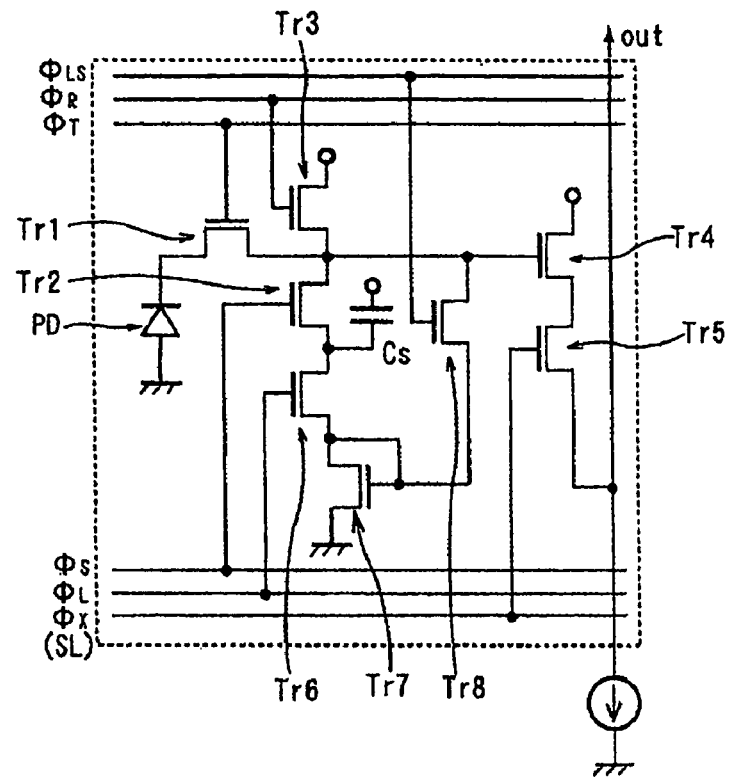
Figures 2, 11:
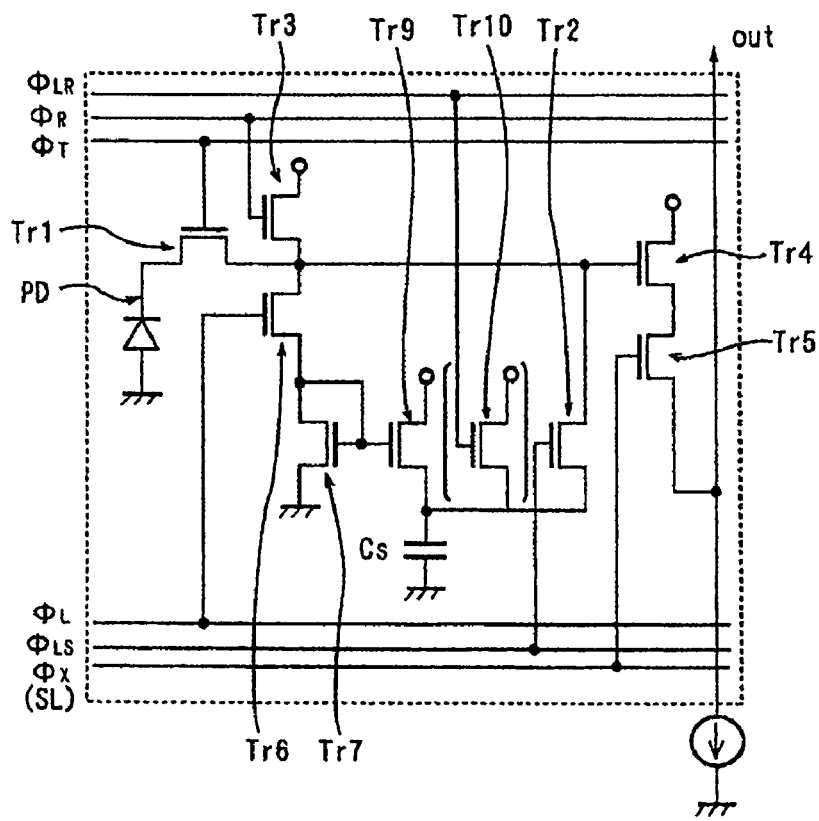

FIG. 11-1 is an equivalent circuit diagram of the example of one pixel of the CMOS image sensor of the first embodiment. FIG. 11-1 is substantially similar to the equivalent circuit diagram of FIG. 1 and directed to a form in which transistors Tr6 to Tr8 are added to form a logarithmic converter circuit that logarithmically converts and reads out the photoelectric charges accumulated in the storage capacitor element $C_S$.

Providing an output upon executing logarithmic conversion enables the image sensor to comply with the shooting of images in high illuminance to achieve a wide dynamic range. Especially, during near-saturation of the photodiode, permitting the pre-saturated charges and the supersaturated charges to mix with each other provides capability of improving an S/N ratio.

FIG. 11-2 is an equivalent circuit diagram for the other example of one pixel in the CMOS image sensor of the present embodiment.

This circuit takes the form of a structure that additionally includes transistors Tr6, Tr7, Tr9 and Tr10 forming a logarithmic converter circuit that logarithmically converts photoelectric charges overflowing from the photodiode for accumulation in the storage capacitor element $C_S$.

Providing an output upon executing logarithmic conversion in such a way enables the image sensor to comply with the shooting of images in high illuminance to achieve a wide dynamic range. Especially, logarithmically converting the photoelectric charges for accumulation in the storage capacitor element $C_S$ enables the contribution to enhancement of a wide dynamic range even in the presence of a small storage capacitor element $C_S$.

Fifth Embodiment

Figure 12:
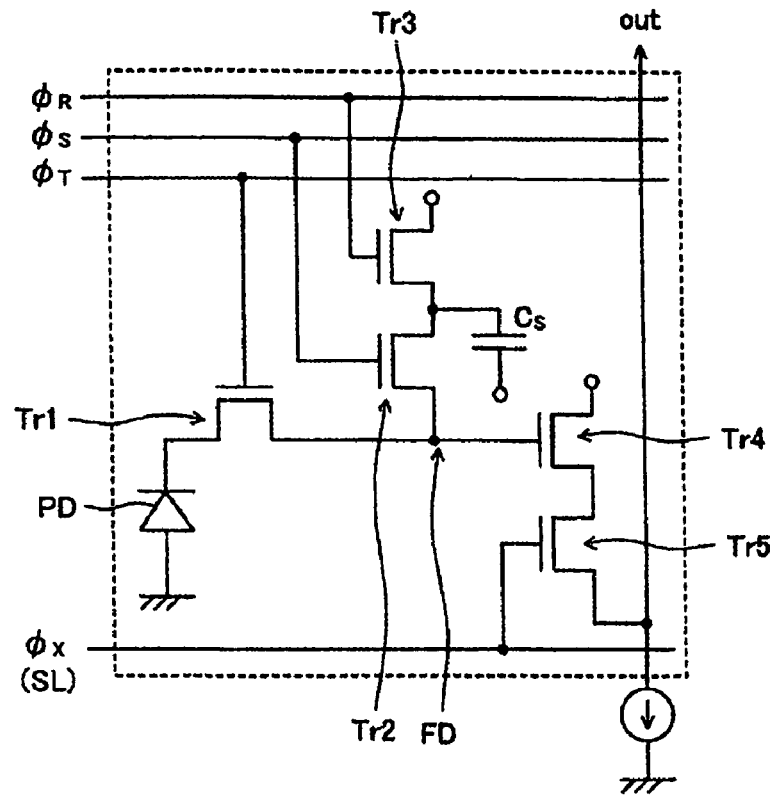
FIG. 12 is an equivalent circuit diagram for one pixel of a CMOS image sensor of a fifth embodiment according to the present invention.

A solid-state imaging device of the present embodiment takes the form of the same CMOS image sensor as that of the first embodiment and FIG. 12 is an equivalent circuit diagram of one pixel.

Each pixel comprises the photodiode for receiving light and generating the photoelectric charges, the transfer transistor Tr1 for transferring the photoelectric charges resulting from the photodiode, the floating region FD to which the photoelectric charges are transferred via the transfer transistor Tr1, the storage capacitor element $C_S$ for accumulating the photoelectric charges overflowing from the photodiode during accumulating operation, the storage transistor Tr2 for coupling or splitting the potentials of the floating region FD and the storage capacitor element $C_S$, the reset transistor Tr3 formed on the floating region FD and connected thereto through the storage transistor Tr2 for discharging the photoelectric charges of the storage capacitor element $C_S$ and the floating region FD, the amplifier transistor Tr4 for amplifying the photoelectric charges in the floating region FD and converting to a voltage signal, and the selection transistor Tr5 coupled to the amplifier transistor for selecting a pixel, forming the so-called five-transistor type CMOS image sensor. For instance, any of the above five transistors includes an n-channel MOS transistor.

The CMOS image sensor of the present embodiment includes the integrated array of a plurality of pixels with the structure mentioned above. With each pixel, the transfer transistor Tr1, the storage transistor Tr2 and the reset transistor Tr3 have gate electrodes to which the drivelines $\phi_T$, $\phi_S$, $\phi_R$ are connected and the selection transistor Tr5 has a gate electrode to which a pixel selection line SL ($\phi_X$) driven by the line shift register is connected. Additionally, the selection transistor Tr5 has an output including a source and drain to which an output line "out" is connected for providing an output under control of the row shift register.

The selection transistor Tr5 and the driveline $\phi_X$ may be configured to fix a voltage of the floating region FD to a suitable value so as to enable the execution of selecting or non-selecting the pixel and, thus, may be omitted.

Figure 13:
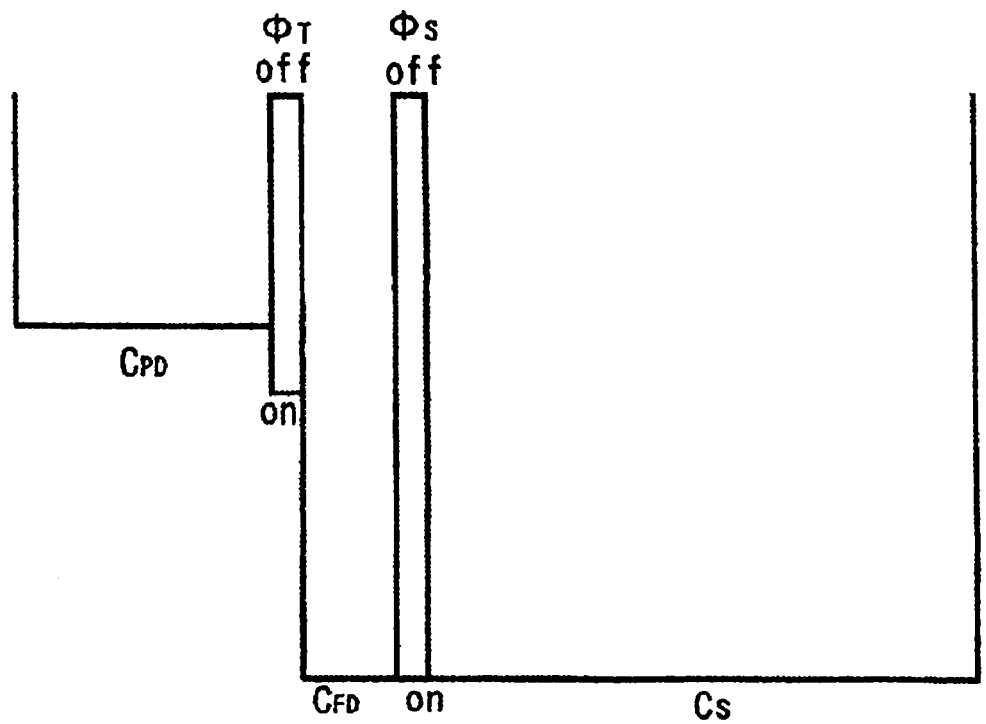
FIG. 13 is a typical potential diagram of an essential part of the CMOS image sensor of the fifth embodiment according to the present invention.

FIG. 13 is a typical potential diagram corresponding to the photodiode PD, the transfer transistor Tr1, the floating region FD, the storage transistor Tr2 and the storage capacitor element $C_S$.

The photodiode PD forms a relatively shallow potential $C_{PD}$ and the floating region FD and the storage capacitor element $C_S$ forms relatively deep capacitors ($C_{FD}$, $C_S$).

Here, the transfer transistor Tr1 and the storage transistor Tr2 may take two levels depending on on/off states of the transistors.

A method of driving the CMOS image sensor of the present embodiment is described with reference to the equivalent circuit diagram of FIG. 12 and the potential diagram of FIG. 13.

Figures 1, 14:
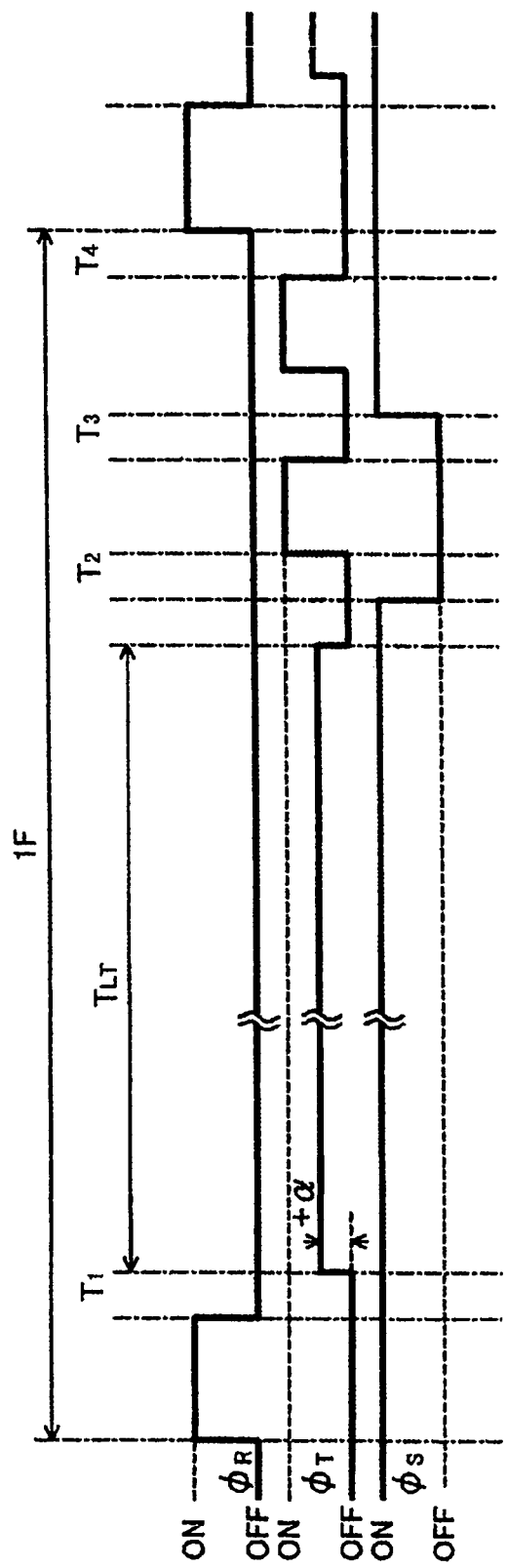
Figures 2, 14:
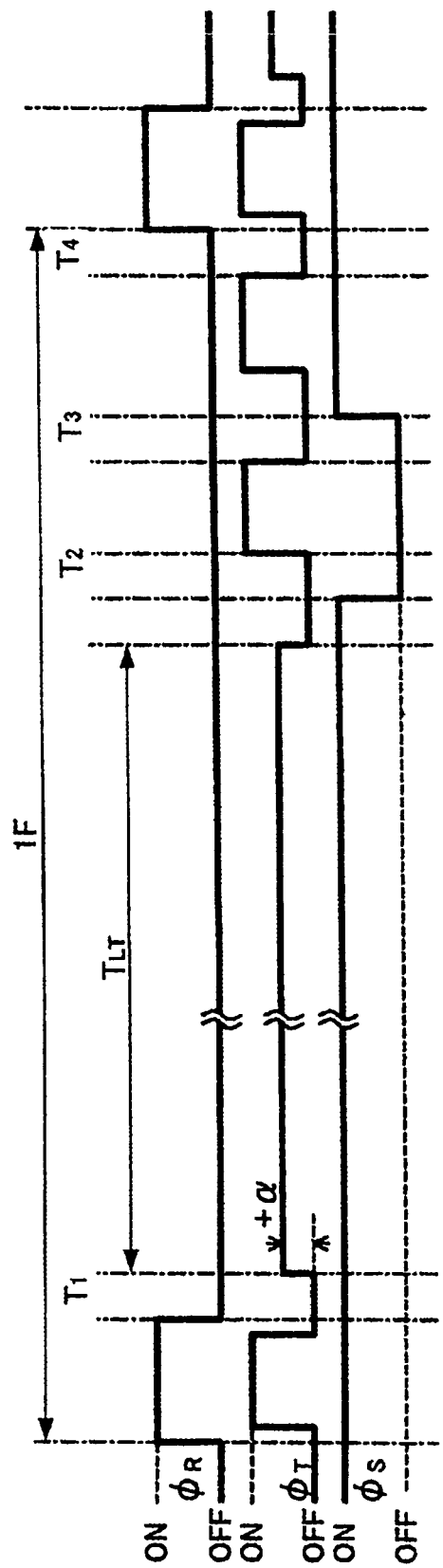

FIG. 14-1 is a timing chart showing voltages applied to the drivelines ($\phi_T$, $\phi_S$, $\phi_R$) in on/off states with two levels while $\phi_T$ has a further additional level represented by ($+\alpha$).

The voltage applied to the driveline $\phi_T$ may take two levels in ON/OFF and may preferably take the form of three levels, like the present example, which enable the floating region FD and the storage capacitor element $C_S$ to efficiently capture and accumulate an electric charge overflowing from the photodiode PD.

Further, FIG. 15-1 to FIG. 15-3 and FIG. 16-1 to FIG. 16-3 correspond to potential diagrams at respective timings of the timing charts.

First, at a start of one field (1F), $\phi_T$ is set to be off and $\phi_S$ is set to be on and, under such a status, $\phi_R$ is set to be on thereby completely discharging photoelectric charges generated in a preceding field for resetting, upon which $\phi_R$ is set to be off at time $T_1$.

Figures 1, 15:
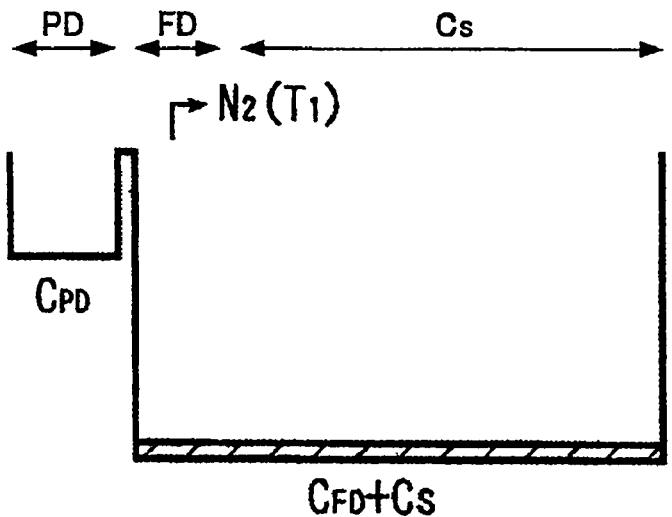
Figures 2, 15:
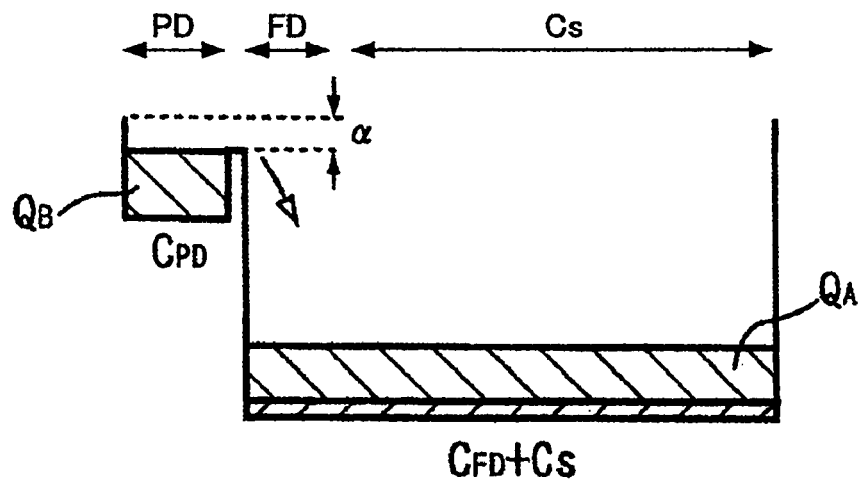
Figures 3, 15:
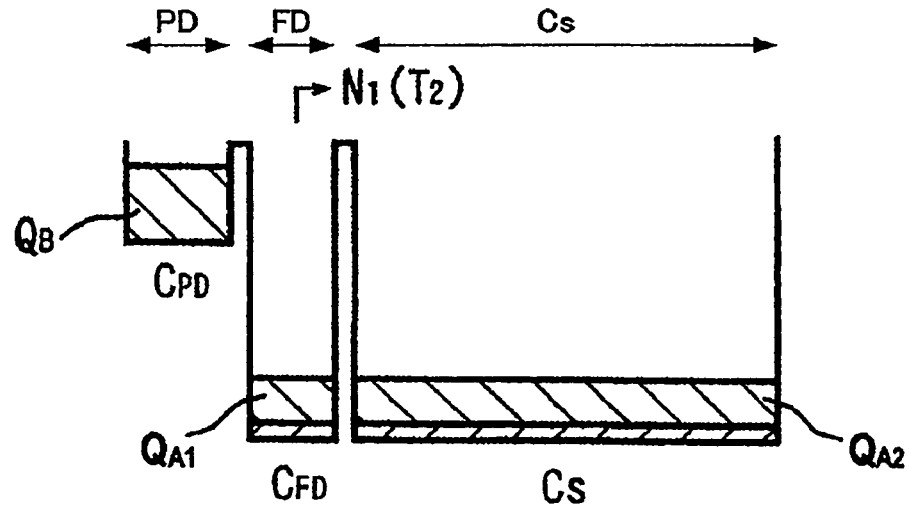

When this takes place, as shown in FIG. 15-1, $\phi_S$ is set to be on with $C_{FD}$ and $C_S$ remaining under a coupled condition and, immediately after resetting operation, so-called kTC noise, caused by the resetting operation, occurs in $C_{FD}$ and $C_S$. Here, a signal of $C_{FD}+C_S$ at a reset level is read out as noise $N_2$.

Then, during an accumulation time period $T_{LT}$, photoelectric charges generated by the photodiode PD is accumulated. When this takes place, a barrier between $C_{PD}$ and $C_{FD}$ is set to be slightly low to allow $\phi_T$ take a level ($+\alpha$).

As the electric charges begin to be accumulated, the photoelectric charges are initially accumulated in $C_{PD}$. If the amount of the photoelectric charges becomes greater than a value causing saturation of $C_{PD}$, the photoelectric charges get over the barrier slightly decreased in terms of the level (+α) of $\phi_T$ and overflow from $C_{PD}$ for selectively accumulation in $C_{FD}$ and $C_S$ of this pixel.

In this manner, if the amount of photoelectric charges is less than the value that saturates the photodiode PD, the photoelectric charges are accumulated only in $C_{PD}$ and if the amount of photoelectric charges becomes greater than the value that saturates the photodiode PD, the photoelectric charges are also accumulated in, in addition to $C_{PD}$, $C_{FD}$ and $C_S$.

FIG. 15-2 shows a status where $C_{PD}$ is saturated with pre-saturated charges $Q_B$ being accumulated in $C_{PD}$ and supersaturated charges $Q_A$ being accumulated in $C_{FD}$ and $C_S$.

Subsequently, $\phi_T$ is returned to be off from the level (+α) at the end of the accumulation interval $T_{LT}$. Further, at time $T_2$, $\phi_S$ is set to be off to split the potential of $C_{PD}$ and $C_S$ as shown in FIG. 15-3. When this takes place, the supersaturated charges $Q_A$ are split into $Q_{A1}$ and $Q_{A2}$ depending on a capacitance ratio between $C_{FD}$ and $C_S$. Here, a signal level of $C_{FD}$, accumulating a partial component $Q_{A1}$ of the supersaturated charges, is read out as noise $N_1$.

Next, $\phi_T$ is set to be on and, as shown in FIG. 15-2, the pre-saturated charges $Q_B$ is transferred from $C_{PD}$ to $C_{FD}$ to be mixed with the partial component $Q_{A1}$ of the supersaturated charges originally accumulated in $C_{FD}$.

Here, since the potential of $C_{PD}$ is set to be shallower than that of $C_{FD}$ and the level of the transfer transistor is set to be deeper than that of $C_{PD}$, a complete electric charge transfer can be realized for entirely transferring the pre-saturated charges $Q_B$ from $C_{PD}$ to $C_{FD}$.

Figures 1, 16:
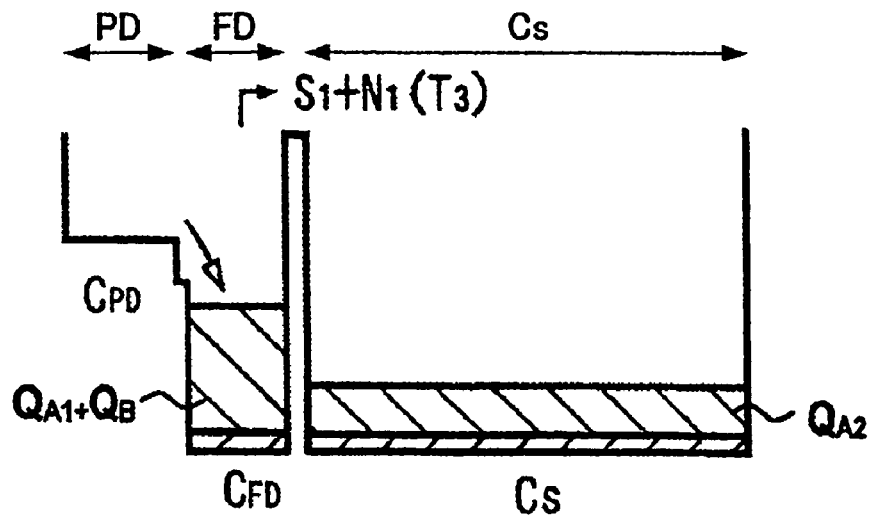
Figures 2, 16:
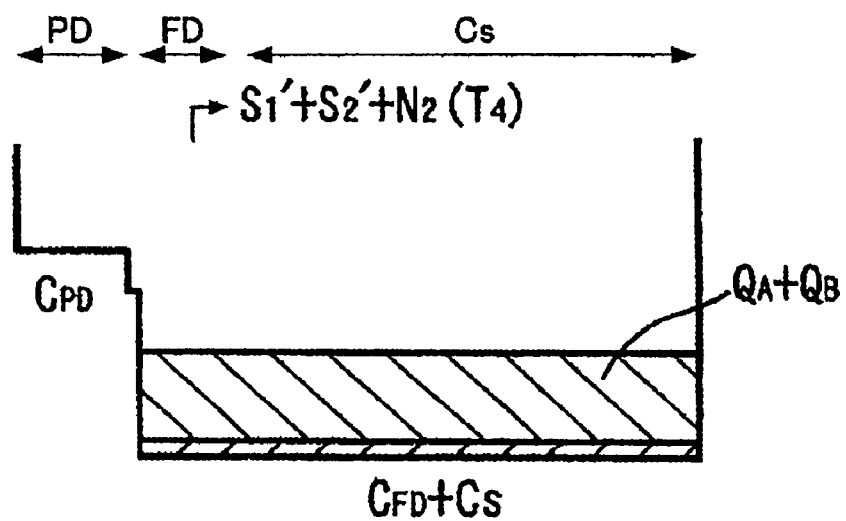
Figures 3, 16:
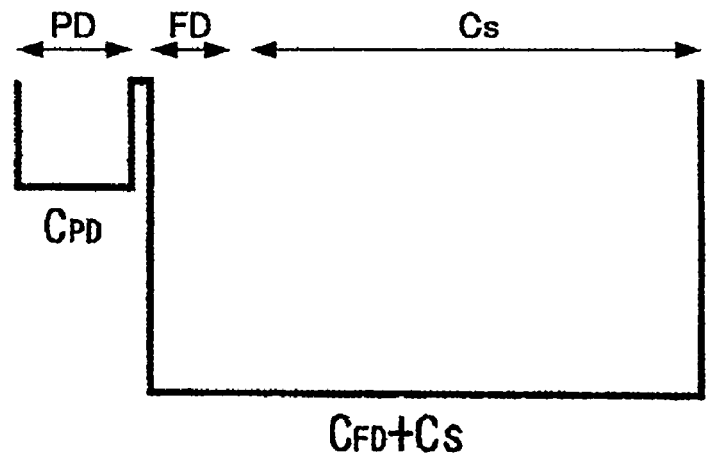

Then, $\phi_T$ is returned to be off at time $T_3$ for reading out the pre-saturated charge signal $S_1$ from the pre-saturated charges $Q_B$ transferred to $C_{FD}$. However, electric charges in a sum of the pre-saturated charges $Q_B$ and the portion $Q_{A1}$ of the supersaturated charges are present in $C_{FD}$ and what is actually read out includes $S_1+N_1$. FIG. 16-1 shows a status where $\phi_T$ is returned to be off.

Next, $\phi_S$ is set to be on and $\phi_T$ is consecutively set to be on causing the potentials of $C_{FD}$ and $C_S$ to be coupled to each other. This results in a consequence of an electric charge of a sum of the pre-saturated charges $Q_B$ in $C_{FD}$ and the partial component $Q_{A1}$ of the supersaturated charges being mixed with the partial component $Q_{A2}$ of the supersaturated charges in $C_S$ as shown in FIG. 16-2. The sum of the partial component $Q_{A1}$ of the supersaturated charges and the partial component $Q_{A2}$ of the supersaturated charges corresponds to the supersaturated charges $Q_A$ prior to the splitting. This result in a condition where the signal of the sum of the pre-saturated charges $Q_B$ and the supersaturated charges $Q_A$ is accumulated in a potential resulting from coupling $C_{FD}$ and $C_S$.

Here, $\phi_T$ is returned to be off at time $T_4$ for reading out a signal representing the sum of the pre-saturated charge signal $S_1$ and the supersaturated charge signal $S_2$ from the value resulting from the pre-saturated charges $Q_B$ and the saturated charges $Q_A$. However, here, since noise $C_{FD}+C_S$ is present and, also, the signal is read out from the electric charges expanded in $C_{FD}$ and $C_S$, the signal to be read out is represented as $S_1'+S_2'+N_2$ (with $S_1'$ and $S_2'$ taking values of $S_1$ and $S_2$ that are contracted in modulation depending on a capacitance ratio between $C_{FD}$ and $C_S$, respectively). FIG. 16-2 shows a status appearing before $\phi_T$ is returned to be off.

With the above, one field (1F) is completed and the operation shifts to a subsequent field wherein $\phi_R$ is set to be on under a status where $\phi_T$ is set to be off and $\phi_S$ is set to be on. This causes the photoelectric charges, generated in a preceding field, to be completely discharged for resetting.

Using four signals of $N_2$, $N_1$, $S_1+N_1$, $S_1'+S_2'+N_2$, obtained in such a manner discussed above, allows the pre-saturated charge signal ($S_1$) and a sum ($S_1+S_2$) of the pre-saturated charge signal and the supersaturated charge signal to be obtained in the same sequence as that of the first embodiment. Any of the signals is selected depending on whether the situation stands before the saturation or after the saturation.

While the above description has been made with reference to a case where noise $N_2$ is read out and accumulated in the frame memory once to allow noise $N_2$ to be utilized during an operation to generate an image signal, noise $N_2$ is smaller enough than that of the pre-saturated charges+the supersaturated charges during a supersaturated period and, therefore, noise $N_2$ of the current frame may be replaced in use by noise $N_2$ appearing in a subsequent frame.

Further, the field can be driven in accordance with the timing chart shown in FIG. 14-2. Specifically, this timing chart differs from the timing chart of FIG. 14-1 in respect of a time period provided for permitting $\phi_T$ to be set on during the resetting operation of each field. In this case, even the electric charge in $C_{PD}$ can be reliably reset.

In addition to the above, an overall circuit structure or the like takes the same structure as that of the first embodiment.

Figure 17:
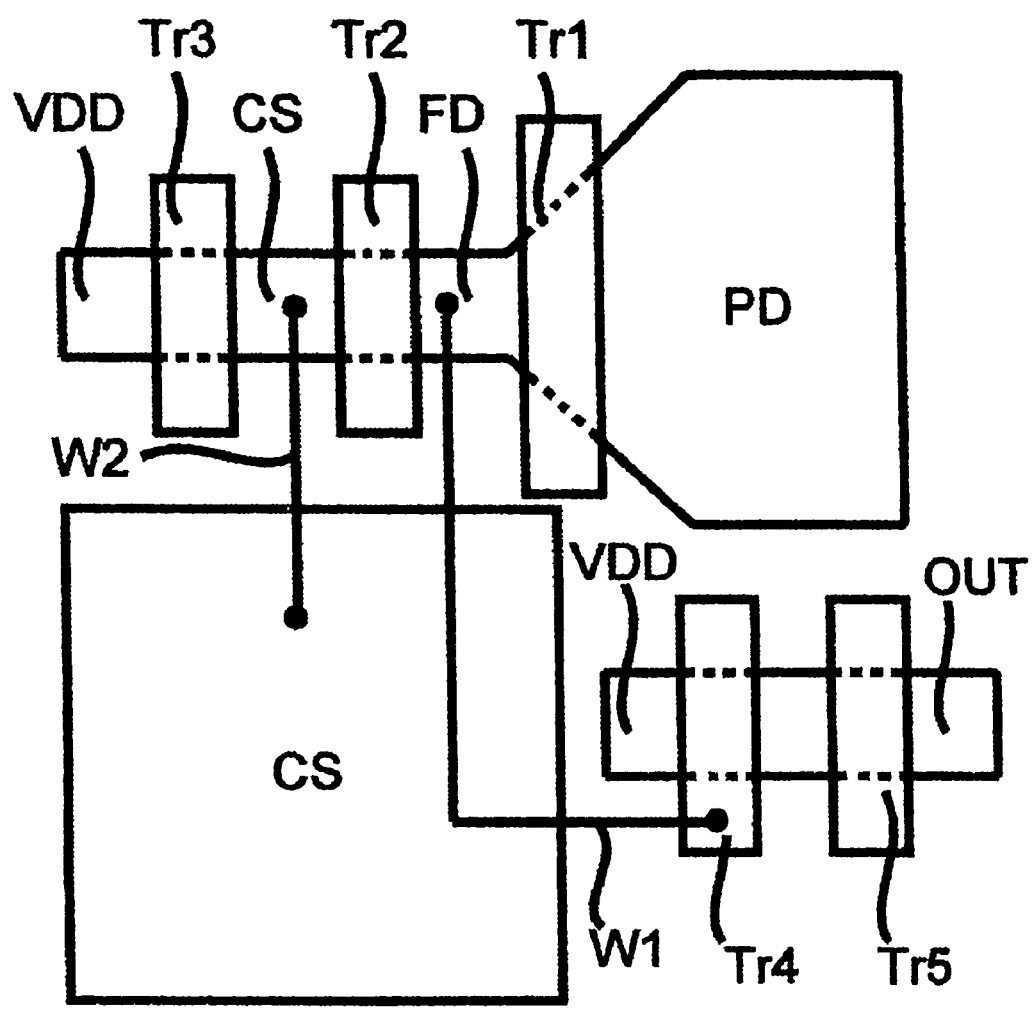
FIG. 17 is a view showing one example of a layout of approximately one pixel adopting a planar type storage capacitor element in the CMOS image sensor of the fifth embodiment according to the present invention.

FIG. 17 shows one example of a layout diagram of approximately one pixel in a case where the CMOS solid-state imaging device of the present embodiment adopts a planar type storage capacitor element.

The photodiode PD, the storage capacitor element $C_S$ and the five transistors Tr1 to Tr5 are placed in a layout, shown in the drawing figure, and in addition thereto, the floating region FD between the transistors Tr1 and Tr2 and the gate electrode of the transistor Tr4 are connected to each other through a lead wire W1. Further, a diffusion layer between the transistors Tr2 and Tr3 and the upper electrode of the storage capacitor element $C_S$ are connected to each other via a wiring W2. Thus, a circuitry can be realized corresponding to the equivalent circuit diagram of the present embodiment shown FIG. 13.

With such a layout, the transfer transistor Tr1 has a channel whose width is formed in a size to be wide in an area closer to the photodiode PD and narrow in an area closer to the floating region FD. Therefore, the electric charge, overflowing from the photodiode, can be caused to overflow to the floating region in an efficient manner. In the meantime, permitting the transfer transistor Tr1 to have the channel narrowed in the area closer to the floating region FD enables reduction in capacitance of the floating region FD with the resultant increase in a fluctuation width of a potential with respect to an electric charge accumulated in the floating region FD.

With the CMOS image sensor of the present embodiment, like the first embodiment, of the two signals including the pre-saturated charge signal ($S_1$) and the sum ($S_1+S_2$) of the pre-saturated charge signal and the supersaturated charge signal, the pre-saturated charge signal ($S_1$) is adopted in the absence of the saturation of the photodiode PD and the sum ($S_1+S_2$) of the pre-saturated charge signal and the supersaturated charge signal is adopted in the presence of the saturation.

In this manner, during the shooting of images in low illuminance wherein no saturation occurs in the photodiode PD, using the pre-saturated charge signal ($S_1$), obtained by canceling noise, enables the achievement of high sensitivity and a high S/N ratio. Further, during the shooting of images in high illuminance in which the photodiode PD is saturated, the photoelectric charges, overflowing from the photodiode, are accumulated and taken in the storage capacitor element and using a signal (the sum ($S_1+S_2$) of the pre-saturated charge signal and the supersaturated charge signal), obtained by canceling noise in the same manner as mentioned above, enables a high S/N ratio to be maintained and a wide dynamic range to be realized in high illuminance.

The CMOS image sensor of the present embodiment can increase sensitivity in high illuminance without causing a drop in sensitivity in low illuminance as described above for thereby achieving a wide dynamic range and, in addition, no power supply voltage is caused to exceed beyond a range normally in use with the resultant capability of complying with a need for a future image sensor to be miniaturized.

Addition of elements is suppressed to a minimal with no occurrence of an increase in a size of a pixel.

Further, since no accumulation time is divided for high illuminance and low illuminance as required in the related art image sensor for realizing a wide dynamic range, that is, since the photoelectric charges are accumulated in the same accumulation interval without striding the frames, the image sensor can comply with the shooting of moving images.

Furthermore, with the image sensor of the present embodiment, for a leakage current (FD-leakage) of the floating region FD, a minimal signal of $C_{FD}+C_S$ takes supersaturated charges+saturated charges from the photodiode PD. This results in a consequence of handling the greater amount of electric charges than that of the FD-leakage with an advantageous effect with less adverse affect from the FD-leakage.

The CMOS image sensor of the present embodiment is hard to be adversely affected from variations in saturation of PD.

Sixth Embodiment

The CMOS image sensor of the present embodiment takes the form of a CMOS sensor, based on the CMOS image sensors of the first to fifth embodiments, which takes the form of a structure described below for enabling the suppression of a leakage from the floating region.

Figures 1, 18:
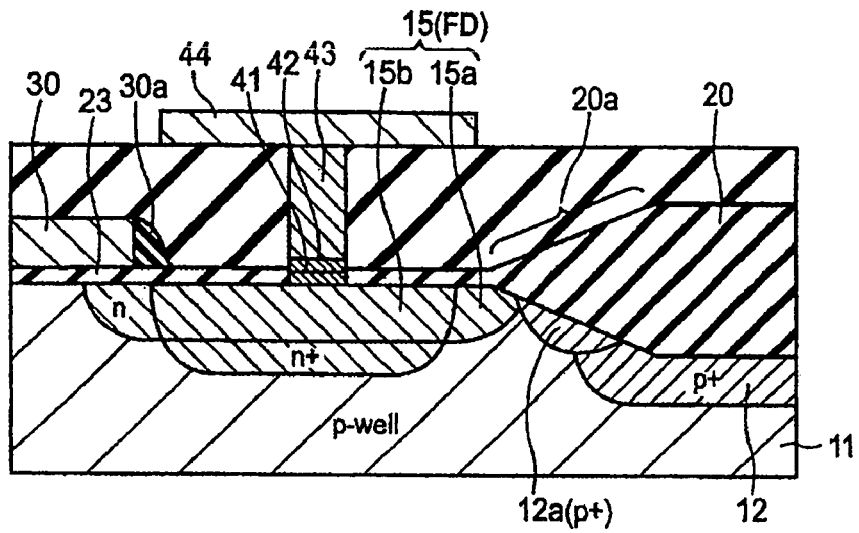
Figures 2, 18:
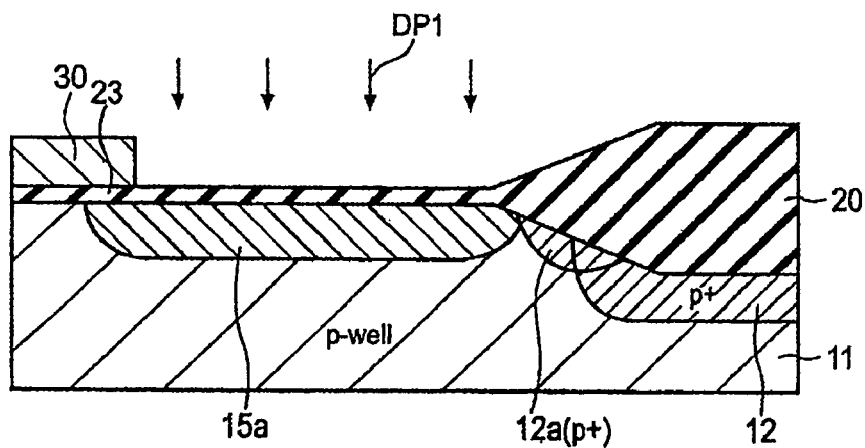
Figures 3, 18:
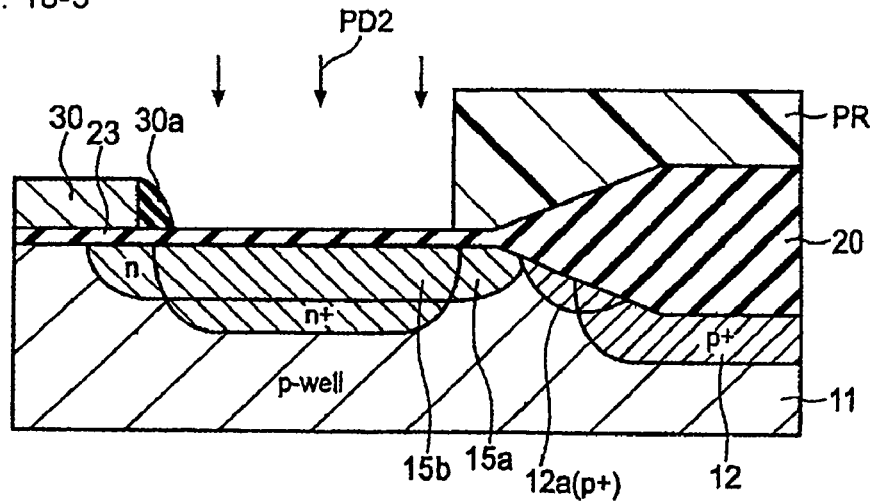

FIG. 18-1 is a cross sectional view showing a detail of a floating region area of the CMOS sensor of the present embodiment.

The p-type well (p-well) 11 has an active region that is split off by means of an element separating insulation film 20 made of oxide silicon using a LOCOS process. A p'-type split region 12 is formed in the p-type well 11 at an area below the separating insulation film 20. Also, the p-type well 11 is further formed with a p'-type separating region 12a in an area beneath an end portion 20a of the LOCOS element separating insulation film 20 that is called as a bird's beak.

The p-type well 11 is formed with a gate electrode 30, made of poly silicon, intervening a gate insulation film 23 formed on a surface of the p-type well 11 and made of oxide silicon in an area remote from the end portion 20a of the element separating insulation film 20 by a given distance. The gate electrode has a side portion formed with a sidewall spacer 30a made of, for instance, silicon nitride.

A surface layer of the p-type well 11 in a position between the gate electrode 30 and the element separating insulation film 20 is formed with an n'-type semiconductor region 15 serving as a floating region FD. The n-type semiconductor region 15 includes a low-concentrated impurity region 15a and a high-concentrated impurity region 15b. Here, the CMOS sensor takes the form of a structure in which the low-concentrated impurity region 15a sticks out of an end of the high-concentrated impurity region 15b, that is, in a so-called LDD (Lightly Doped Drain) structure. The low-concentrated impurity region 15a is formed in a wide area closer to a vicinity of the end portion 20a of the element separating insulation film 20 and a vicinity of the gate electrode 30 at positions closer to the vicinity of the end portion 20a of the element separating insulation film 20 and the vicinity of the gate electrode 30.

A transfer transistor Tr1 is structured to have a channel forming region extending from a source and drain, composed of the gate electrode 30 and the n'-type semiconductor region 15, to the surface layer of the p-type well 11.

The gate electrode 30, the n'-type semiconductor region 15 and the element separating insulation film 20 are covered with an interlayer insulation film, made of oxide silicon, to which a contact reaching the n'-type semiconductor region 15 is open. A TiSi layer (or a Ti layer) 41 and a TiN layer 42 are stacked on an upper layer of the n'-type semiconductor region 15 forming a bottom portion of the contact and a contact is buried on an upper layer of the TiN layer to form a tungsten plug 43. An upper layer wiring 44 is formed on an upper layer of the interlayer insulation film in connection with the tungsten plug 43. The upper layer wiring 44 is formed in a surface area so as to cover the n'-type semiconductor region 15 and is also is connected to the contact to take the same potential as that of the n'-type semiconductor region 15.

In the CMOS sensor formed in the structure shown in FIG. 18-1, the p'-type separation region 12a is formed beneath the bird's beak of the LOCOS element separating insulation film 20 and the n'-type semiconductor region 15 takes the LDD structure. This results in alleviation of electric field concentration at the end of the n'-type semiconductor region 15, namely, at an area close proximity to the bird's beak of the LOCOS element separating insulation film 20 liable to be subjected to increased stress. Thus, a leakage in the n'-type semiconductor region 15 (floating region FD) can be suppressed.

Further, the upper layer wiring 44 having the same potential is formed on the n'-type semiconductor region 15 (floating region FD) so as to cover the same in a shielding effect. This enables a surface of the n'-type semiconductor region 15 (floating region FD) to be suppressed from being formed with depletions that are causes of the leakages.

As mentioned above, the CMOS sensor takes the form of a structure that can remarkably suppress a leakage on the n'-type semiconductor region (floating region FD).

FIGS. 18-2 and 18-3 are cross-sectional views showing manufacturing steps of the CMOS sensor shown in FIG. 18-1.

As shown in FIG. 18-2, the p'-type separating region 12, forming a channel top, and the element separating insulation film 20, employing the LOCOS process, are formed in an element separating region of the p-type well 11 and the p'-type separation region 12a is also formed in an area beneath the bird's beak of the element separating insulation film 20.

Next, the gate insulation film 23 is formed on the surface of the p-type well 11, using, for instance, a thermal oxidation method, and the gate electrode 30 is patterned. Then, n-type electrically conductive impurity DPI is ion-implanted so as to define a terminal portion using the gate electrode and the bird's beak of the element separating insulation film 20. Thus, the low-concentrated impurity region 15a is formed.

Next, as shown in FIG. 18-3, a silicon nitride film is formed on an entire surface by, for instance, a CVD (Chemical Vapor Deposition) and, then, an etch-back process is performed to thereby form the sidewall spacer 30a at a side area of the gate electrode 30. Moreover, a resist film PR is formed in a pattern to cover the element separating insulation film 20 so as to allow the resist film PR to stick out from the bird's beak to some extent.

Performing an ion implantation of n-type conductive impurity DP2 so as to define a terminal portion thereof with the sidewall spacer 30a and the resistor film PR, mentioned above, allows the high-concentrated impurity region 15b to be formed.

With the steps mentioned above, an LDD structure can be formed not only in the gate electrode but also in the LOCOS element separating insulation film 20.

Next, a film of oxide silicon is formed on the entire surface by a CVD method for forming an interlayer insulation film to allow the resulting interlayer insulation film to have a contact open to the n'-type semiconductor region 15 and a TiSi layer (or a Ti-layer) 41 is formed by, for instance, a sputtering method. In addition, a TiN layer 42 is formed and, further, the tungsten plug 43 is buried and formed. Moreover, using, for instance metallic material allows the upper layer wire lead 44 to be formed in a width to cover the n'-type semiconductor region 15, providing the structure shown in FIG. 18-1.

With the CMOS sensor of the present embodiment, like the embodiments mentioned above, a wide dynamic range can be realized in high illuminance and, in addition thereto, leakage current in the floating region can be suppressed.

Seventh Embodiment

A CMOS sensor of the present embodiment takes the form of a CMOS sensor, based on the CMOS sensors of the first to sixth embodiments, in which a voltage applied to the driveline $\phi_T$ takes only two levels in on/off states with no provision of the level (+α) as shown in FIG. 3-1 and enables an electric charge, overflowing from the photodiode during operation of accumulating the electric charges to smoothly shift to a floating region.

Figures 1, 19:
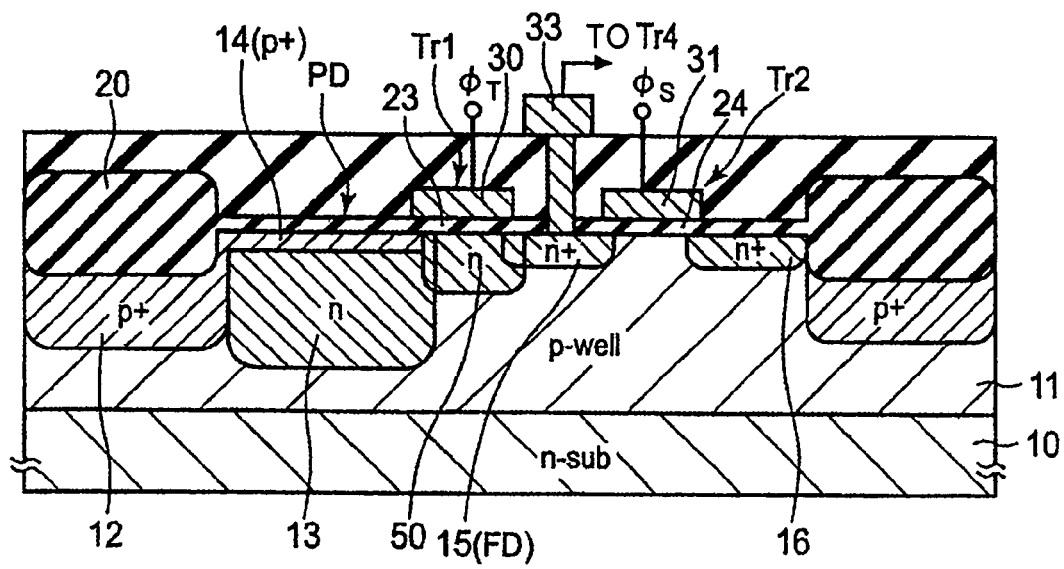
Figures 2, 19:
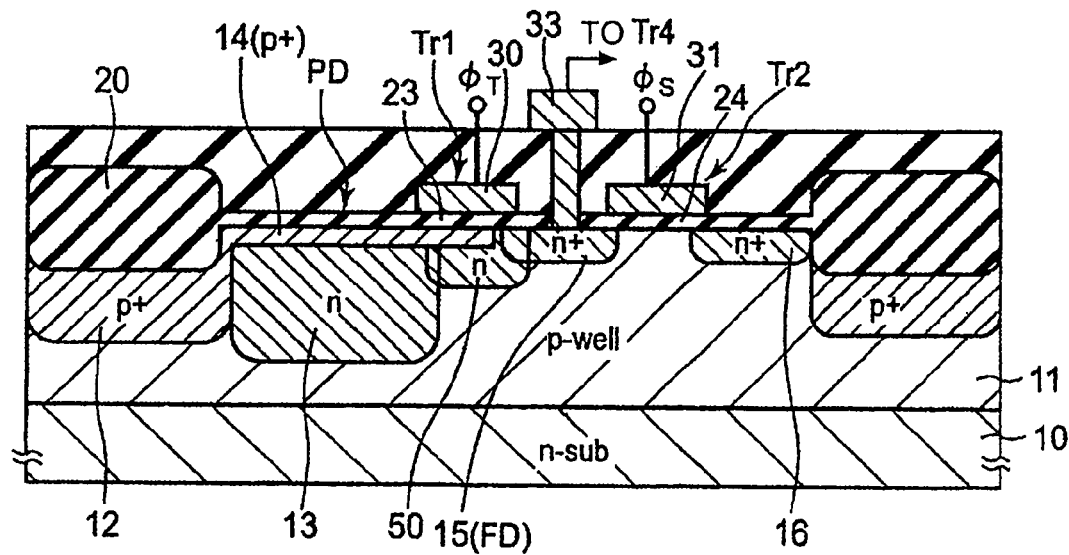

CMOS sensors, shown in FIGS. 19-1 and 19-2, include transfer transistors each of a buried channel type having such a semiconductor layer of the same conductor type as that of the channel of the transfer transistor that is formed in the surface of the substrate in which the transfer transistor is formed or in an area of the substrate from a vicinity of the surface down to a predetermined depth.

FIG. 19-1 is a cross-sectional view of one example of the CMOS sensor of the present embodiment showing areas corresponding to the photodiode PD, the transfer transistor Tr1, the floating region FD and the storage transistor Tr2. The n'-type semiconductor region 16, forming a source and drain of the storage transistor Tr2, is connected to the storage capacitor element $C_S$ that is not shown.

Here, an n-type semiconductor region 50 is formed on the substrate in an area below the gate electrode 30 of the transfer transistor Tr1 in a given depth from the surface of the substrate in a way to partially overlap the n-type semiconductor region 13 and the n'-type semiconductor region 15. The n-type semiconductor region 50 serves as an n-type region with effective concentration impurity lower than those of the n-type semiconductor region 13 and the n'-type semiconductor region 15.

With such a structure mentioned above, the transfer transistor Tr1 is formed in a buried channel and this corresponds to a consequence of a drop occurring in a potential barrier between the photodiode and the floating region. Accordingly, an equivalent potential can be obtained even if no voltage potential, represented by the level (+α) as shown in FIG. 3-1, is applied to the driveline $\phi_T$ and an electric charge, overflowing from the photodiode during accumulating operation of the electric charges, can be caused to smoothly shift to the floating region.

FIG. 19-2 is a cross-sectional view of one example of the CMOS sensor of the present embodiment wherein, like the CMOS sensor shown FIG. 19-1, the n-type semiconductor region 50 is formed on the substrate in the area below the gate electrode 30 of the transfer transistor Tr1 in the given depth from the surface of the substrate so as to partially overlap the n-type semiconductor region 13 and the n'-type semiconductor region 15. Further, the p'-type semiconductor region 14, formed on the surface layer of the photodiode PD, is formed so as to extend to an area below the gate electrode 30 of the transfer transistor Tr1.

Due to the formation of the n-type semiconductor region 50 and the p'-type semiconductor region 14, the transfer transistor Tr1 is formed in the buried channel configuration and this corresponds to a consequence of a drop occurring in a potential barrier between the photodiode and the floating region. Accordingly, an equivalent potential can be obtained even if no voltage potential, represented by the level (+α) as shown in FIG. 3-1, is applied to the driveline $\phi_T$ and an electric charge, overflowing from the photodiode during accumulating operation of the electric charges, can be caused to smoothly shift to the floating region.

Figures 1, 20:
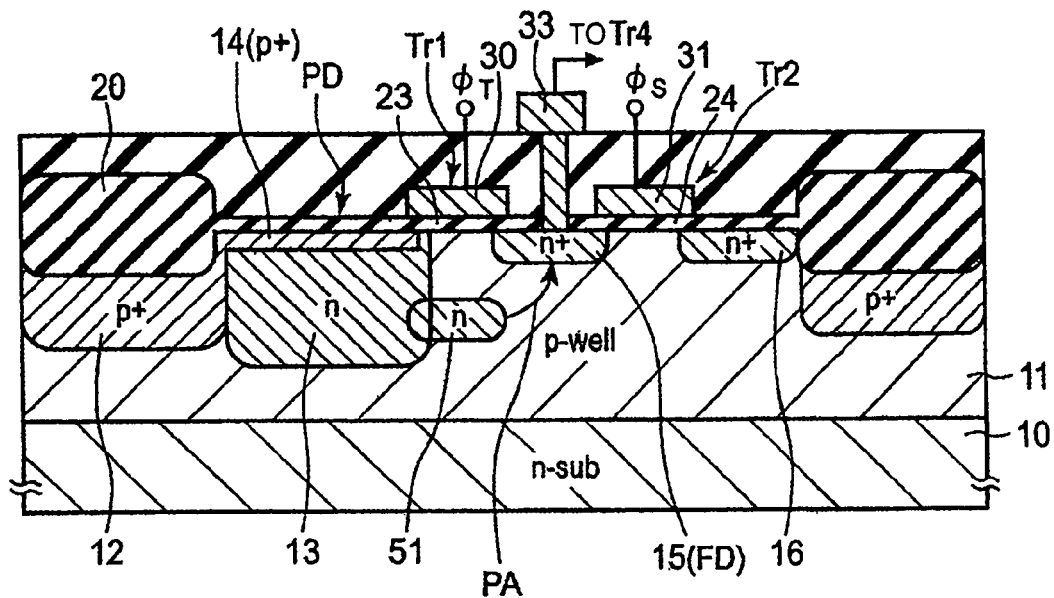
Figures 2, 20:
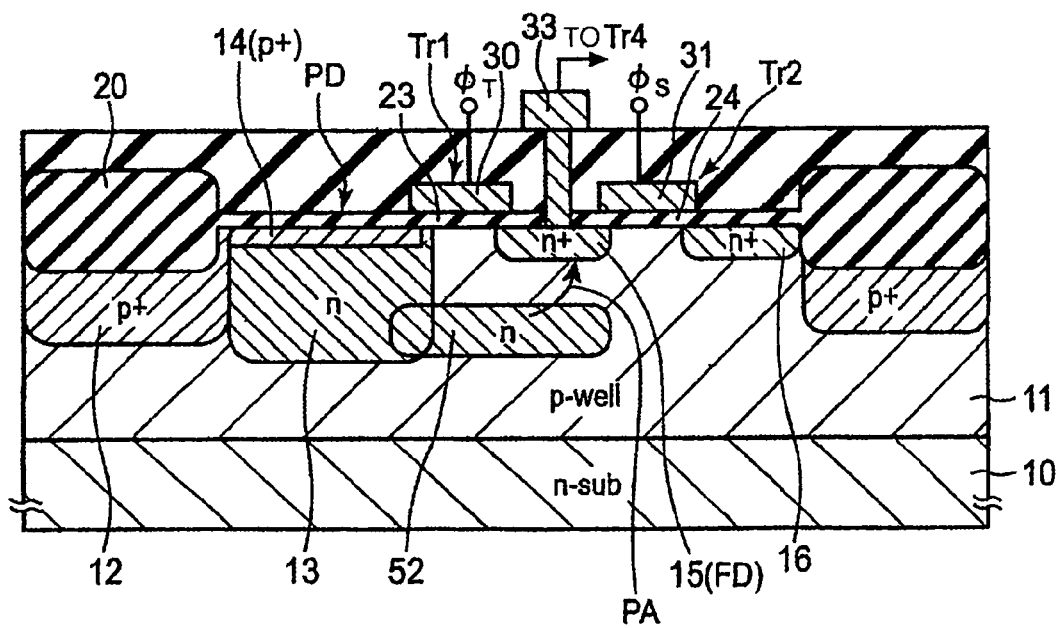

CMOS sensors, shown in FIGS. 20-1 and 20-2, include transfer transistors each takes the form of a structure including a semiconductor layer that is formed in an area in a predetermined depth of the substrate in which the transfer transistor is formed and is of the same conductive type as that of the channel of the transfer transistor. The semiconductor layer reduces a barrier for punch-through of the transfer transistor.

FIG. 20-1 is a cross-sectional view of one example of the CMOS sensor of the present embodiment showing areas corresponding to the photodiode PD, the transfer transistor Tr1, the floating region FD and the storage transistor Tr2. The n'-type semiconductor region 16, forming a source and drain of the storage transistor Tr2, is connected to the storage capacitor element $C_S$ that is not shown.

Here, an n-type semiconductor region 51 is formed in a substrate in an area below the gate electrode 30 of the transfer transistor Tr1 at a region in a given depth from the surface of the substrate and is connected to the n-type semiconductor region 13.

The above structure corresponds to a consequence of a drop occurring in the barrier for punch-through of the transfer transistor Tr1. A punch-through route oriented in a slanted direction from the n-type semiconductor region 51 to the floating region FD serves as an overflow path PA. Accordingly, even if no voltage potential, represented by the level (+α) as shown in FIG. 3-1, is applied to the driveline $\phi_T$, an electric charge, overflowing from the photodiode during accumulating operation of the electric charges, can be caused to punch-through for smooth shift to the floating region.

FIG. 20-2 is a cross-sectional view of one example of the CMOS sensor of the present embodiment wherein, like the CMOS sensor shown in FIG. 20-1, an n-type semiconductor region 52 is formed in a substrate in an area below the gate electrode 30 of the transfer transistor Tr1 at a region in a given depth from the surface of the substrate and is connected to the n-type semiconductor region 13. With the present embodiment, the n-type semiconductor region 52 is formed in a further extension extending to a region below the floating region FD.

The above structure corresponds to a consequence of a drop occurring in a barrier for punch-through of the transfer transistor Tr1. A punch-through route extends in a substantially vertical direction from the n-type semiconductor region 52 to the floating region FD and serves as an overflow path PA extending from the photodiode to the floating region FD. Accordingly, even if no voltage potential, represented by the level (+α) as shown in FIG. 3-1, is applied to the driveline $\phi_T$, an electric charge, overflowing from the photodiode during accumulating operation of the electric charges, can be caused to punch-through for smooth shift to the floating region.

Eighth Embodiment

The present embodiment represents a modified form of the embodiment of the storage capacitor element for storing the photoelectric charges overflowing from the photodiode in the various embodiments described above.

From the point of view of taking a junction type storage capacitor element as a storage capacitor element, an electrostatic capacitance per 1 $\mu m^2$ lies in a value of approximately 0.3 to 3 $fF/\mu m^2$ even in the light of conditions and a surface efficiency is not very satisfactory accompanied by a difficulty in widening a dynamic range.

On the contrary, with a planar type storage capacitor element, for the purpose of suppressing insulation-film leakage current in the capacitor insulation film, setting an insulation film electric field with a value less than 3 to 4 MV/cm, a maximal applied voltage with a value of 2.5 to 3V and a capacitor insulation film thickness with a value of approximately 7 nm results in a consequence of capacitances of 4.8 $fF/\mu m^2$ with the capacitor insulation film formed of material having dielectric constant of 3.9, 9.9 $fF/\mu m^2$ with dielectric constant of 7.9, 25 $fF/\mu m^2$ with dielectric constant of 20 and 63 $fF/\mu m^2$ with dielectric constant of 50.

By using oxide silicon (with dielectric constant of 3.9) and, in addition thereto, a so-called material High-k containing some materials such as silicon nitride (ditto with a value of 7.9), $Ta_2O_5$ (ditto with 20 to 30), $HfO_2$ (ditto with a value of 30), $ZrO_2$ (ditto with a value of 30) and $Ra_2O_3$ (ditto with a value of 40 to 50), a further increased electrostatic capacitance can be realized and even the planar type, formed in a relatively simplified structure, can realize an image sensor with a wide dynamic range in a value of 100 to 120 dB.

Further, even with applications of structures of a stack type or a trench type or the like capable of reducing an occupied surface area while expanding a surface area giving contribution to a capacitance, a wide dynamic range of 120 dB can be achieved. Further, combining the above-described material High-k to such structures makes it possible to achieve values of 140 dB on the stack type and 160 dB on the trench type.

Hereinbelow, description is made of examples of storage capacitor elements that can be applied to the present embodiment.

Figures 1, 21:
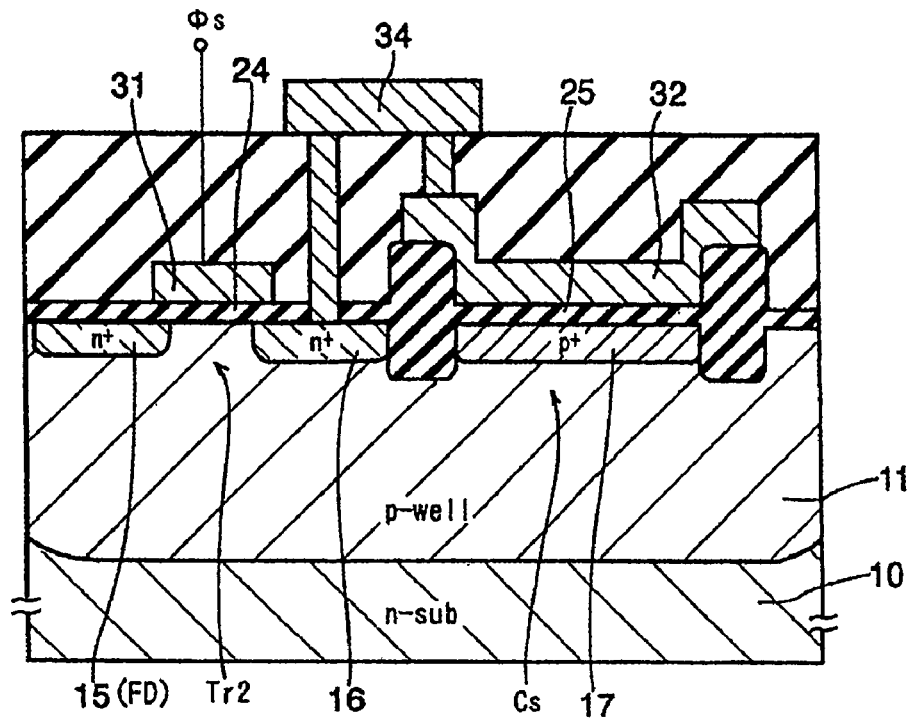
Figures 2, 21:
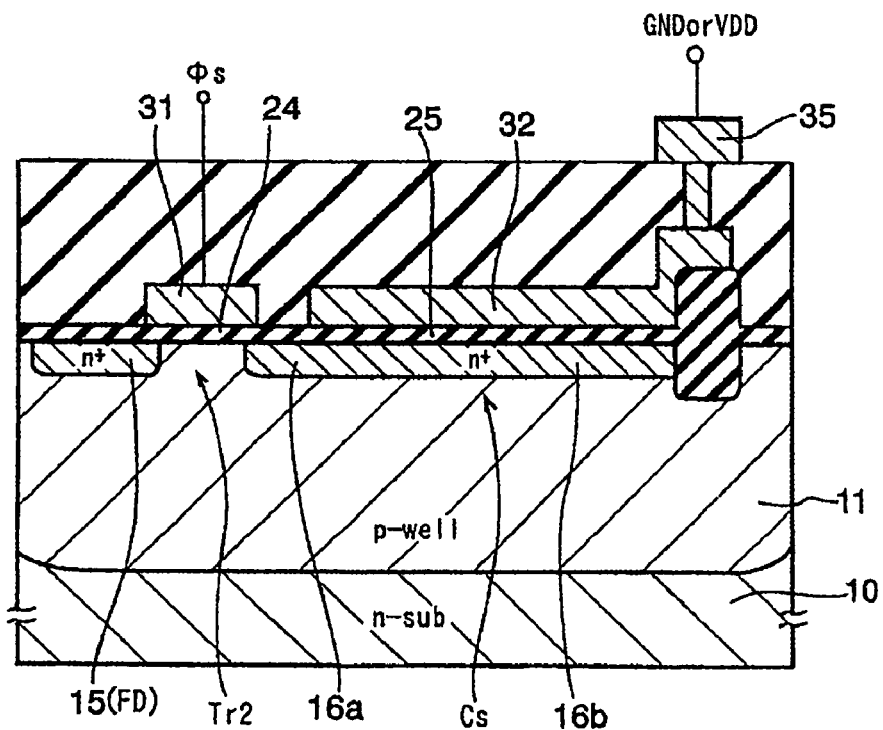

FIG. 21-1 is a cross-sectional view of a planar type MOS storage capacitor element with the same structure as that of the first embodiment.

Specifically, the storage capacitor element $C_S$ takes the form of a structure that includes, for instance, a p'-type semiconductor region 17 formed on a surface layer portion of a semiconductor substrate 10 and serving as a lower electrode, an oxide silicon capacitor insulation film 25 formed on the p'-type semiconductor region 17, and an upper electrode 32, made of polysilicon, formed on the oxide silicon capacitor insulation film 25.

FIG. 21-2 is a cross-sectional view of a planar type MOS and a junction type storage capacitor element.

For instance, a surface layer of a p-type well 11, formed on an n-type semiconductor substrate 10, has an n'-type semiconductor region 16b, serving as a lower electrode, which is integrally formed with an n'-type semiconductor region 16a serving as a source and drain of a storage transistor. An upper electrode 32 is formed over the semiconductor regions 16a, 16b via a capacitor insulation film 25, made of oxide silicon, and thus, a storage capacitor element $C_S$ is formed. In this case, the upper electrode 32 is applied with a power supply voltage or ground GND.

Figures 1, 22:
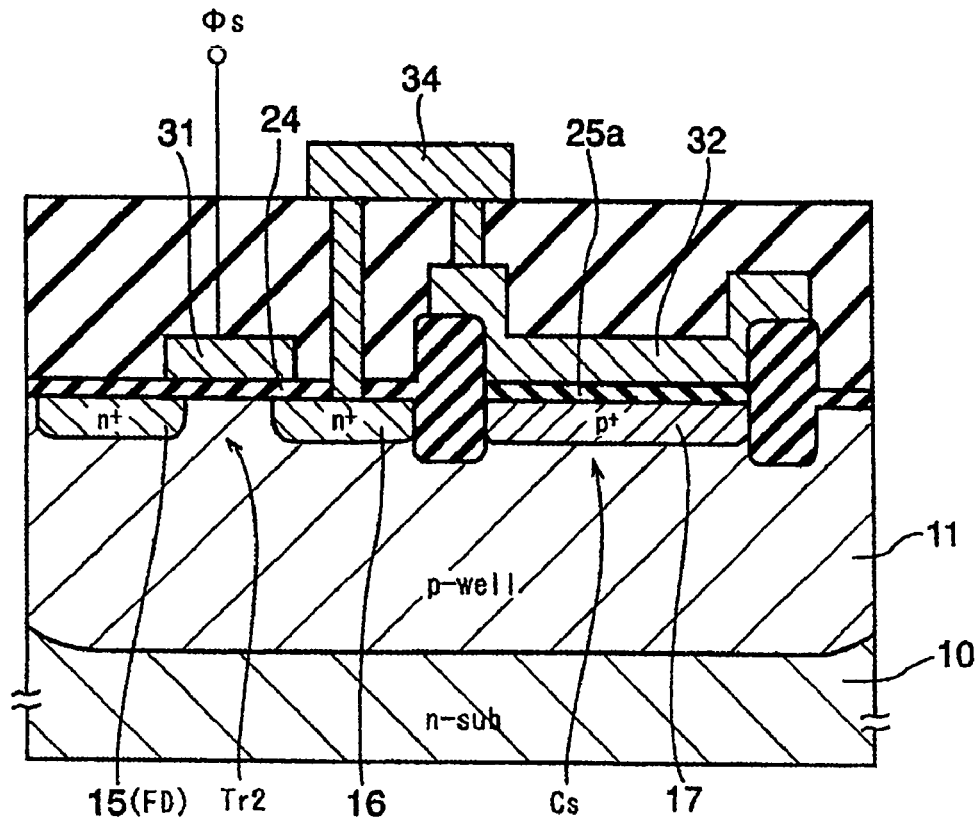
Figures 2, 22:
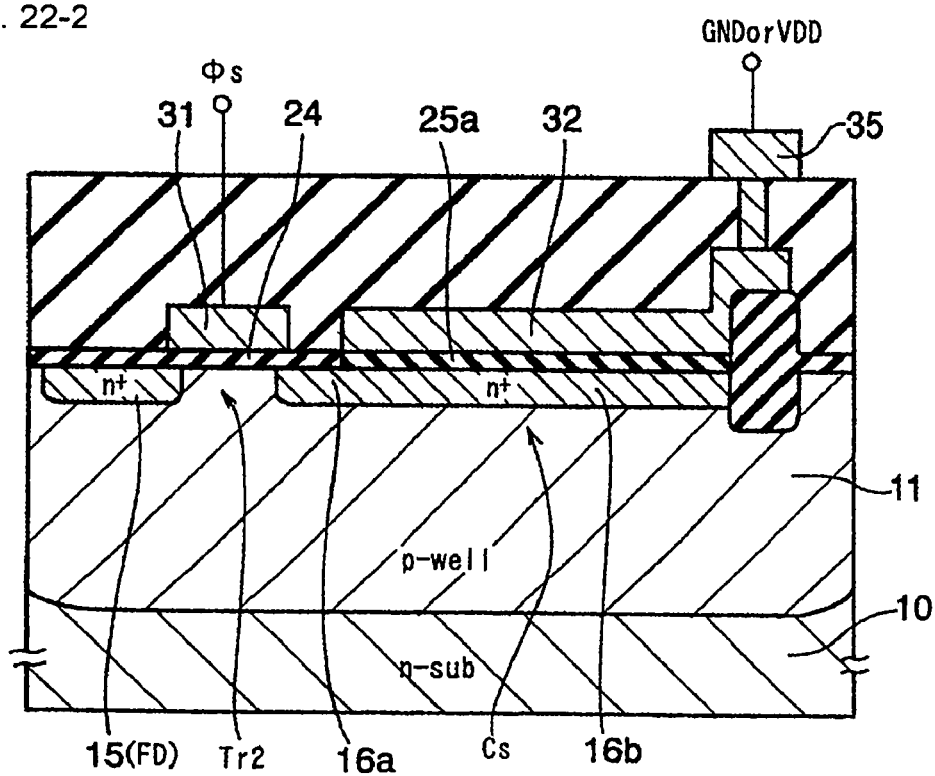

A storage capacitor element, shown in FIG. 22-1 in cross-section, is of a same planar type MOS storage capacitor element similar to that of FIG. 21-1.

However, a capacitor insulation film 25a is made of material High-k such as silicon nitride or $Ta_2O_5$ or the like and formed in a larger capacity than that of the storage capacitor element shown in FIG. 21-1.

A storage capacitor element, shown in FIG. 22-2 in cross-section, is of a planar type MOS and junction type storage capacitor element similar to that of FIG. 21-2.

However, the capacitor insulation film 25a is made of material High-k such as silicon nitride or $Ta_2O_5$ and formed in a larger capacity than that of the storage capacitor element shown in FIG. 21-2.

Figures 1, 23:
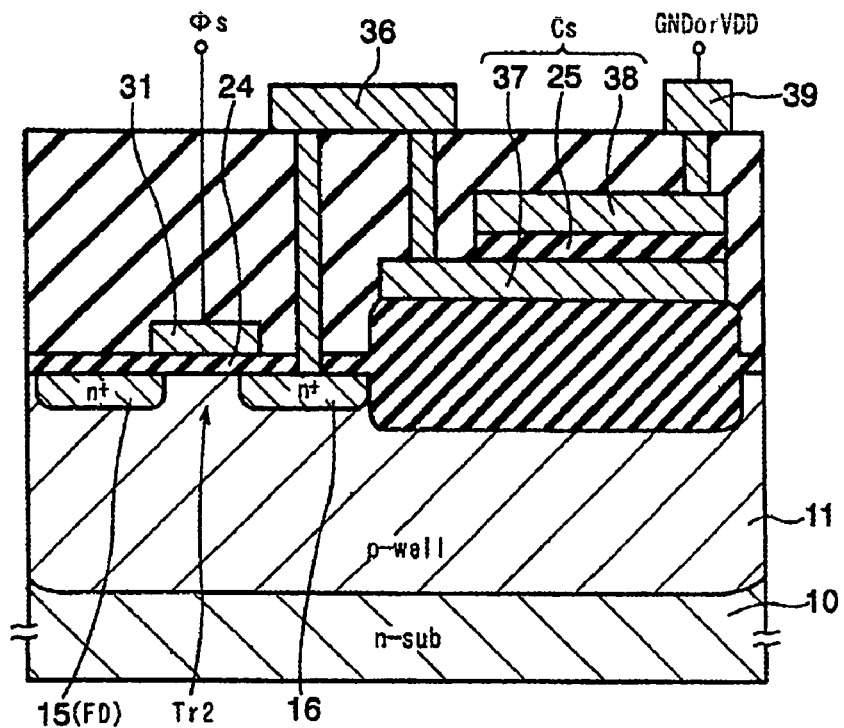
Figures 2, 23:
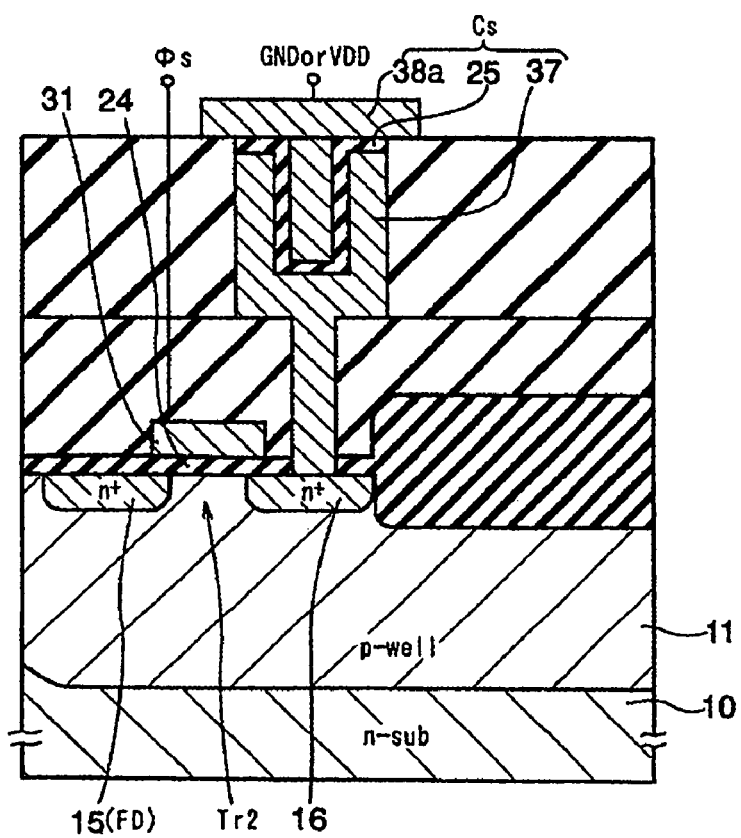

FIG. 23-1 is a cross-sectional view of a stack type storage capacitor element.

For instance, the stack type storage capacitor element takes the form of a structure that includes a lower electrode 37, formed on an element separation insulating film formed on an n-type semiconductor substrate 10, a capacitor insulation film 25 formed on the lower electrode 37, and an upper electrode 38 formed on the capacitor insulation film 25.

Here, an n'-type semiconductor film 16, serving as a source and drain of a storage transistor, and the lower electrode 37 are connected to each other by a wiring 36. In this case, the upper electrode 38 is applied with a power supply voltage VDD or ground GND.

FIG. 23-2 is a cross-sectional view of a cylindrical-shaped stack type storage capacitor element.

For instance, the stack type storage capacitor element takes the form of a structure that includes a cylindrical-shaped lower electrode 37a, coupled to an n'-type semiconductor region 16 serving as a source and drain of a storage transistor, a capacitor insulation film 25, formed on an inner wall surface of the cylindrical-shaped lower electrode 37a, and an upper electrode 38a formed in a way to bury a cylindrically inner portion of the lower electrode 37a via the capacitor insulation film 25.

Here, the upper electrode 38a is applied with a power supply voltage VDD or ground GND.

The structure of the upper electrode 38a, formed so as to bury the lower electrode 37a and the cylindrical inner portion of the lower electrode 37a can have a larger opposing surface area contributing to electrostatic capacitance than that of the stack type in normal practice.

Figure 24:
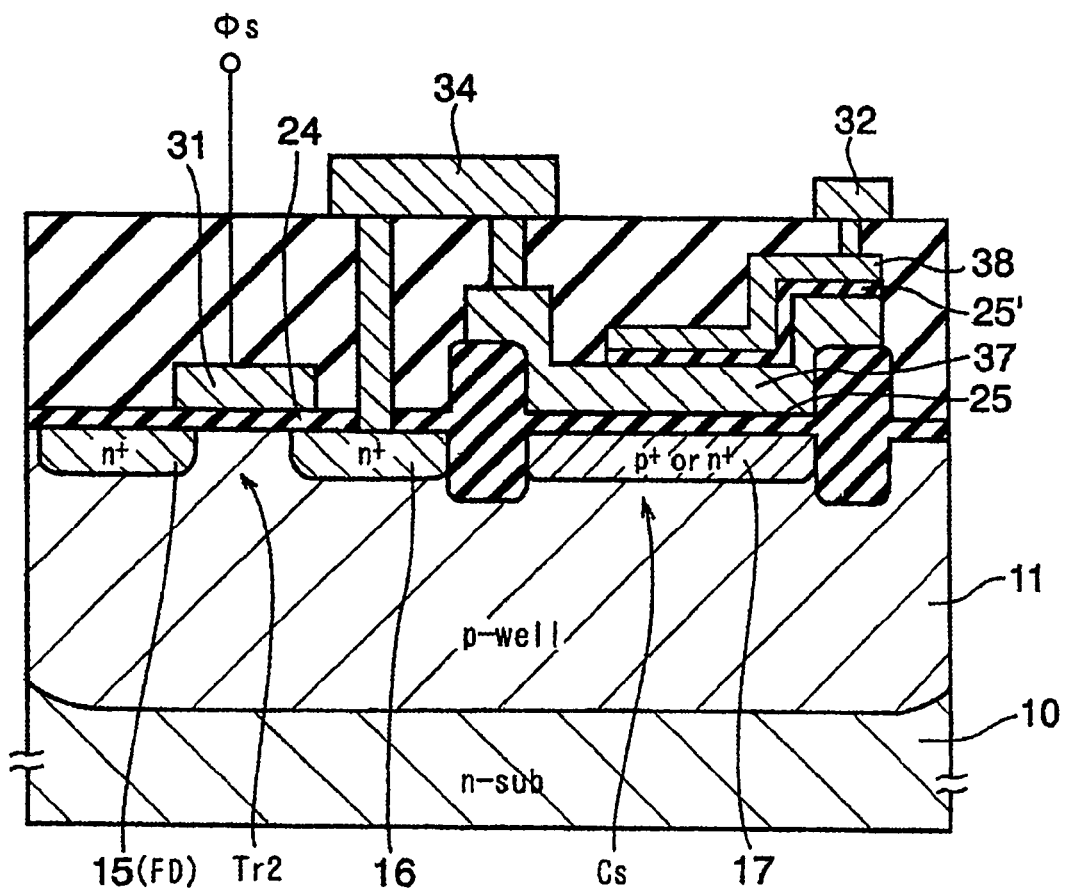
FIG. 24 is a cross-sectional view of a modified form of the storage capacitor element of the CMOS sensor of the eighth embodiment according to the present invention.

FIG. 24 is a cross-sectional view of a composite storage capacitor element combined with the planar MOS type and the stack type. This example enables the formation of a large capacitor that has a high efficiency in usage of area.

Figures 1, 25:
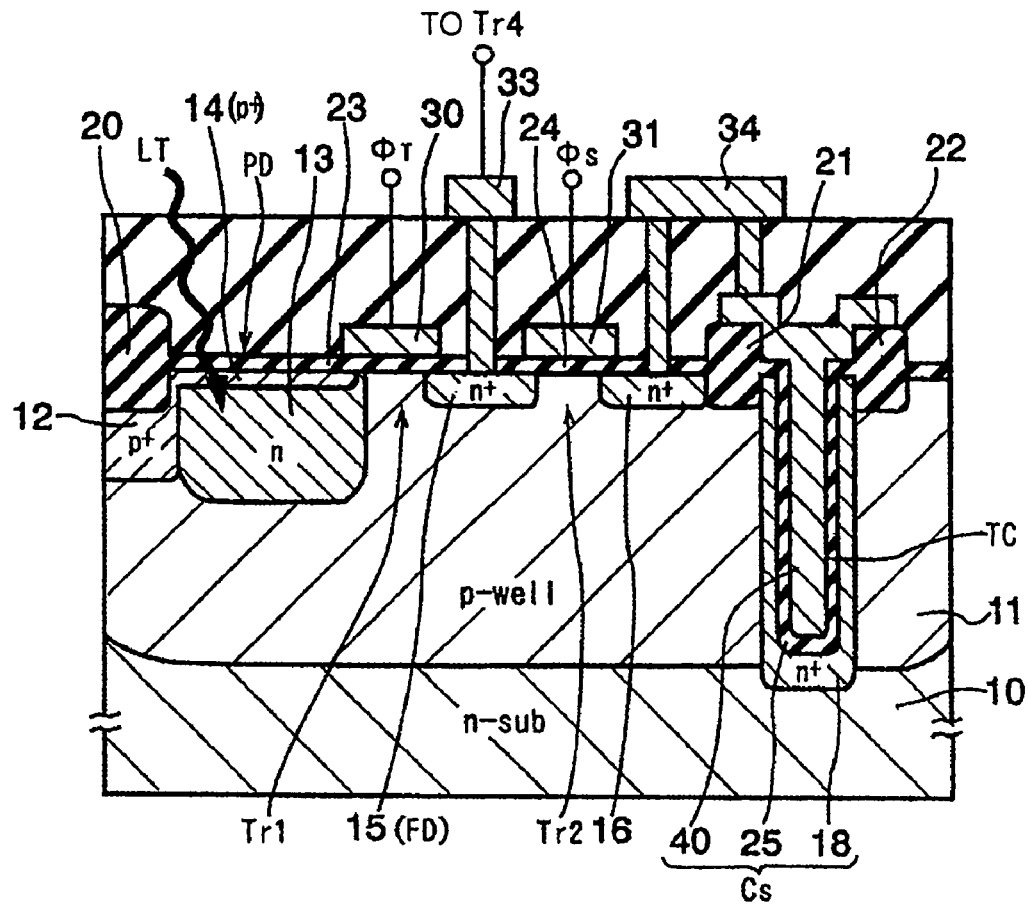
Figures 2, 25:
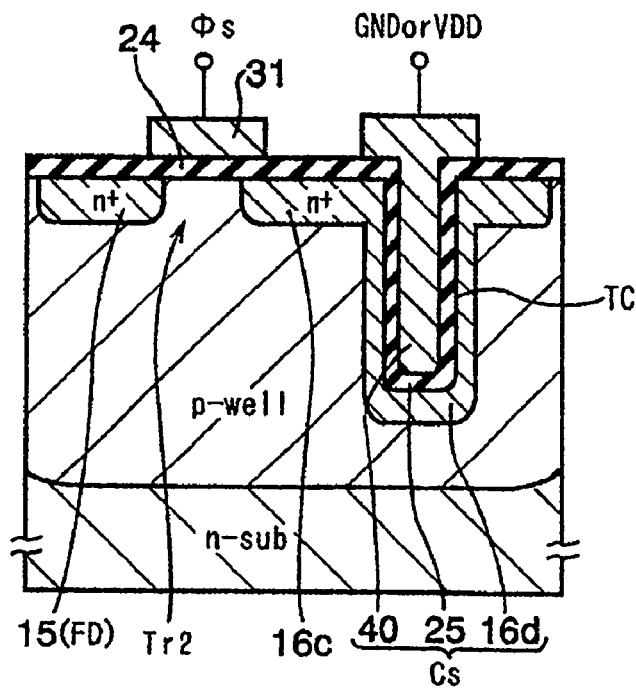

FIG. 25-1 is a cross-sectional view of a trench type storage capacitor element.

A trench TC is formed in a way to penetrate through a p-type well 11 of an n-type semiconductor substrate 10 and ends at the n-type substrate. An n'-type semiconductor region 18 is formed in an inner wall of the trench TC and plays a role as a lower electrode. A capacitor insulation film 25 is formed in a way to cover the inner wall of the trench TC. Using the capacitor insulation film 25 allows the trench TC to be buried to form an upper electrode 40.

Here, an n'-type semiconductor region 16, playing a role as a source and drain of a storage transistor, and the upper electrode 40 are connected to each other by a wire lead 34.

FIG. 25-2 is a cross-sectional view of a trench type storage capacitor element having a junction.

A trench TC is formed in a p-type well 11 of an n-type semiconductor substrate 10. An n'-type semiconductor region 16d is formed in an inner wall of the trench TC to play a role as a lower electrode and integral with an n'-type semiconductor region 16c that plays a role as a source and drain of a storage transistor. A capacitor insulation film 25 is formed in a way to cover the inner wall of the trench TC and the trench TC is buried by means of the capacitor insulation film 25 to form an upper electrode 40.

Figures 1, 26:
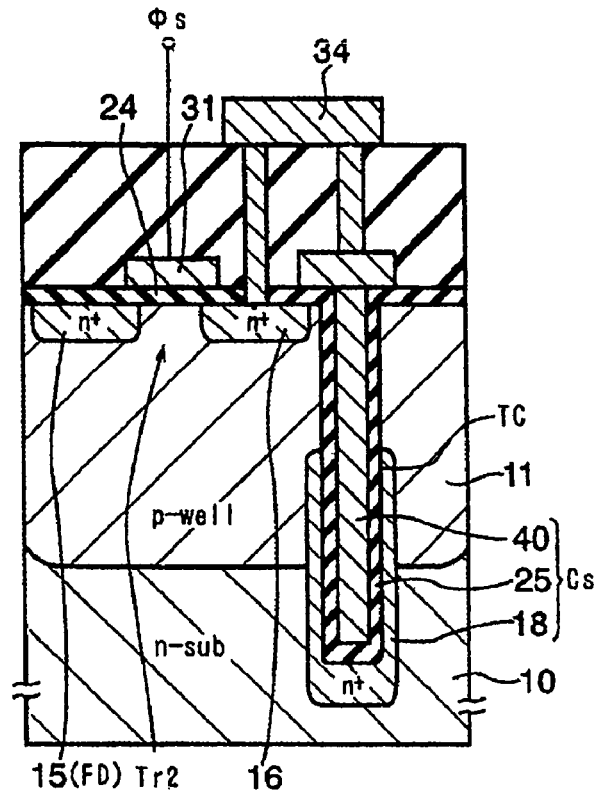
Figures 2, 26:
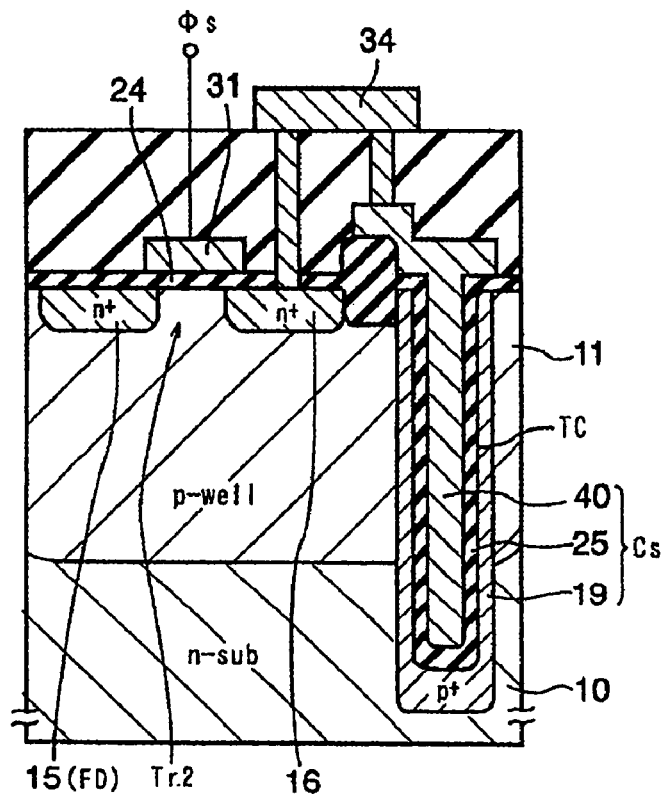

FIG. 26-1 is a cross-sectional view of a trench type storage capacitor element.

A trench TC is formed in a manner to penetrate through a p-type well 11 of an n-type semiconductor substrate 10 and ends at the n-type substrate. An n'-type semiconductor region 18 is formed in an inner wall of a region formed in an area deeper than a certain depth of the trench TC and plays a role as a lower electrode. A capacitor insulation film 25 is formed in a way to cover the inner wall of the trench TC. The trench TC is buried using the capacitor insulation film 25 to form an upper electrode 40.

Here, an n'-type semiconductor region 16 is connected to the upper electrode 40 by a wiring 34 and serves as a source and drain of a storage transistor.

FIG. 26-2 is a cross-sectional view of a trench type storage capacitor element.

A trench TC is formed in a way to penetrate through a p-type well 11 of an n-type semiconductor substrate 10 and ends at the n-type substrate. A p'-type semiconductor region 19 is formed on the inner wall of the trench TC and serves as a lower electrode. A capacitor insulation film 25 is formed to cover the inner wall of the trench TC. The trench TC is buried using the capacitor insulation film 25 to form an upper electrode 40.

Here, an n'-type semiconductor region 16 and the upper electrode 40 are connected to each other by a wiring 34 and serves as a source and drain of a storage transistor.

Figure 27:
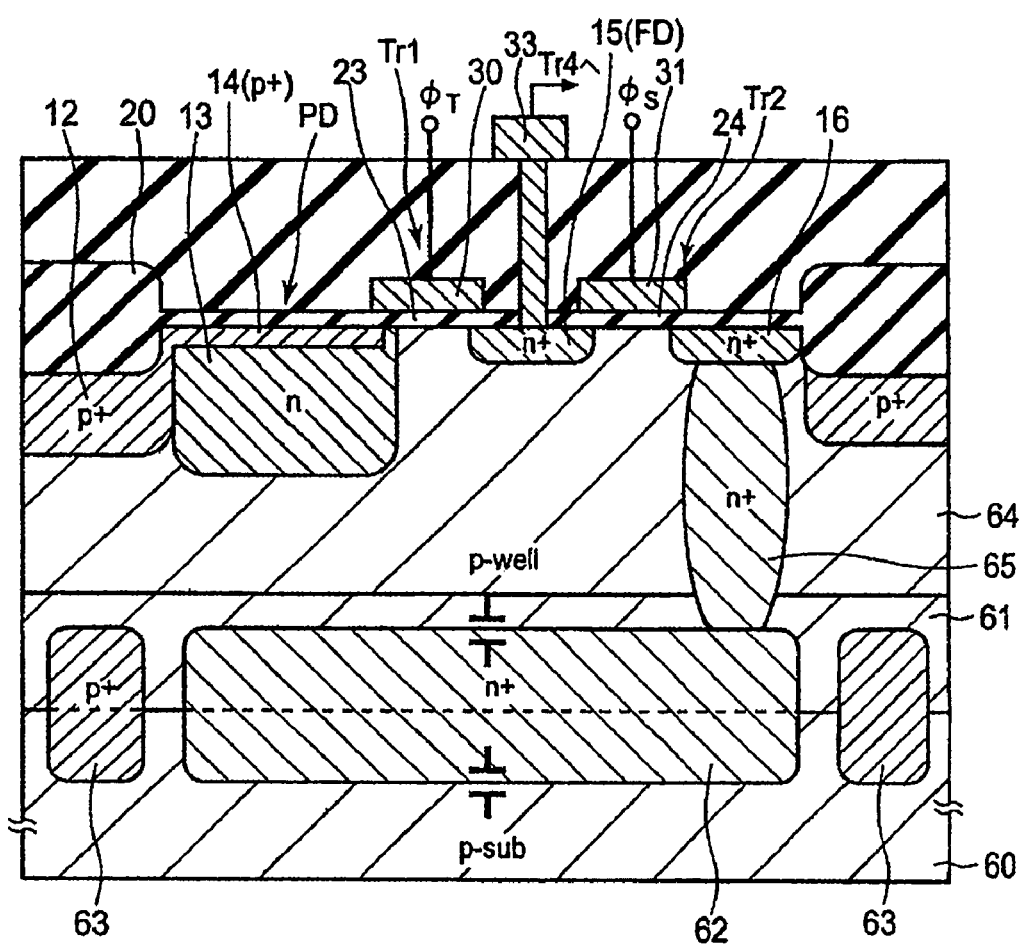
FIG. 27 is a cross-sectional view of a modified form of the storage capacitor element of the CMOS sensor of the eighth embodiment according to the present invention.

FIG. 27 is a cross-sectional view of a CMOS sensor having a buried storage capacitor element employing a junction capacitor.

For instance, a p-type epitaxial layer 61 is formed on a p-type silicon semiconductor substrate (p-sub) 60 and an n'-type semiconductor region 62 is formed in areas of the p-type silicon semiconductor substrate 60 and the n'-type semiconductor region 62. That is, a semiconductor region of an n-type (first conductive type) and a semiconductor region of a p-type (second conductive type) are joined to each other and buried in an inner area of a semiconductor substrate of a solid-state imaging device to form a buried storage capacitor element using a junction capacitor.

The p-type silicon semiconductor substrate 60 and the p-type epitaxial layer region 61 further have areas formed with p'-type separating region 63.

A p-type semiconductor layer 64 is formed on the p-type epitaxial layer 61 and has a photodiode PD, a transfer transistor Tr1, a floating region FD and a storage transistor Tr2 that are formed in the same steps as those of the various embodiments set forth above.

For instance, the n'-type semiconductor region 62 serves as a source and drain of the storage transistor Tr2 and is formed in a wide area across various areas in which the photodiodes PD, the transfer transistor Tr1, the floating region FD and the storage transistor Tr2 are formed.

Further, the n'-type semiconductor region 16 serves as a source and drain of the storage transistor Tr2 and is connected to the n'-type semiconductor region 62, forming a storage capacitor element, via an n'-type semiconductor region 65 vertically extending through the p-type semiconductor layer 64.

Figure 28:
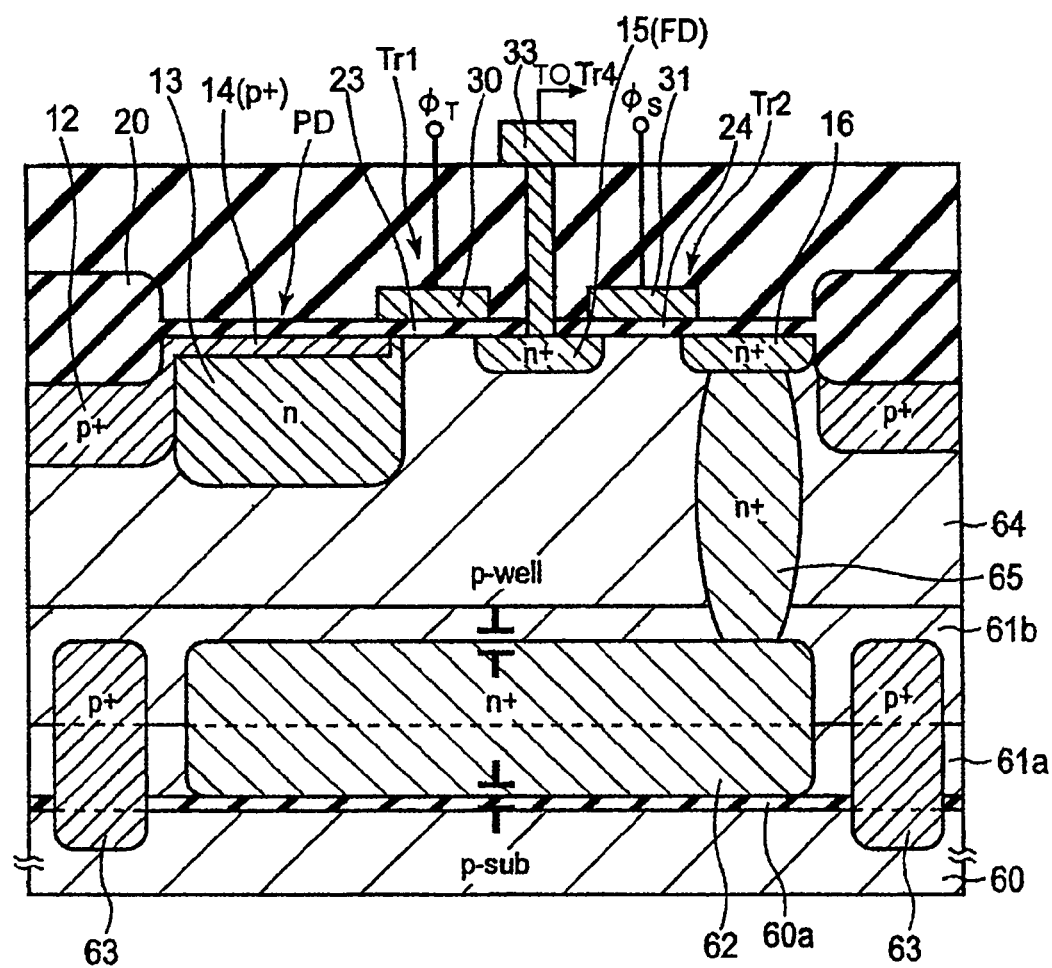
FIG. 28 is a cross-sectional view of a modified form of the storage capacitor element of the CMOS sensor of the eighth embodiment according to the present invention.

FIG. 28 is a cross-sectional view of a CMOS sensor having a buried storage capacitor element using an insulation film capacitor and a junction capacitor.

The CMOS sensor, shown in FIG. 28, is similar to that of FIG. 27, and the p-type silicon semiconductor substrate (p-sub) 60 is formed with a first p-type epitaxial layer 61a and a second p-type epitaxial layer 61b via an insulation film 60, taking the form of an SOI (Semiconductor on Insulator) substrate in which a semiconductor layer is formed on the semiconductor substrate via an insulation film.

Here, an n+-type semiconductor region 62 is formed in an area extending across the first p-type epitaxial layer 61a and the second p-type epitaxial layer 61b to the insulation film 60a and using an insulation film capacitor between the semiconductor substrate, opposing to the semiconductor region 62, and the semiconductor layer forms a storage capacitor element.

Further, a junction capacitor is formed between the first p-type epitaxial layer 61a and the second p-type epitaxial layer 61b like the storage capacitor element shown in FIG. 27.

The other structure is similar to the CMOS sensor shown in FIG. 27.

Figure 29:
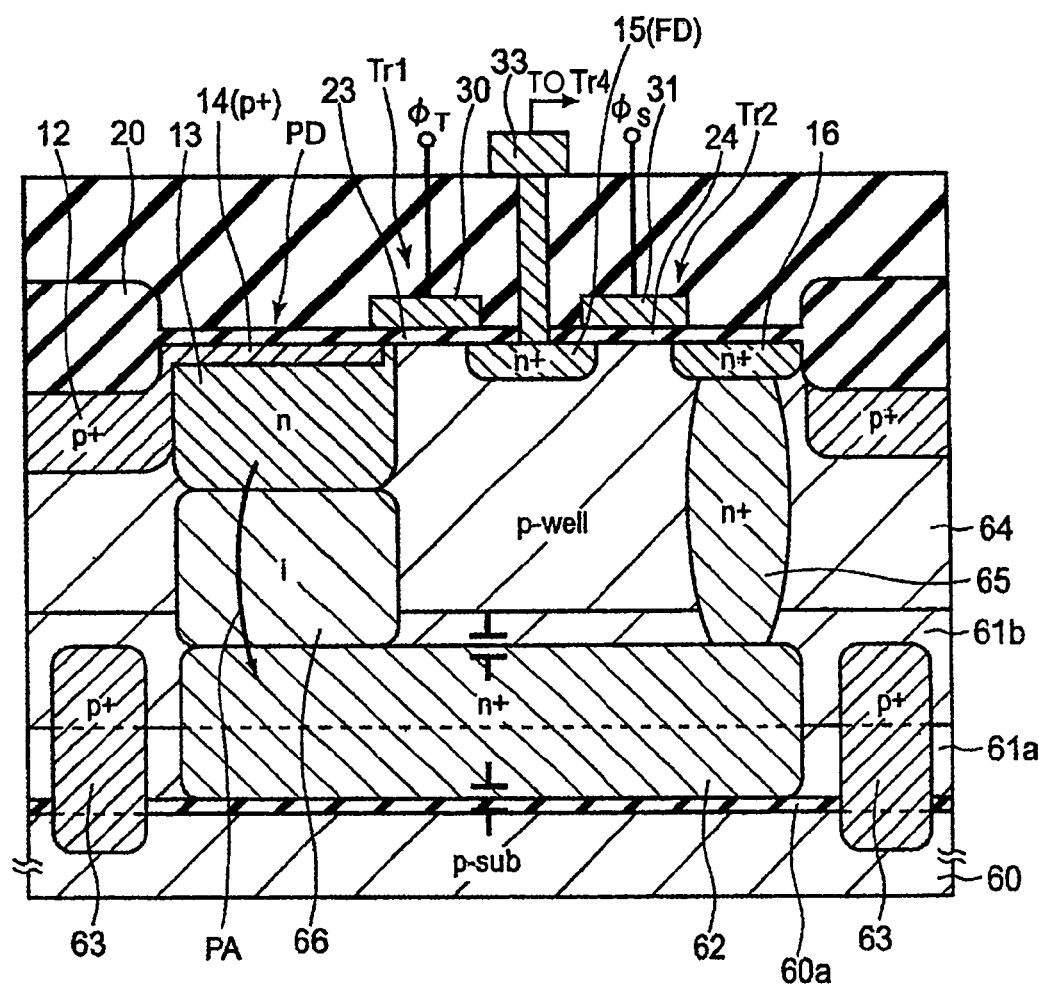
FIG. 29 is a cross-sectional view of a modified form of the storage capacitor element of the CMOS sensor of the eighth embodiment according to the present invention.

FIG. 29 is a cross-sectional view of a CMOS sensor having a buried storage capacitor element using an insulation film capacitor and a junction capacitor.

Although the CMOS sensor, shown in FIG. 29, is similar to that of FIG. 28, a low-concentrated semiconductor region (i-layer) is additionally formed between an n-type semiconductor region 13, forming a photodiode, and an n'-type semiconductor region 62 forming a storage capacitor element.

The above structure corresponds to a consequence of a drop in a potential barrier between the n-type semiconductor region 13 and the n'-type semiconductor region 62 making an overflow path PA extending from the photodiode to the floating region FD. This enables an electric charge, overflowing from the photodiode, during an accumulating operation of the electric charges, to shift to the storage capacitor element without applying a driveline $\phi_T$ with a voltage potential represented by $(+\alpha)$ shown in FIG. 3-1.

The various storage capacitor elements described above can be applied to any of the embodiments set forth above. The storage capacitor elements with such a configuration, mentioned above, are caused to accumulate the photoelectric charges overflowing from the photodiode, enabling the realization of a wide dynamic range in high illuminance.

EXAMPLE 1

A simulation was carried out to obtain a dynamic range that can be realized in the CMOS image sensor of the present invention upon changing a saturation voltage of $C_{FD}$ and $C_S$ and a capacitance value to various values. Here, a noise level was set to $2e^-$.

In a case where the saturated voltage $C_{FD}$ and $C_S$ lies at 500 mV and $C_S$ lies at a capacitance of 64 fF or a case where the saturated voltage $C_{FD}$ and $C_S$ lies at 1V and $C_S$ lies at a capacitance of 32 fF, an electron count involving that of $C_S$ lies at a value of $2 \times 10^5 e^-$ during saturation and can realize a dynamic range in a value of 100 dB.

Further, in a case where the saturated voltage $C_{FD}$ and $C_S$ lies at 500 mV and $C_S$ lies at a capacitance of 200 fF or a case where the saturated voltage $C_{FD}$ and $C_S$ lies at 1V and $C_S$ lies at a capacitance of 100 fF, an electron count involving that of $C_S$ lies at a value of $3 \times 10^5 e^-$ during saturation and can realize a dynamic range in a value of 110 dB.

Moreover, in a case where the saturated voltage $C_{FD}$ and $C_S$ lies at 500 mV and $C_S$ lies at a capacitance of 640 fF or a case where the saturated voltage $C_{FD}$ and $C_S$ lies at 1V and $C_S$ lies at a capacitance of 32 fF, an electron count involving that of $C_S$ lies at a value of $2 \times 10^6 e^-$ during saturation and can realize a dynamic range in a value of 120 dB.

EXAMPLE 2

A simulation was conducted to obtain a dynamic range that can be realized when the CMOS image sensor of the present invention is applied with the trench type storage capacitor element mentioned above.

Figure 30:
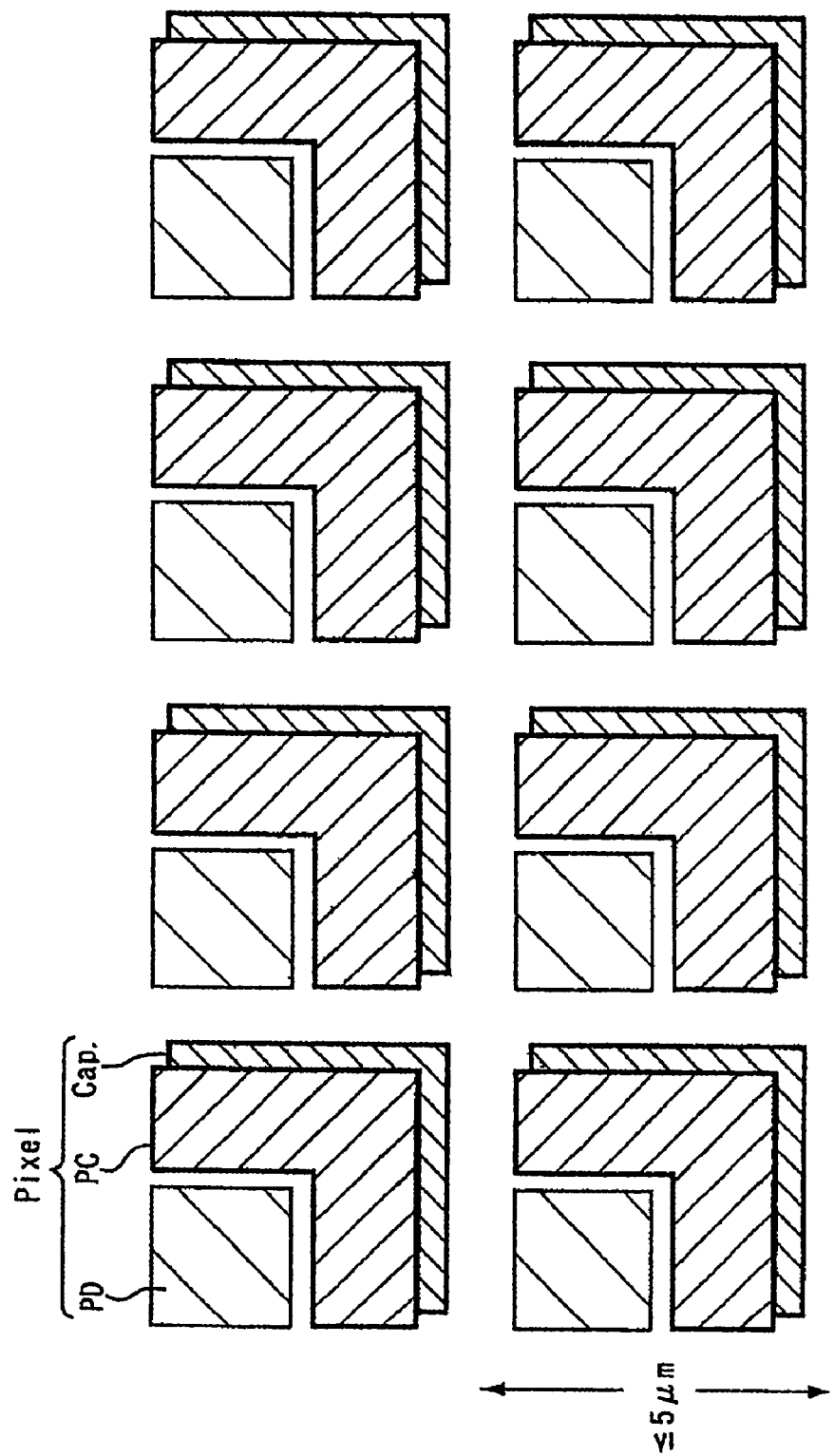
FIG. 30 is a schematic plan view of a pixel when adopting a trench type storage capacitor element in Example 2.

FIG. 30 is a schematic plan view of respective pixels (Pixel) formed upon employing the trench type storage capacitor elements.

Each pixel (Pixel) includes a photodiode PD, a pixel circuit PC and a trench type storage capacitor element Cap.

Here, assuming that each pixel has one side in a range of approximately 5 μm, a length of a trench type storage capacitor element in terms of a plane on a planar view lies in a value of approximately 4 μm×2 even in a long one.

Figure 31:
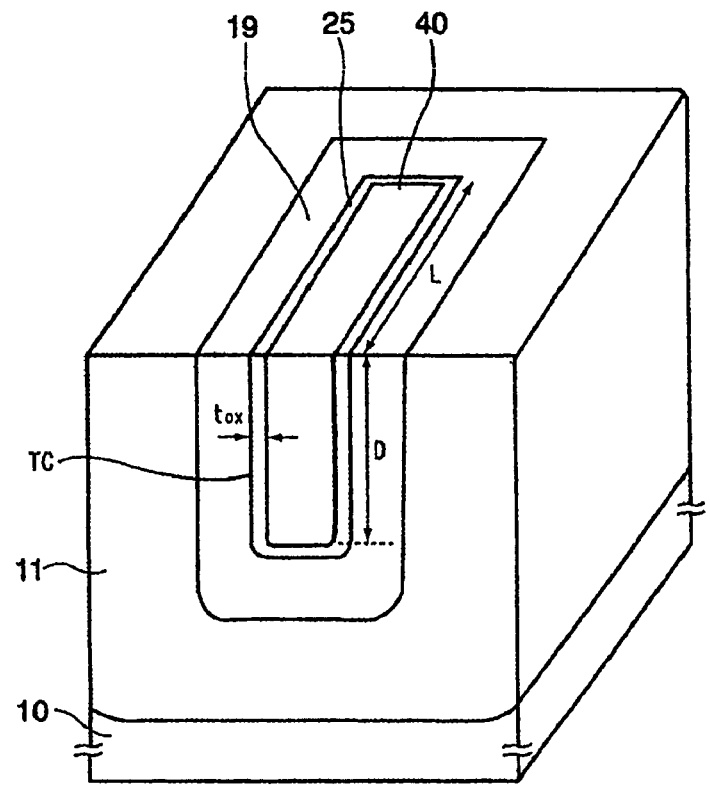
FIG. 31 is a typical view for illustrating the trench type storage capacitor element supposed in Example 2.

FIG. 31 is a typical view illustrating a size of a trench type storage capacitor element in assumption.

A trench TC is formed in a p-type well 11 of an n-type semiconductor substrate 10 and has an inner wall formed with a p-type semiconductor region 19 that plays a role as a lower electrode. A capacitor insulation film 25, made of oxide silicon, is formed in a way to cover the inner wall of the trench TC. Burying the trench TC using the capacitor insulation film 25 forms an upper electrode 40 in structure.

Here, a length L is set to 4 μm×2 as described above.

Further, assuming the trench TC has a depth D of 2 μm and the capacitor insulation film 25 of oxide silicon (dielectric constant of 3.9) has a film thickness of $t_{OX}$, with only a side surface of the trench TC taken into consideration, a capacitance lies at a value of 160 fF and an electron count during saturation lies at a value of $5 \times 10^5 e^-$ enabling a dynamic range to be realized in a value of 100 to 120 dB.

EXAMPLE 3

With the CMOS image sensor of the present invention, a simulation was carried out to obtain a dynamic range that can be achieved when applied with the planar type storage capacitor element mentioned above.

Figure 32:
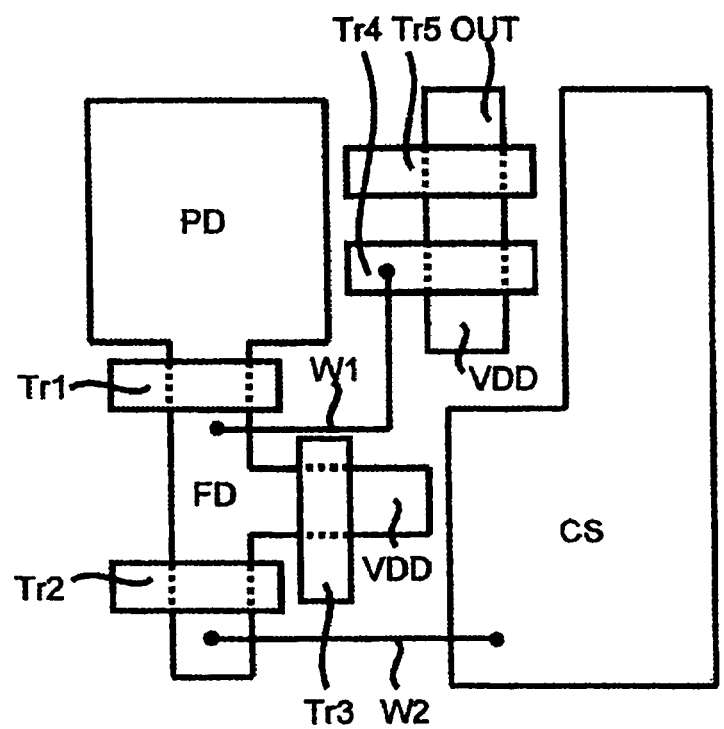
FIG. 32 is a layout view of a pixel when adopting a planar type storage capacitor element in Example 3.

FIG. 32 is a layout chart of a pixel when applied with the planar type storage capacitor element.

A photodiode PD, a floating region FD, a storage capacitor element $C_S$ and other pixel circuitry were placed to obtain a layout shown in FIG. 32.

By forming the pixel with one side of 8.2 μm in length and a planar type storage capacitor element with a capacitor insulation film, made of oxide silicon, with a film thickness of 7 nm, a result was $C_s=38$ fF. When this takes place, a capacitance $C_{FD}$ was expressed as $C_{FD}=4.2$ fF (except for fringe capacitance) and a dynamic range was obtained in a range of 88 to 96 dB.

EXAMPLE 4

With the CMOS image sensor of the present invention, assumption was made that a photodiode PD of a pixel having one side with 3 μm in length had a surface area with an aperture-ratio of 25% and a micro lens was additionally incorporated into the photodiode PD to obtain a substantially aperture-ratio of 80%.

Here, for storage capacitor elements accumulating a photoelectron overflowing from the photodiode PD, two kinds of 64 fF and 640 fF were set and a simulation was conducted to obtain a linearity of an output (V) and light intensity (lux) in respect of one phase before the photodiode PD was saturated and another phase in which the photodiode PD was saturated.

Figures 1, 33:
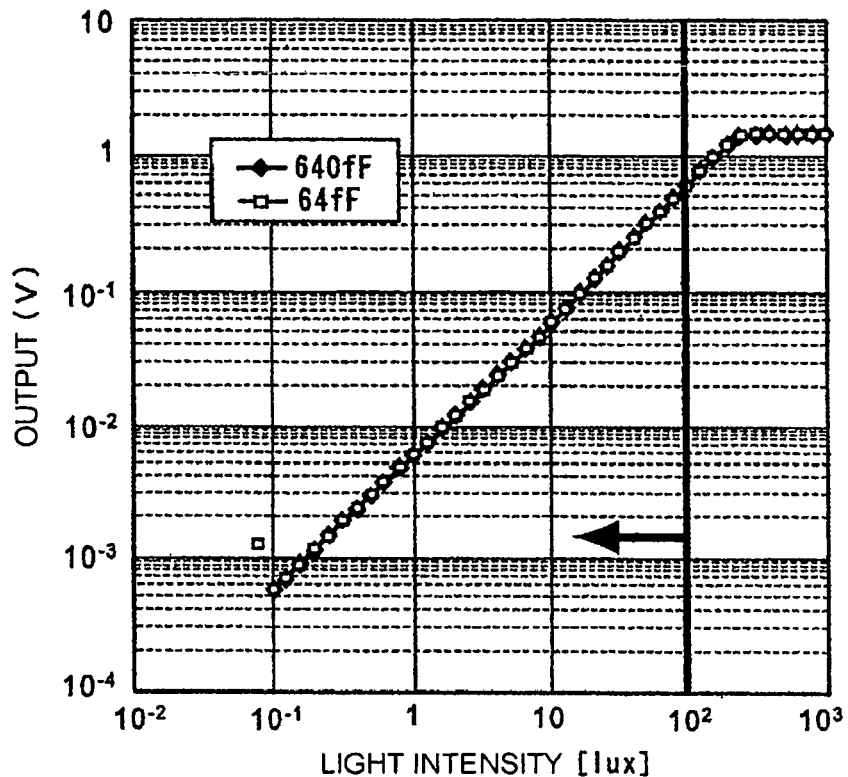
Figures 2, 33:
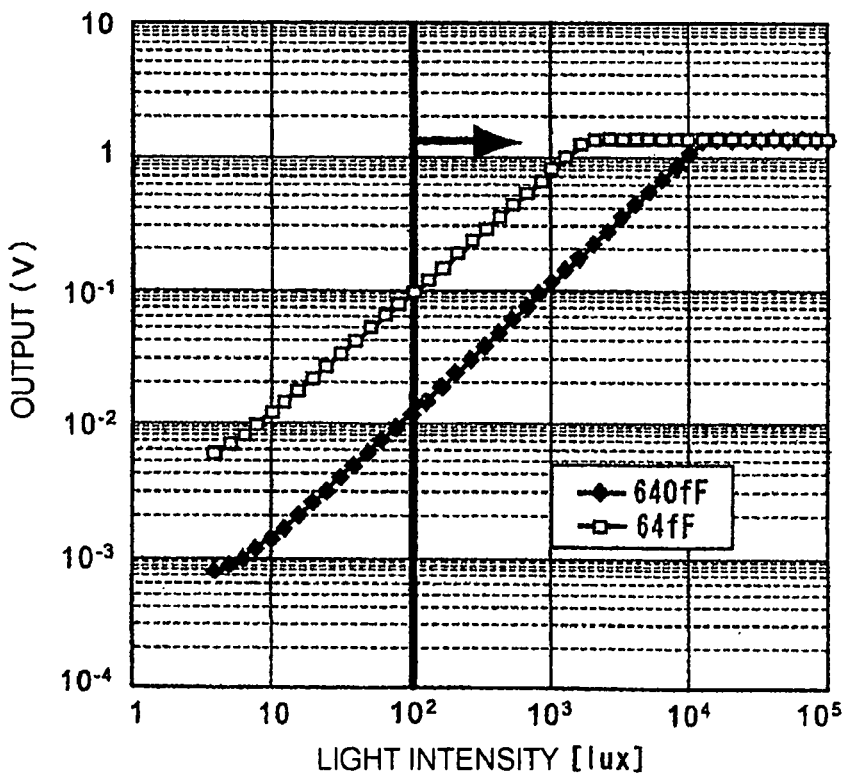
Figure 34:
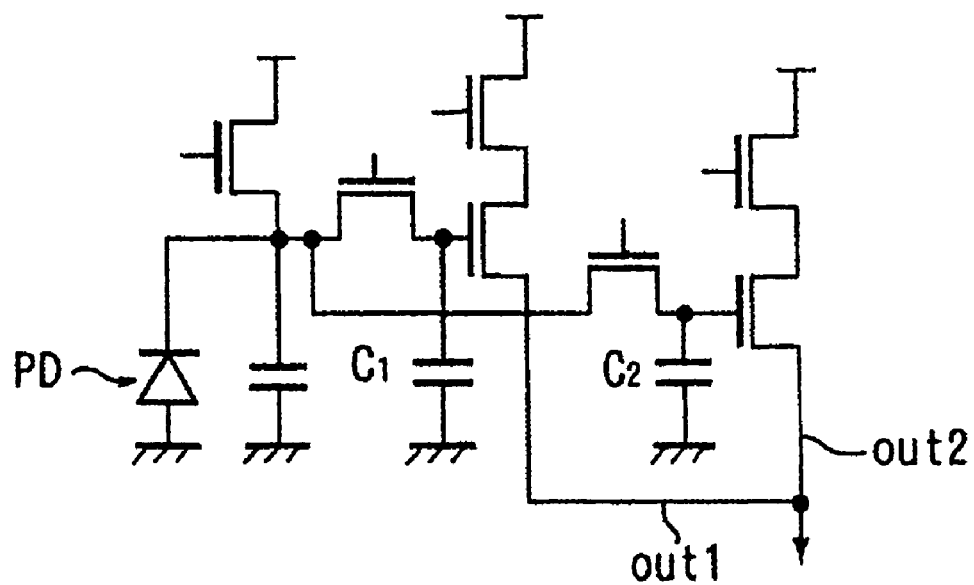
FIG. 34 is an equivalent circuit diagram of one pixel of a CMOS image sensor of a first related art.
Figure 35:
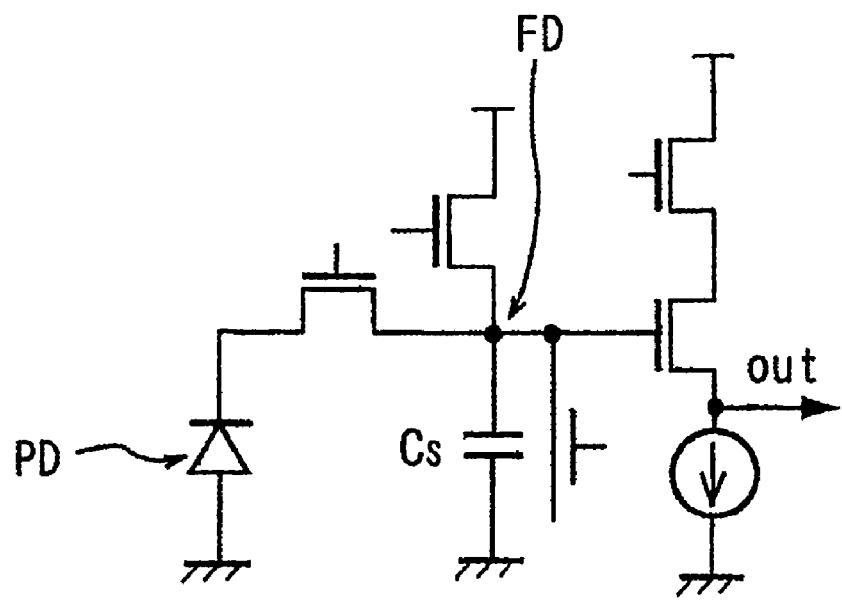
FIG. 35 is an equivalent circuit diagram of one pixel of a CMOS image sensor of a second related art.
Figure 36:
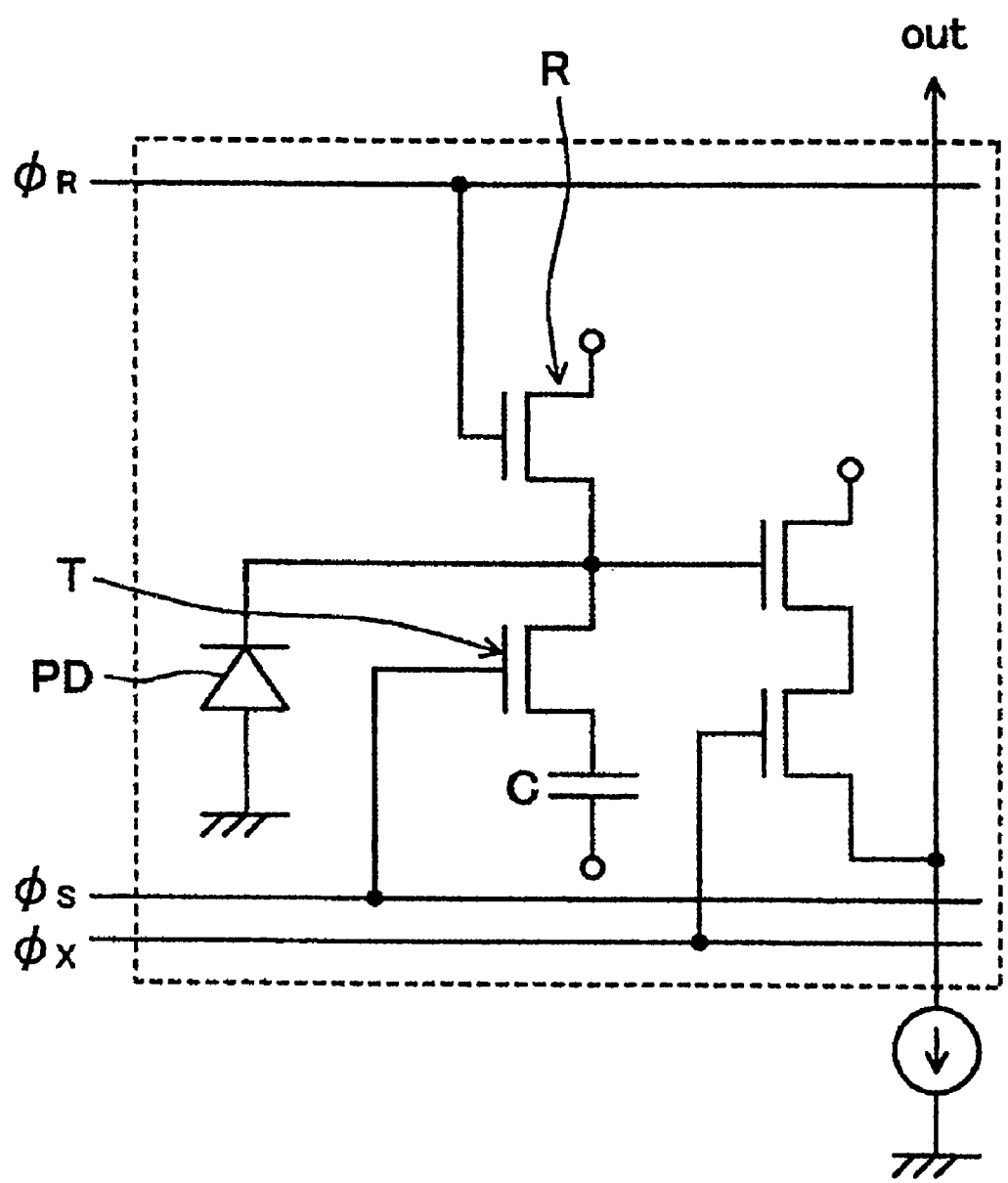
FIG. 36 is an equivalent circuit diagram of one pixel of a CMOS image sensor of a third related art.
Figure 37:
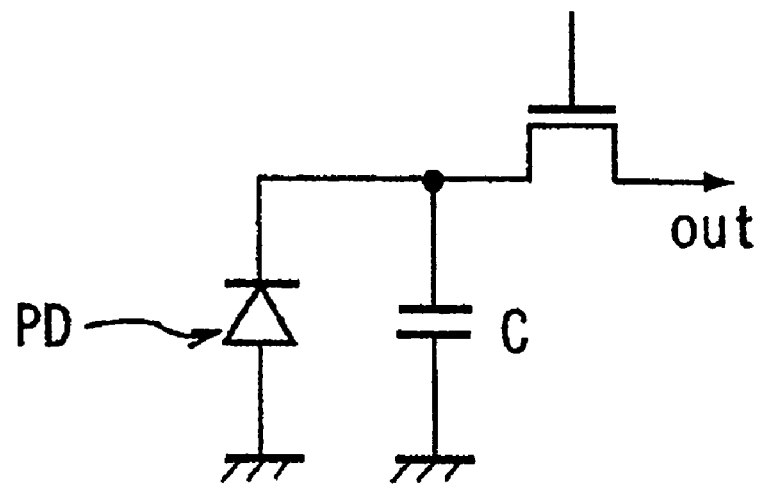
FIG. 37 is an equivalent circuit diagram of one pixel of a CMOS image sensor of a fourth related art.
Figure 38:
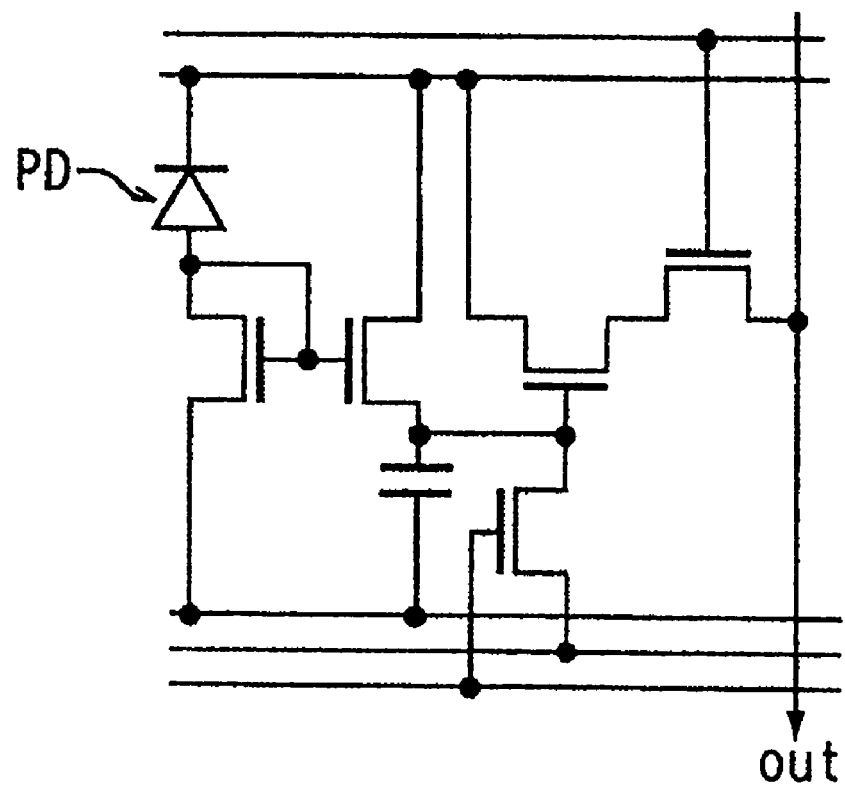
FIG. 38 is an equivalent circuit diagram of one pixel of a CMOS image sensor of a fifth related art.

FIG. 33-1 is a view in which the output (V) appearing prior to the saturation of the photodiode PD is plotted in terms of light intensity (lux). Confirmation was made that due to the phase prior to the saturation, both of outputs of the storage capacitor elements with capacitances 64 fF and 640 fF matched each other and the output (V) and light intensity (lux) had a correlation with high linearity.

Further, FIG. 33-2 is a view in which the output (V) appearing subsequent to the saturation of the photodiode PD is plotted in terms of light intensity (lux). Confirmation was made that with light intensity remaining at the same level, the storage capacitor element in 640 fF had a lower output than that of 64 fF and an increased area with a linearity appearing until the output had come to the saturation.

When this takes place, for instance, by adopting an output appearing prior to the saturation under light intensity less than $10^2$ lux and an output appearing subsequent to the saturation under light intensity greater than $10^2$ lux, both phases prior to and subsequent to the saturation of the photodiode PD are connected and an output having a high linearity in terms of light intensity can be obtained in a wide range.

In addition, a performance of the CMOS image sensor of the present invention is compiled in Table 1.

TABLE 1

| Items | Parameters | | | |
|---|---|---|---|---|
| $C_{FD}$ | 3.2 fF | | 6.4 fF | |
| $C_s$ | 32 fF | 320 fF | 64 fF | 640 fF |
| Size of Pixel | ≦5 μm | | | |
| Size of PD | ≦3 μm | | | |
| Sensitivity Equivalent in Input | 50 μV/e$^-$ | | 25 μV/e$^-$ | |
| Saturation Charge Count in $C_{FD}$ | $1 \times 10^4 e^-$ | | $2 \times 10^4 e^-$ | |
| Saturation Voltage | 500 mV$_{min}$ @ $C_{FD}$, $C_s$ | | | |
| Saturation Charge Count | $1 \times 10^5 e^-$ | $1 \times 10^6 e^-$ | $2 \times 10^5 e^-$ | $2 \times 10^6 e^-$ |
| Dynamic Range | 88 dB | 106 dB | 100 dB | 120 dB |

The present invention is not limited to the above description.

For instance, while the embodiments have been described with reference to the solid-state imaging devices, the present invention is not limited to such devices and can achieve a wide dynamic range, high sensitivity and a high S/N ratio, which would be hard to be obtained in the related art practice, in a line sensor including linearly arranged pixels of each solid-state imaging device and an optical sensor using a pixel of each solid-state imaging device intact.

Furthermore, no particular limitation is intended to shapes of the storage capacitor elements and various methods, heretofore developed to increase a capacitance with the use of a memory storage capacitor element of DRAM, can be adopted.

The solid-state imaging devices may suffice to take the form of structures in each of which a photodiode and a storage capacitor element, adapted to accumulate photoelectric charges overflowing from the photodiode, are connected to each other via a transfer transistor and may also have application to, in addition to a CMOS image sensor, a CCD.

Additionally, various modifications may be possible without departing from the scope of the present invention.

INDUSTRIAL APPLICABILITY

A solid-state imaging device of the present invention can be applied to image sensors, needed to have a wide dynamic range, such as a CMOS image sensor or a CCD image sensor to be loaded on a digital camera and a cell-phone or the like.

A line sensor of the present invention can be applied to a line sensor that needs a wide dynamic range.

An optical sensor of the present invention can be applied to an optical sensor that needs a wide dynamic range.

A method of operating a slid-state imaging device according to the present invention can be applied a method of operating an image sensor that needs a wide dynamic range.

The invention claimed is:

1. A solid-state imaging device having an integrated array of a plurality of pixels, each pixel comprising:
    a photodiode that receives light and that generates photoelectric charges;
    a transfer transistor coupled to the photodiode and that transfers the photoelectric charges received from the photodiode; and
    a storage capacitor element coupled to the photodiode at least through the transfer transistor;
    a floating region, provided between the transfer transistor and the storage capacitor element, to which the photoelectric charges are transferred via the transfer transistor; and
    a storage transistor, provided between the transfer transistor and the storage capacitor element, that couples or splits potentials of the floating region and the storage capacitor element,
    said device further having a transfer transistor controlling circuit that generates at least a control signal that controls the transfer transistor in such a manner that the transfer transistor passes the photoelectric charges overflowing from the photodiode during an accumulating operation;
    wherein the storage capacitor accumulates the photoelectric charges overflowing from the photodiode during the accumulating operation,
    the transfer transistor controlling circuit comprising:
    a first driveline that is connected to a gate of the storage transistor, the first driveline being capable of taking on either a first or a second voltage level at any point in time, the first voltage level corresponding to an ON state of the storage transistor and the second voltage level corresponding to an OFF state of the storage transistor, and
    a second driveline that is connected to a gate of the transfer transistor, the second drive being capable of taking on either the first, the second, or a third voltage level at any point in time, the first voltage level corresponding to an ON state of the transfer transistor, the second voltage level corresponding to an OFF state of the transfer transistor, and the third voltage level corresponding to a floating state of the transfer transistor, the third voltage level being a level greater than the second voltage level and less than the first voltage level,
    wherein the second driveline is set to the third voltage level by the transfer transistor controlling circuit to thereby cause the transfer transistor and the floating region to capture and accumulate the photoelectric charges overflowing from the photodiode during the accumulating operation.

2. The solid-state imaging device according to claim 1, further comprising:
    a reset transistor coupled to the floating region that discharges the photoelectric charges of the floating region;
    an amplifier transistor for amplifying that amplifies the photoelectric charges in the floating region and that converts the amplified photoelectric charges to a voltage signal; and
    a selection transistor coupled to the amplifier transistor and that selects the pixel.

3. The solid-state imaging device according to claim 2, comprising:
    a logarithmic conversion circuit that executes logarithmic conversion of the photoelectric charges accumulated in the storage capacitor element for readout.

4. The solid-state imaging device according to claim 3, comprising:
    a logarithmic conversion circuit that executes logarithmic conversion of the photoelectric charges overflowing from the photodiode and that accumulates the photoelectric charges overflowing from the photodiode in the storage capacitor element.

5. A solid-state imaging device having an integrated array of a plurality of pixels, each pixel comprising:
    a photodiode that receives light and that generates photoelectric charges;
    a transfer transistor coupled to the photodiode and that transfers the photoelectric charges received from the photodiode;
    a storage capacitor element coupled to said photodiode at least through said transfer transistor;
    a floating region, provided between the transfer transistor and the storage capacitor element, to which the photoelectric charges are transferred via the transfer transistor; and
    a storage transistor, provided between the transfer transistor and the storage capacitor element, that couples or splits potentials of the floating region and the storage capacitor element,
    wherein said transfer transistor passes therethrough the photoelectric charges overflowing from the photodiode during an accumulating operation;
    wherein said storage capacitor accumulates the photoelectric charges overflowing from said photodiode during said accumulating operations,
    a first driveline that is connected to a gate of the storage transistor, the first driveline being capable of taking on either a first or a second voltage level at any point in time, the first voltage level corresponding to an ON state of the storage transistor and the second voltage level corresponding to an OFF state of the storage transistor, and
    a second driveline that is connected to a gate of the transfer transistor, the second drive being capable of taking on either the first, the second, or a third voltage level at any point in time, the first voltage level corresponding to an ON state of the transfer transistor, the second voltage level corresponding to an OFF state of the transfer transistor, and the third voltage level corresponding to a floating state of the transfer transistor, the third voltage level being a level greater than the second voltage level and less than the first voltage level; and
    a signal generator that generates a first signal that sets the first driveline to one of the first and second voltage levels, and that generates a second signal that sets the second driveline to one of the first, second and third voltage levels, wherein the second driveline is set by the second signal to the third voltage level to thereby cause the transfer transistor and the floating region to capture and accumulate the photoelectric charges overflowing from the photodiode during the accumulating operation.

6. A solid-state imaging device having an integrated array of a plurality of pixels, each pixel comprising:
   a photodiode that receives light and that generates photoelectric charges;
   a transfer transistor coupled to the photodiode and that transfers the photoelectric charges received from the photodiode;
   a floating region operatively coupled to said photodiode though said transfer transistor;
   a storage transistor coupled to said floating region;
   a storage capacitor element operatively coupled to said floating region though said storage transistor;
   said transfer transistor that passes therethrough the photoelectric charges overflowing from the photodiode during an accumulating operation;
   said storage transistor that couples or splits potentials of said floating region and said storage capacitor;
   wherein said storage capacitor accumulates the photoelectric charges overflowing from said photodiode during said accumulating operation, and
   said floating region is split from said storage capacitor to accumulate the photoelectric charges from said photodiode and coupled to said storage capacitor to mix the photoelectric charges accumulated therein with the overflowed photoelectric charges accumulated in said storage capacitor,
   a first driveline that is connected to a gate of the storage transistor, the first driveline being capable of taking on either a first or a second voltage level at any point in time, the first voltage level corresponding to an ON state of the storage transistor and the second voltage level corresponding to an OFF state of the storage transistor, and
   a second driveline that is connected to a gate of the transfer transistor, the second drive being capable of taking on either the first, the second, or a third voltage level at any point in time, the first voltage level corresponding to an ON state of the transfer transistor, the second voltage level corresponding to an OFF state of the transfer transistor, and the third voltage level corresponding to a floating state of the transfer transistor, the third voltage level being a level greater than the second voltage level and less than the first voltage level; and
   a signal generator that generates a first signal that sets the first driveline to one of the first and second voltage levels, and that generates a second signal that sets the second driveline to one of the first, second and third voltage levels,
   wherein the second driveline is set by the second signal to the third voltage level to thereby cause the transfer transistor and the floating region to capture and accumulate the photoelectric charges overflowing from the photodiode during the accumulating operation.

* * * * *